United States Patent
Ishihara et al.

(10) Patent No.: US 7,014,672 B2
(45) Date of Patent: Mar. 21, 2006

(54) CARRYING VEHICLE, MANUFACTURING APPARATUS, AND CARRYING SYSTEM

(75) Inventors: Hiroyuki Ishihara, Nishigoshi-machi (JP); Takao Shimizu, Nishigoshi-machi (JP); Takashi Nakao, Neyagawa (JP); Ryosuke Tahara, Kyoto (JP); Hidetoshi Takeuchi, Kyoto (JP)

(73) Assignees: Advanced Display Inc., Kumamoto (JP); Murata Kikai Kabushiki Kaisha, Kyoto (JP)

( * ) Notice: Subject to any disclaimer, the term of this patent is extended or adjusted under 35 U.S.C. 154(b) by 0 days.

(21) Appl. No.: 10/462,732

(22) Filed: Jun. 17, 2003

(65) Prior Publication Data

US 2004/0000129 A1   Jan. 1, 2004

(30) Foreign Application Priority Data

Jul. 1, 2002   (JP)   ............................. 2002-192660
Jul. 26, 2002  (JP)   ............................. 2002-218027

(51) Int. Cl.
*B01D 46/10*   (2006.01)
*B65B 1/04*    (2006.01)

(52) U.S. Cl. .................. 55/356; 55/385.2; 55/471; 55/473; 55/DIG. 18; 55/DIG. 29; 55/DIG. 46; 454/188; 454/191; 454/184; 454/187; 454/189; 454/49; 454/57; 454/56

(58) Field of Classification Search .................. 55/356, 55/385.2, 471, 473, DIG. 29, DIG. 18, DIG. 46; 454/187, 57, 188, 191, 184, 189, 49, 56; 414/217, 222, 225
See application file for complete search history.

(56) References Cited

U.S. PATENT DOCUMENTS

| | | | |
|---|---|---|---|
| 4,823,680 A * | 4/1989 | Nowotarski | 454/188 |
| 4,851,018 A * | 7/1989 | Lazzari et al. | 55/356 |
| 5,257,957 A * | 11/1993 | Diccianni et al. | 454/57 |
| 5,425,793 A * | 6/1995 | Mori et al. | 55/385.2 |
| 5,692,954 A * | 12/1997 | Lee et al. | 454/187 |
| 5,851,143 A * | 12/1998 | Hamid | 454/57 |
| 6,207,119 B1 * | 3/2001 | Diccianni et al. | 422/295 |
| 6,272,767 B1 * | 8/2001 | Botruff et al. | 34/202 |
| 6,626,971 B1 * | 9/2003 | Forbert et al. | 55/385.2 |
| 6,797,029 B1 * | 9/2004 | Lederer et al. | 55/385.2 |
| 6,835,233 B1 * | 12/2004 | Fang | 95/273 |

FOREIGN PATENT DOCUMENTS

| | | |
|---|---|---|
| JP | 11-238777 | 8/1999 |
| JP | 2001-287831 | 10/2001 |

* cited by examiner

*Primary Examiner*—Minh-Chau T. Pham
(74) *Attorney, Agent, or Firm*—Westerman, Hattori, Daniels & Adrian, LLP

(57) ABSTRACT

According to the present invention, in a carrying system comprising a carrying vehicle and a manufacturing apparatus the interior of which is kept cleaner than a surrounding environment, manufactured articles to be transferred are prevented from being contaminated by foreign matter or the like attached to transfer ports. A carrying vehicle includes a running unit 14 that runs along a predetermined carrying path, a cleaning unit 12 that supplies cleaned air, a housing section 13 to which the cleaned air is supplied and in which manufactured articles are housed, a transfer port 11 which is formed in a side of a housing and through which a manufactured article is loaded into or unloaded from the housing section 13, and an air injecting section 19A that blows out air toward the transfer port 11.

23 Claims, 30 Drawing Sheets

FIRST PREDETERMINED POSITION
(START ACTIVATING EACH AIR INJECTING MEANS)

SECOND PREDETERMINED POSITION
(START SHUTTER OPENING OPERATION)
(COMPLETE GAP CLEANING OPERATION)

THIRD PREDETERMINED POSITION
<STATION ARRIVAL POSITION>
(COMPLETE SHUTTER OPENING OPERATION)
(MAINTAIN GAP CLEANING OPERATION)

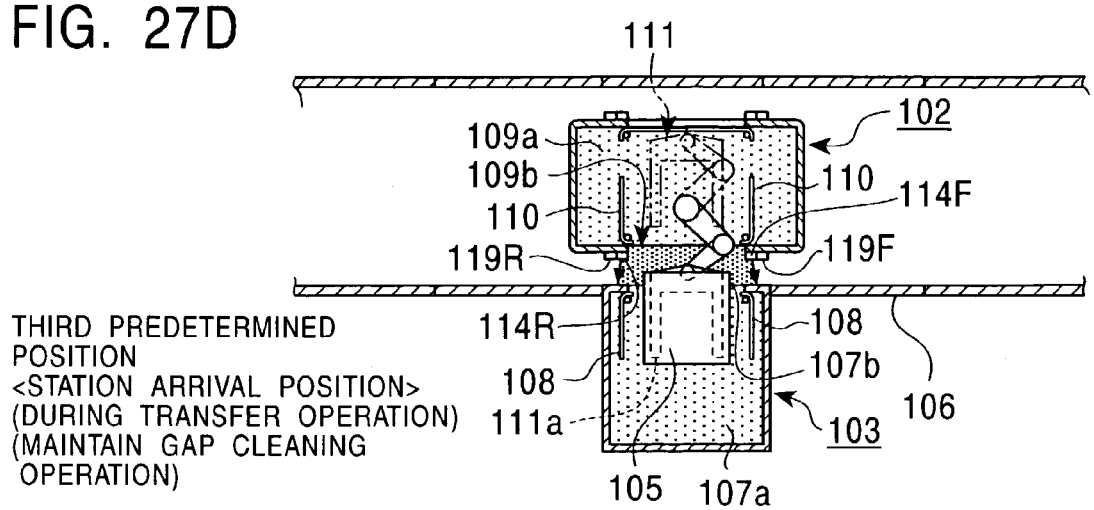

FIG. 27D

THIRD PREDETERMINED POSITION
<STATION ARRIVAL POSITION>
(DURING TRANSFER OPERATION)
(MAINTAIN GAP CLEANING OPERATION)

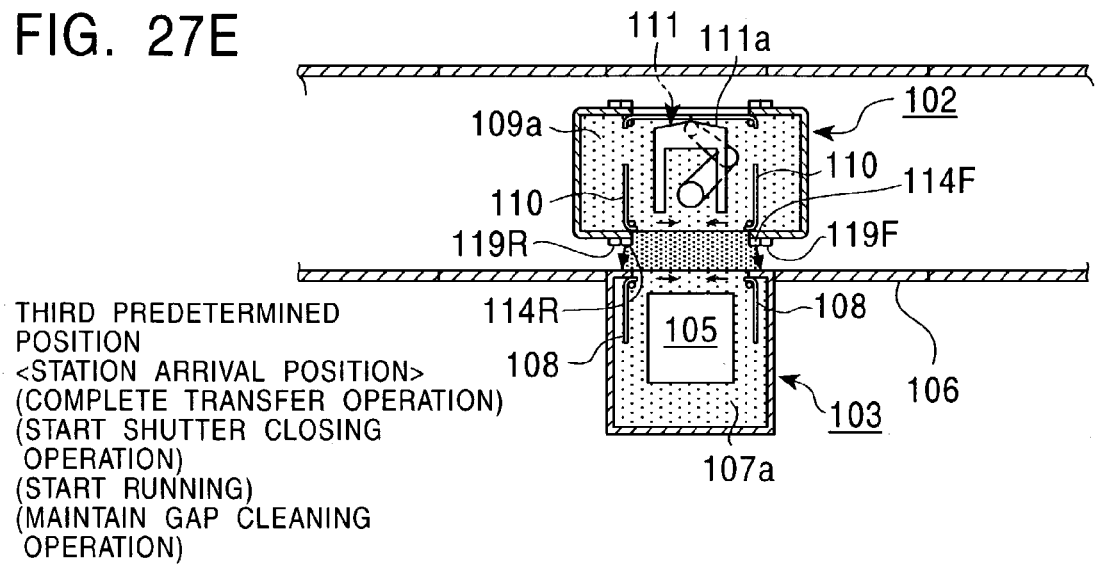

FIG. 27E

THIRD PREDETERMINED POSITION
<STATION ARRIVAL POSITION>
(COMPLETE TRANSFER OPERATION)
(START SHUTTER CLOSING OPERATION)
(START RUNNING)
(MAINTAIN GAP CLEANING OPERATION)

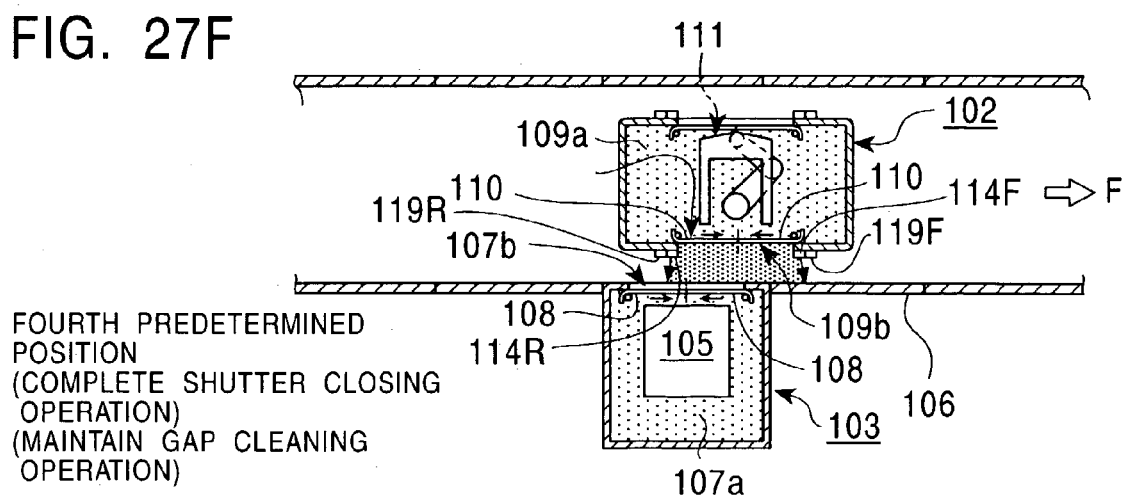

FIG. 27F

FOURTH PREDETERMINED POSITION
(COMPLETE SHUTTER CLOSING OPERATION)
(MAINTAIN GAP CLEANING OPERATION)

CARRYING VEHICLE, MANUFACTURING APPARATUS, AND CARRYING SYSTEM

FIELD OF THE INVENTION

The present invention relates to a carrying vehicle, a manufacturing apparatus, and a carrying system, and more specifically, to improvements in a carrying vehicle, a manufacturing apparatus, and a carrying system which are suitable for locally cleaning a production line that desirably maintains manufactured articles in a cleaned atmosphere, e.g. a production line for liquid crystal display devices, PDPs (Plasma Display Panels), organic EL (Electro Luminescence) displays, or other semiconductor devices.

BACKGROUND OF THE INVENTION

In the manufacture of semiconductor devices, a substrate composed of an Si (Silicone) wafer, a planar glass, or the like is processed so as to have features of the order of microns or less. Consequently, the attachment of foreign matter (e.g. dust particulate) to the substrate during manufacture may result in an immediate decrease in yield. Thus, a conventional production line for semiconductor devices is wholly installed in a clean room manageably maintained in a clean environment (cleanliness).

However, to keep the whole production line very clean, a large-capacity clean room is required which comprises a large number of cleaning units. High costs are thus required to build a clean room. Further, a cleaning unit composed of a blowing fan, an HEPA (high efficiency particulate air) filter, and others requires high power to drive the blowing fan, thus requiring high running costs. Furthermore, to maintain a uniform cleanliness throughout a large clean room, it is necessary to use a technique for controlling the flow of air using pressure control or the like. It has been difficult to maintain and manage such flow control.

To solve these problems, a local cleaning technique has been used to improve the cleanliness of a part of the production line instead of the whole production line. The local cleaning technique locally increases the cleanliness of only a space in which manufactured articles are moved. With this technique, for example, a space on a passage on which semiconductor devices being manufactured are carried is made cleaner than the other spaces. In this case, costs can be reduced compared to the improvement of cleanliness of the whole line.

Further, the Unexamined Japanese Patent Application Publication (Tokkai-Hei) No. 11-238777 discloses an invention relating to a cassette carrying system achieved by further improving the above local cleaning technique. This system makes the interior of a loader/unloader of a semiconductor manufacturing apparatus and of an automated carrying vehicle cleaner than a clean room in order to reduce costs required to maintain and manage the clean room.

FIG. 17 is a figure schematically showing the configuration of the conventional automated carrying system described in the above publication. A cassette housing section 13 of an automated carrying vehicle 1 and a loader/unloader 21 of a semiconductor manufacturing apparatus 2 are provided with transfer ports 11, 22, respectively, through which a cassette 17 in which Si wafers, glass substrates, and others are stored. The transfer ports 11, 22 are openings with shutters which are formed at the same height so as to have the same shape.

The use of the transfer ports 11, 22 serves to keep the interior of the automated carrying vehicle 1 and semiconductor manufacturing apparatus 2 very clean. Thus, a carrying path and the like have only to be maintained at a relatively low cleanliness. This enables a reduction in costs required to construct, maintain, and manage a clean room.

However, with the method of making the space on the passage on which semiconductor device being manufactured are carried cleaner than the other spaces, when the automated carrying vehicle 1 runs, it may stir up foreign matter on a floor surface. The foreign matter may then be attached to the automated carrying vehicle 1 itself and semiconductor devices in cassettes set at the transfer port of the semiconductor manufacturing apparatus 2. This makes it necessary to blow a stronger down flow against the passage, change the shape of partitioning walls around the periphery of passage, or possibly reduce the speed of the carrying vehicle.

With the conventional automated carrying system described in the above publication, if the cassette 17 is transferred between the automated carrying vehicle 1 and the semiconductor manufacturing apparatus 2, the automated carrying vehicle 1 is moved to a position where the transfer ports 11, 22 of the automated carrying vehicle 1 and semiconductor manufacturing apparatus 2, respectively, stand opposite each other, before the shutters of the automated carrying vehicle 1 and semiconductor manufacturing apparatus 2 are opened. At this time, foreign matter attached to the outside of the shutters may be stirred up. As a result, the stirred-up foreign matter may contaminate that area close to the automated carrying vehicle 1 and semiconductor manufacturing apparatus 2 in which the cassette 17 is to be transferred, notably the vicinity of the transfer ports 11, 22.

Further, when the automated carrying vehicle 1 runs, it may stir up foreign matter on the floor surface. The foreign matter may then be attached to the shutters of the automated carrying vehicle 1 itself and semiconductor manufacturing apparatus 2. Thus, if an attempt is made to increase the running speed of the automated carrying vehicle 1 in order to improve productivity, the contamination of vicinity of the transfer ports may produce more marked adverse effects. This may lead to a decrease in yield.

The present invention is provided in view of the above circumstances. It is an object of the present invention to provide a carrying vehicle and a manufacturing apparatus the interior of which is kept cleaner than a surrounding environment, and a carrying system comprising the carrying vehicle and the manufacturing apparatus, wherein manufactured articles to be transferred are prevented from being contaminated by foreign matter or the like attached to transfer ports.

It is another object of the present invention to provide a carrying vehicle, a manufacturing apparatus, and a carrying system wherein a transfer operation can be started once the carrying vehicle arrives at a transfer point, thus reducing the time required for carriage or the costs of the carrying system or improving productivity.

SUMMARY OF THE INVENTION

According to the present invention, there is provided a carrying vehicle comprising a running unit that runs along a predetermined carrying path, a cleaning unit that supplies cleaned air, a housing section to which the cleaned air is supplied and in which manufactured articles are housed, a transfer port which is formed in a side of a housing and through which a manufactured article is loaded into or unloaded from the housing section, and a first air injecting section that blows out air toward the transfer port.

The side of the carrying vehicle which is provide with the transfer port stands opposite a front surface (in which the transfer port is formed) of the manufacturing apparatus (e.g. a semiconductor manufacturing apparatus or a stocker) through which a manufactured article is delivered to and received from the carrying vehicle. Thus, by providing the air injecting section on the side of the carrying vehicle with the transfer port and allowing the air injecting section to blow out air, the air can be blown against the front surface of the manufacturing apparatus to remove foreign matter or the like attached to this front surface.

The cleaning unit is composed of a blowing fan and a filter to supply air at least cleaner than air in the atmosphere in which the carrying vehicle is used. Further, air from the air injecting section is blown out in a direction angled from the side of the carrying vehicle with the transfer port (i.e. a direction away from this side). For example, air is blown in a direction normal to the side with the transfer port or closer to the advancing direction.

Further, if the air injecting section is provided on the side of the carrying vehicle with the transfer port, it may be provided around the periphery of the transfer port. If the transfer port is provided with opening and closing means such as shutters, the air injecting section may be provided in the opening and closing means.

In a carrying vehicle according to the present invention, the first air injecting section is provided closer to an advancing direction than the transfer port. With such an arrangement, if the carrying vehicle runs to the manufacturing apparatus for manufactured articles to deliver or receive a manufactured article to or from the apparatus, air can be blown against the transfer port of the manufacturing apparatus while the carrying vehicle is running. Accordingly, before the carrying vehicle stops upon arriving at a transfer point where the transfer port of the carrying vehicle stands opposite the transfer port of the manufacturing apparatus, air can be blown against the transfer port (or opening and closing means such as shutters if the transfer port is provided with it) of the manufacturing apparatus.

In a carrying vehicle according to the present invention, the first air section is arranged around a periphery of the transfer port and composed of a plurality of air nozzles that form an air curtain. With such an arrangement, in blowing air against the manufacturing apparatus, an air curtain is formed. Therefore, air can be more effectively blown against the manufacturing apparatus.

In a carrying vehicle according to the present invention, the first air injecting section is composed of a plurality of air nozzles which are arranged at different heights and which form an air curtain. Consequently, by running the carrying vehicle while using the plurality of air nozzles to form an air curtain spreading in a vertical direction, air can be blown against a larger area of the side of the manufacturing apparatus to or from which a manufactured article is to be delivered or received.

In this case, a smaller number of air nozzles can be used to blow air against a larger area of the manufacturing apparatus. Further, air can be efficiently blown against the manufacturing apparatus. For example, air can be blown against a larger area of the transfer port of the manufacturing apparatus. It is particularly preferable to blow air against the whole surface of the transfer port of the manufacturing apparatus.

In a carrying vehicle according to the present invention, the first air injecting section is composed of a plurality of air nozzles which are arranged above the transfer port at different horizontal positions and which form an air curtain. Thus, the plurality of air nozzles can be used to form an air curtain spreading in a horizontal direction.

In a carrying vehicle according to the present invention, the running unit outputs an approach signal by detecting that the carrying vehicle is approaching a transfer point where a manufactured article is to be loaded or unloaded, and on the basis of this approach signal, the first air injecting section starts to blow out air before the carrying vehicle arrives at the transfer point.

With such an arrangement, when, during running, the carrying vehicle approaches a transfer point where a manufactured article is to be transferred, the first air injecting section starts to blow out air. Thus, while the carrying vehicle is running, air can be blown against the manufacturing apparatus to or from which a manufactured article is to be delivered or received.

In a carrying vehicle according to the present invention, air is blown out from above the transfer port, and a second air injecting section is provided on an outer surface of the transfer port to form a down flow.

The second air injecting section forms a down flow of air (more desirably, cleaned air) over the outer surface of the transfer port of the carrying vehicle. This enables the removal of foreign matter or the like attached to the transfer port of the carrying vehicle. For example, if the transfer port is provided with opening and closing means such as shutters, it is possible to remove foreign matter or the like attached to this opening and closing means.

In a carrying vehicle according to the present invention, the running unit outputs an approach signal by detecting that the carrying vehicle is approaching a transfer point where a manufactured article is to be loaded or unloaded, and on the basis of this approach signal, the second air injecting section starts to blow out air before the carrying vehicle arrives at the transfer point.

With such an arrangement, if the carrying vehicle approaches the manufacturing apparatus, the second air injecting section forms a down flow of air over the outer surface of the transfer port of the carrying vehicle. This makes it possible to remove foreign matter attached to the transfer port of the carrying vehicle. For example, if the transfer port is provided with opening and closing means such as shutters, it is possible to remove foreign matter or the like attached to this opening and closing means. It is thus possible to prevent the wasteful injection of air.

According to the present invention, there is provided a carrying vehicle comprising a cleaning unit that supplies cleaned air, a housing section to which the cleaned air is supplied and in which manufactured articles are housed, a transfer port which is formed in a side of a housing and through which a manufactured article is loaded into or unloaded from the housing section, and a second air injecting section that blows out air from above the transfer port to form a down flow over an outer surface of the transfer port.

In a carrying vehicle according to the present invention, the running unit outputs an approach signal by detecting that the carrying vehicle is approaching a transfer point where a manufactured article is to be loaded or unloaded, and on the basis of this approach signal, the second air injecting section starts to blow out air before the carrying vehicle arrives at the transfer point.

According to the present invention, there is provided a manufacturing apparatus comprising a cleaning unit that supplies cleaned air, a standby chamber to which the cleaned air is supplied and in which manufactured articles are temporarily housed, a transfer port through which a manufactured article is loaded into or unloaded between the standby chamber and an exterior, and a first air injecting section that blows out air toward the transfer port.

A front surface of the manufacturing apparatus stands opposite a side of a carrying vehicle (normally an automated carrying vehicle) that delivers or receives a manufactured article. Thus, by providing the air injecting section on the front surface of the manufacturing apparatus and allowing the air injecting section to blow out air, the air can be blown against the side of the carrying vehicle with the transfer port to remove foreign matter or the like attached to this side.

The cleaning unit is composed of a blowing fan and a filter to supply air at least cleaner than air in the atmosphere in which the manufacturing apparatus is used. Further, air from the first air injecting section is blown out in a direction angled from the front surface (i.e. a direction away from this surface). For example, the air is blown in a direction normal to this surface or in a direction which the carrying vehicle is arriving.

Further, if the first air injecting section is provided on the side transfer port side of the manufacturing apparatus, it may be provided around the periphery of the transfer port. If the transfer port is provided with opening and closing means such as shutters, the first air injecting section may be provided in the opening and closing means.

In a manufacturing apparatus according to the present invention, the first air section is arranged around a periphery of the transfer port and composed of a plurality of air nozzles that form an air curtain. With such an arrangement, if the carrying vehicle runs to the manufacturing apparatus to deliver or receive a manufactured article to or from the apparatus, air can be blown against the transfer port of the carrying vehicle while the carrying vehicle is running. Accordingly, before the carrying vehicle stops upon arriving at a transfer point where the transfer port of the carrying vehicle stands opposite the transfer port of the manufacturing apparatus, air can be blown against the transfer port (or opening and closing means such as shutters if the transfer port is provided with it) of the carrying vehicle.

In a manufacturing apparatus according to the present invention, the manufacturing apparatus further comprises a carrying vehicle monitoring section that outputs an approach signal by detecting that a carrying vehicle is approaching the manufacturing apparatus, and on the basis of this approach signal, the first air injecting section starts to blow out air before the carrying vehicle arrives.

In a manufacturing apparatus according to the present invention, air is blown out from above the transfer port, and a second air injecting section is provided on an outer surface of the transfer port to form a down flow.

The second air injecting section forms a down flow of cleaned air over the outer surface of the transfer port of the manufacturing apparatus. This makes it possible to remove foreign matter attached to the transfer port of the manufacturing apparatus. For example, if the transfer port is provided with opening and closing means such as shutters, it is possible to remove foreign matter or the like attached to this opening and closing means.

In a manufacturing apparatus according to the present invention, the manufacturing apparatus further comprises a carrying vehicle monitoring section that outputs an approach signal by detecting that a carrying vehicle is approaching the manufacturing apparatus, and on the basis of this approach signal, the second air injecting section starts to blow out air before the carrying vehicle arrives.

According to the present invention, there is provided a manufacturing apparatus comprising a cleaning unit that supplies cleaned air, a standby chamber to which the cleaned air is supplied and in which manufactured articles are temporarily housed, a transfer port through which a manufactured article is loaded into or unloaded between the standby chamber and an exterior, and a second air injecting section that blows out air (desirably cleaned air) from above the transfer port to form a down flow over an outer surface of the transfer port.

In a manufacturing apparatus according to the present invention, the manufacturing apparatus further comprises a carrying vehicle monitoring section that outputs an approach signal by detecting that a carrying vehicle is approaching the manufacturing apparatus, and on the basis of this approach signal, the second air injecting section starts to blow out air before the carrying vehicle arrives.

With such an arrangement, if the carrying vehicle approaches the manufacturing apparatus, the second air injecting section starts to blow out air. Thus, air can be blown against the carrying vehicle to or from a manufactured article is to be delivered or received, while the carrying vehicle is running. It is also possible to prevent the wasteful injection of air.

A carrying system according to the present invention comprises a carrying vehicle that carries a manufactured article and a plurality of manufacturing apparatuses installed in position. The carrying vehicle comprises a running unit that runs between the manufacturing apparatuses, a cleaning unit that supplies cleaned air, a housing section to which the cleaned air is supplied and in which manufactured articles are housed, a transfer port having opening and closing means through which a manufactured article is transferred to or received from the manufacturing apparatus, and a first air injecting section that blows out air. Further, each of the manufacturing apparatuses comprises a cleaning unit that supplies cleaned air, a housing section to which the cleaned air is supplied and in which manufactured articles are housed, and a transfer port having opening and closing means through which a manufactured article is transferred to or received from the carrying vehicle. The first air injecting section blows out air against the opening and closing means of the transfer port of the manufacturing apparatus.

With such an arrangement, the first air injecting section of the carrying vehicle blows out air against the opening and closing means of the transfer port of the manufacturing apparatus, e.g. an automated opening and closing means such as shutters. This makes it possible to remove foreign matter or the like attached to the opening and closing means.

In this regard, the manufacturing apparatus may be a manufacturing apparatus used to process manufactured articles or a storage apparatus used to store manufactured articles. For example, if the present invention is applied to a semiconductor production line, the manufacturing apparatus includes a stocker.

In a carrying system according to the present invention, the first air injecting section starts to blow out air before the carrying vehicle arrives at a transfer point.

With such an arrangement, air can be blown against the carrying vehicle to or from a manufactured article is to be delivered or received, while the carrying vehicle is running.

In a carrying system according to the present invention, each of the manufacturing apparatuses comprises a second air injecting section that blows out air, and the second air injecting section blows out air against the opening and closing means of the transfer port of the carrying vehicle.

With such an arrangement, the second air injecting section of the manufacturing apparatus blows out air against the opening and closing means of the transfer port of the carrying vehicle, e.g. an automated opening and closing means such as shutters. This makes it possible to remove foreign matter or the like attached to the opening and closing means.

In a carrying system according to the present invention, the second air injecting section starts to blow out air before the carrying vehicle arrives at the transfer point.

With such an arrangement, air can be blown against the running carrying vehicle.

A carrying system according to the present invention comprises a carrying vehicle that carries a manufactured article and a plurality of manufacturing apparatuses installed in position. The carrying vehicle comprises a running unit that runs between the manufacturing apparatuses, a cleaning unit that supplies cleaned air, a housing section to which the cleaned air is supplied and in which manufactured articles are housed, and a transfer port having opening and closing means through which a manufactured article is loaded into or unloaded from the manufacturing apparatus. Further, each of the manufacturing apparatuses comprises a cleaning unit that supplies cleaned air, a housing section to which the cleaned air is supplied and in which manufactured articles are housed, a transfer port having opening and closing means through which a manufactured article is loaded into or unloaded from the carrying vehicle, and a first and second air injecting sections that blow out air. The first air injecting section blows out air against the opening and closing means of the transfer port of the carrying vehicle, and the second air injecting section blows out air against an outer surface of the opening and closing means of the transfer port of the manufacturing apparatus.

With such an arrangement, the first air injecting section of the manufacturing apparatus blows out cleaned air against the opening and closing means of the transfer port of the carrying vehicle, e.g. an automated opening and closing means such as shutters. This makes it possible to remove foreign matter or the like attached to the opening and closing means. Further, the second air injecting section of the manufacturing apparatus forms a flow of air over the outer surface of the opening and closing means of the transfer port of the manufacturing apparatus, e.g. an automated opening and closing means such as shutters. This makes it possible to remove foreign matter or the like attached to the opening and closing means.

In a carrying system according to the present invention, the second air injecting section starts to blow out air before the carrying vehicle arrives at a transfer point.

With such an arrangement, while the carrying vehicle is running, air can be blown against the manufacturing apparatus.

A carrying system of the present invention comprises a carrying vehicle that carries a manufactured article and a plurality of manufacturing apparatuses installed in position. The carrying vehicle comprises a running unit that runs between the manufacturing apparatuses, a cleaning unit that supplies cleaned air, a housing section to which the cleaned air is supplied and in which manufactured articles are housed, and a transfer port having opening and closing means through which a manufactured article is loaded into or unloaded from the manufacturing apparatus. Each of the manufacturing apparatuses comprises a cleaning unit that supplies cleaned air, a housing section to which the cleaned air is supplied and in which manufactured articles are housed, and a transfer port having opening and closing means through which a manufactured article is loaded into or unloaded from the carrying vehicle. At least one of the carrying vehicle and the manufacturing apparatus comprises an air injecting section that forms an air tunnel between the carrying vehicle and the transfer port of the manufacturing apparatus.

There is provided a carrying vehicle comprising an article storage having an article delivery port through which an article is delivered to or received from stations arranged along a running path, the carrying vehicle being characterized by further comprising first air injecting means arranged around the periphery of the article delivery port to inject air to any of the stations. By thus injecting air from around the periphery of the article delivery port against the station, an air curtain is formed around the periphery of the article delivery port so that this air can blow away dust attached to the station. Further, when the carrying vehicle stops at a position where it stands opposite the station, an air curtain can be formed in a transfer path between the article delivery port and the station. Thus, whether or not doors are installed to close the article delivery port, dust can be prevented from adhering to the article. Consequently, the station can be cleaned to assist preparations for a transfer to or from the station. Further, dust can be prevented from adhering to the article during a transfer. Then, as soon as the carrying vehicle arrives at the station, a transfer can be started to improve production efficiency.

The carrying vehicle further comprises sucking means arranged in front of the first air injecting means in an advancing direction. With such a configuration, it is possible to suck air from an area in front of the carrying vehicle in its advancing direction, the air being generated as the carrying vehicle runs. Thus, the air generated as the carrying vehicle runs can be surely prevented from passing through an air curtain.

The carrying vehicle further comprises auxiliary air injecting means arranged in front of the first air injecting means in the advancing direction than. With such an arrangement, an air wall can be formed against the air from an area in front of the carrying vehicle in its advancing direction, the air being generated when the carrying vehicle runs. Thus, the air generated when the carrying vehicle runs can be surely prevented from passing through an air curtain.

The carrying vehicle further comprises second air injecting means for injecting air from an upper edge of the article delivery port, the air forming a down flow. With such a configuration, the second air injecting means can be driven to inject clean air against the outer surfaces of doors to remove dust attached to the outer surfaces. Therefore, by driving the second air injecting means before the doors are opened, it is possible to prevent dust attached to the outer surfaces of the doors from entering an article storage. Further, by driving the second air injecting means when the doors are opened, an air curtain can be formed which closes the article delivery port. Consequently, even when the article delivery port is open, it is possible to prevent dust from entering the article storage.

There is provided a carrying system comprising a carrying vehicle including an article storage having an article delivery port through which an article is delivered or received and stations arranged along a running path for the carrying vehicle and each provided with an article storage having an article delivery port which is opened and closed using first doors to deliver or receive an article to or from the carrying vehicle, and wherein each of the stations has wall members formed in front of and behind the article delivery port of the station in a direction in which the carrying vehicle advances, and the carrying vehicle has air injecting means arranged around the periphery of the article delivery port of the carrying vehicle to inject air to the station so as to form an air curtain. With such a configuration, the station can use the first doors to prevent dust from entering the article storage. The carrying vehicle can use the air curtain formed by the air injecting means to prevent dust from entering the article storage. Then, the formation of the air curtain prevents dust from entering the storage while the carrying vehicle is running, whether or not the storage has doors. Further, dust attached to the first doors of the station can be removed by moving the carrying vehicle to stop it at the station. The stoppage of the carrying vehicle at the station serves to clean a transfer path formed between both article delivery ports. This in turn prevents dust from being attached to the article. As a result, it is possible to prepare for a transfer to or from the carrying vehicle before the carrying vehicle arrives at the station. Further, the first doors can be opened when the carrying vehicle arrives. This improves carrying efficiency and prevents dust from being attached to the article during a transfer. Furthermore, the formation of the walls leads to the formation of a small space between the carrying vehicle and the walls. Then, it is only this space that must be cleaned. An air curtain can thus be reliably formed. As a result, dust can be more surely prevented from entering the article storage of the carrying vehicle. Further, dust can be more reliably prevented from being attached to the article during a transfer.

Second doors that can be opened and closed are arranged in the article delivery port of the carrying vehicle, and the first and second doors are controlled so that the doors start to be opened before the carrying vehicle arrives at a stopped position at the station and are completely closed after the carrying vehicle has left the stopped position, with an opening of the first doors being located within the air curtain after the first doors have started to be opened and before the first doors are completely closed. With such a configuration, the carrying vehicle is provided with the second doors. Accordingly, when the doors are closed, operation of each air injecting means can be stopped. As a result, the power consumption of the carrying vehicle can be reduced. Further, the first and second doors start to be opened before the carrying vehicle stops at the station and are closed after the carrying vehicle leaves the station. Consequently, production efficiency can be further improved. Furthermore, the opening of the first doors arranged in the station is always within the air curtain. Therefore, even if the first doors of the carrying vehicle are opened or closed while the carrying vehicle is moving, dust is prevented from entering the article storage of the station.

BRIEF DESCRIPTION OF THE DRAWINGS

FIG. 27 is a schematic plan view of the carrying vehicle 102 and the station 103, showing a process starting with the start of the transfer operation and ending with the closure of the shutters 110, 110.

DETAILED DESCRIPTION OF THE PREFERRED EMBODIMENTS

Figure 1:
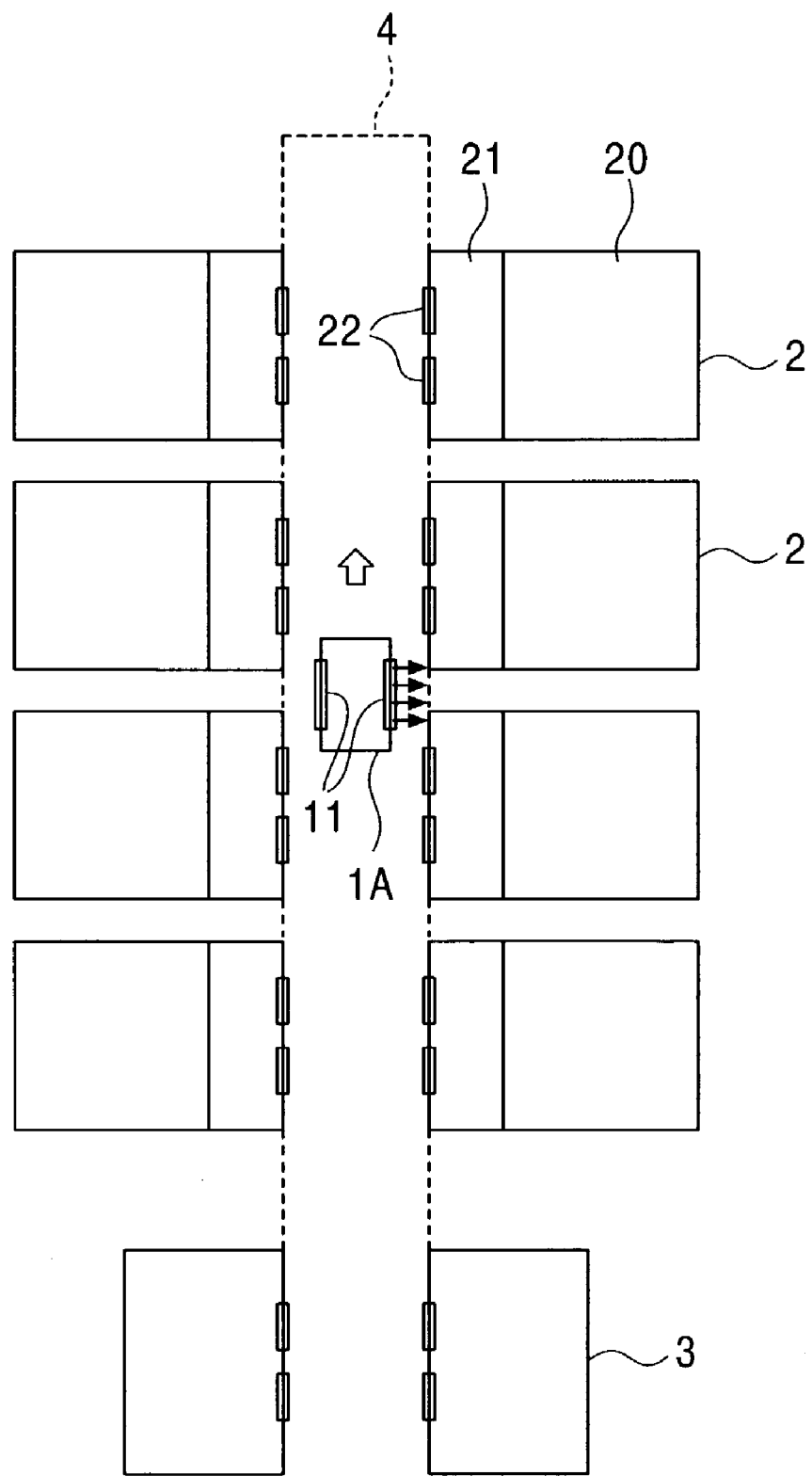
FIG. 1 is a schematic view showing an example of a configuration of an automated carrying system according to Embodiment 1 of the present invention.

FIG. 1 is a schematic view showing an example of a configuration of an automated carrying system according to Embodiment 1 of the present invention. FIG. 1 shows the automated carrying system applied to a production line for manufacturing semiconductor devices such as liquid crystal display devices. In this figure, 1A is an automated carrying vehicle, 2 is a semiconductor manufacturing apparatus, 3 is a stoker, and 4 is a carrying path. Further, 11 is a transfer port in the automated carrying vehicle, 20 is a processing section, 21 is a loader/unloader, and 22 is a transfer port in the semiconductor manufacturing apparatus.

This automated carrying system is composed of the automated carrying vehicle 1A, a plurality of semiconductor apparatuses 2, and a plurality of stockers 3. The automated carrying system is used in a clean room with a relatively low cleanliness. The interior of the automated carrying vehicle 1A, each semiconductor manufacturing apparatus 2, and each stocker 3 is kept cleaner than the clean room. Thus, this local cleaning serves to retain manufactured articles in a very clean atmosphere. For example, the interior of the clean room is in about a class 10,000 to 100,000, while the interior of the automated carrying vehicle 1A, each semiconductor manufacturing apparatus 2, and each stocker 3 is in about a class 100.

The semiconductor manufacturing apparatuses 2 execute processes such as film formation and etching on a substrate composed of a flat glass. They are fixedly installed in place in the clean room. Each of the semiconductor manufacturing apparatus 2 is composed of the processing section 20 and the loader/unloader 21.

The processing section 20 is composed of an air-tight chamber in which substrates are processed. The loader/unloader 21 is a standby chamber used to load or unload substrates into or from the processing section 20. The loader/unloader 21 temporarily houses substrates that have not been processed or have already been processed. Thus, the interior of the loader/unloader 21 is supplied with air cleaned by a cleaning unit (not shown in the drawings)). The loader/unloader 21 is filled with cleaned air so as to be maintained at a positive pressure with respect to a surrounding environment (the interior of the clean room) and at a cleanliness higher than that of the surrounding environment.

The transfer port 22 is an opening through which substrates are loaded into or unloaded from the loader/unloader 21. It is formed in a front surface of a housing which faces the carrying path 4. A shutter is attached to the transfer port 22 and is automatically opened or closed. Normally, the transfer port 22 is closed by the shutter and opened only when substrates are loaded into or unloaded from the manufacturing apparatus 2.

The stocker 3 is a storage apparatus used to temporarily store substrates. As in the case with the loader/unloader 21, the interior of the stocker 3 is supplied with cleaned air by the cleaning unit (not shown in the drawings) and is maintained at a positive pressure with respect to the surrounding environment (the interior of the clean room) and at a cleanliness higher than that of the surrounding environment.

The automated carrying vehicle 1A is an automated guided carrying vehicle such as an RGV (Rail Guided Vehicle), an AGV (Auto Guided Vehicle), or a traverser. The automated carrying vehicle 1A is automatically controlled to run along the carrying path 4 to carry substrates between the different semiconductor manufacturing apparatuses 2, between the different stockers 3, or between the semiconductor manufacturing apparatus 2 and the stocker 3. For carriage, a plurality of substrates are normally housed in a cassette, and one or more cassettes are stored in one automated carrying vehicle 1A.

The transfer port 11 is an opening through which a cassette is loaded into or unloaded from the automated carrying vehicle 1A. It is formed in a side of the automated carrying vehicle 1A as viewed from its advancing direction (a surface parallel with the advancing direction), the side facing the semiconductor manufacturing apparatus 2 during transfer. Further, the transfer port 11 has the same shape as that of the transfer port 22 of the semiconductor manufacturing apparatus 2 and is arranged at the same height as that of the transfer port 22. Accordingly, the transfer port 11 can be located opposite the transfer port 22 of the semiconductor manufacturing apparatus 2.

Furthermore, a shutter is attached to the transfer port 11 and is automatically opened or closed. Normally, the transfer port 11 is closed by the shutter and opened only when substrates are loaded into or unloaded. The transfer port 11 is formed in both sides of the automated carrying vehicle 1A shown in FIG. 1A because a cassette is transferred in both directions. However, if a cassette is transferred in only one direction, the transfer port 11 needs to be formed in only one side.

The automated carrying vehicle 1A can remove foreign matter attached to the front surface (which faces the transfer port 22) of the semiconductor manufacturing apparatus 2 by running while blowing cleaned air against the semiconductor manufacturing apparatus 2. This will be described below in detail with reference to FIGS. 2 to 5.

Figure 2:
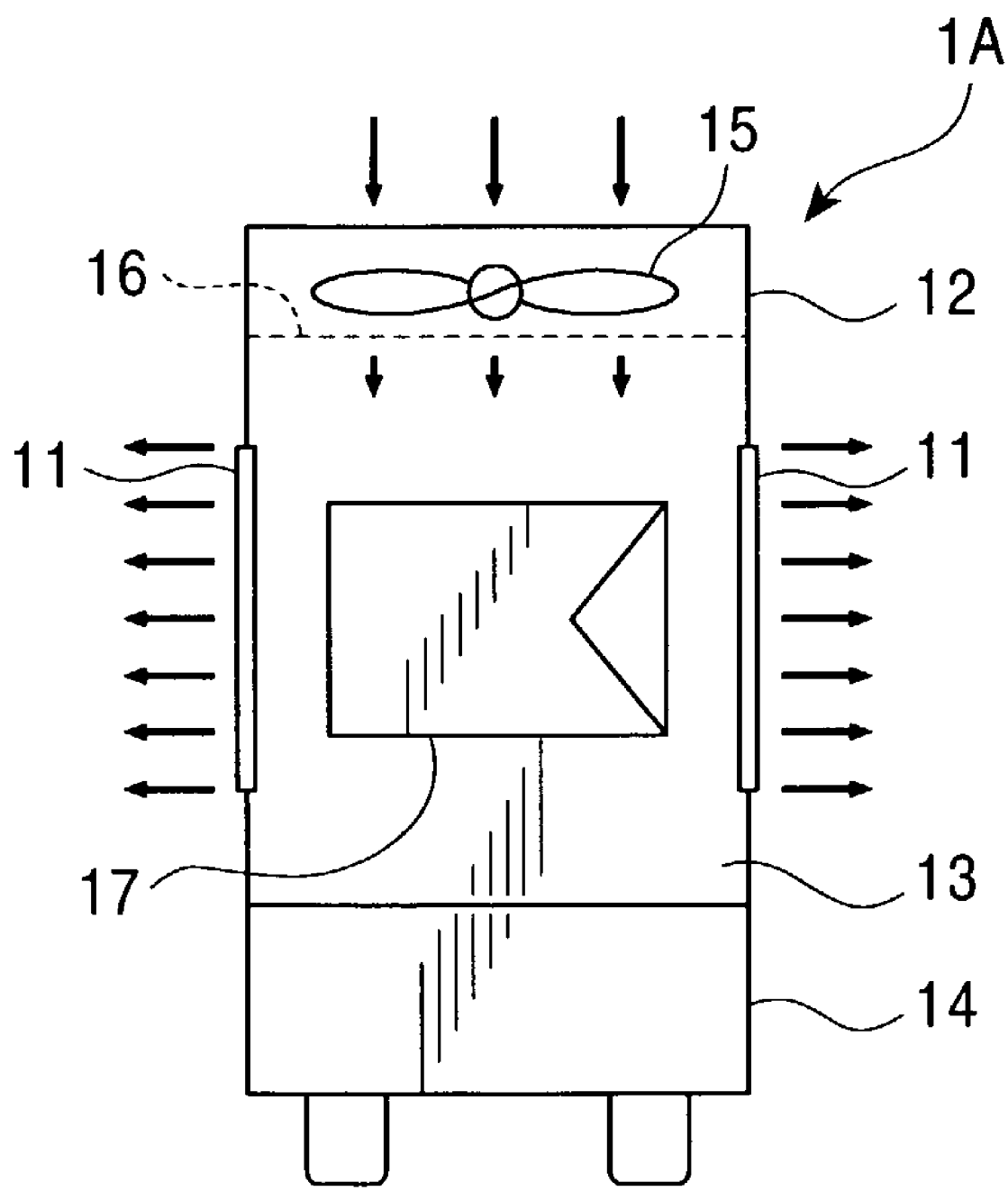
FIG. 2 is a view schematically showing a configuration of the interior of a carrying vehicle 1A in FIG. 1 as viewed from its advancing direction.
Figure 3:
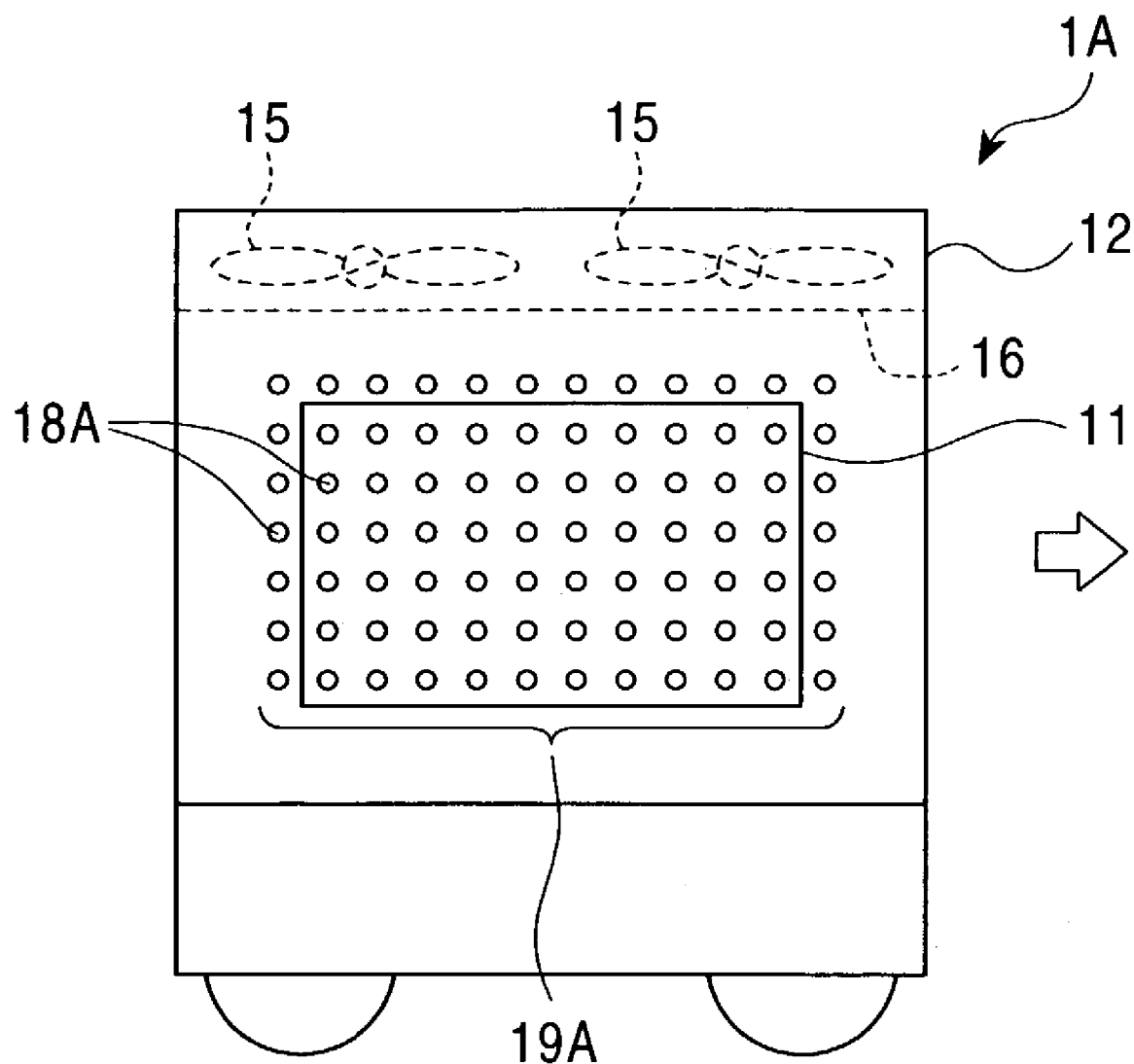
FIG. 3 is a view showing the appearance of the carrying vehicle 1A as viewed from a side with respect to its advancing direction.

FIGS. 2 and 3 are diagrams showing the configuration of the automated carrying vehicle 1A in FIG. 1 in further detail. FIG. 2 schematically shows the internal configuration of the carrying vehicle as viewed from its advancing direction. FIG. 3 shows the appearance of the automated carrying vehicle 1A as viewed from its side in its advancing direction. In the figures, 1A is the automated carrying vehicle, 11 is the transfer port, 12 is a cleaning unit, 13 is a housing section, and 14 is a running unit. Further, 15 is a blowing fan, 16 is a cleaning filter, 17 is a cassette, 18A is an air nozzle, and 19A is an air injecting section.

The cleaning unit 12 is an air cleaning apparatus called an "FFU (Fan Filter Unit)" which supplies cleaned air. It is composed of the blowing fan 15 and the cleaning filter 16. The cleaning filter 16 may be an HEPA (High Efficiency Particulate Air) filter, a ULPA (Ultra Low Particulate Air) filter, or the like.

Circulating air from the outside or housing section 13 is blown to the cleaning filter 16 by the blowing fan 15. The cleaning filter 16 cleans this air and blows the cleaned air to the housing section 13 and air nozzles 18A. The housing section is supplied with the cleaned air and maintained at a positive pressure with respect to the surrounding environment (the interior of the clean room) and at a cleanliness higher than that of the surrounding environment.

The large number of air nozzles 18A are arranged on the shutter of the transfer port 11 and around the periphery of the shutter so as to constitute an air injecting section 19A. Air is thus blown out through the entire surface and periphery of the shutter. The peripheral air nozzles 18A are arranged outside the transfer port 11 adjacent to its periphery. Further, the peripheral air nozzles 18A are arranged above and to the right and left of the transfer port 11 and not below it (at least a part of the area below the transfer port 11, e.g. a central part of this area). That is, the air nozzles 18A are arranged so as to surround the periphery of the transfer port 11 except for the area below the transfer port 11.

Air blown out from the air nozzles 18A is desirably cleaned by the cleaning unit 12. Further, the air nozzles 18A may be supplied with cleaned air using a fan (not shown in the drawings) using power different from that for the blowing fan 15. Furthermore, the air injecting section 19A may blow out air by utilizing wind pressure exerted on the automated carrying vehicle 1A during running. For example, air may be obtained from an area in front of the automated carrying vehicle 1 and then blown out from the nozzles. This makes it possible to reduce or eliminate the need for power used to blow out air.

The running unit 14 controls the automated carrying vehicle 1A to run along a predetermined carrying path to a predetermined one of the semiconductor manufacturing apparatuses 2 or stockers 3 and then to stop at a predetermined transfer point.

Figure 4:
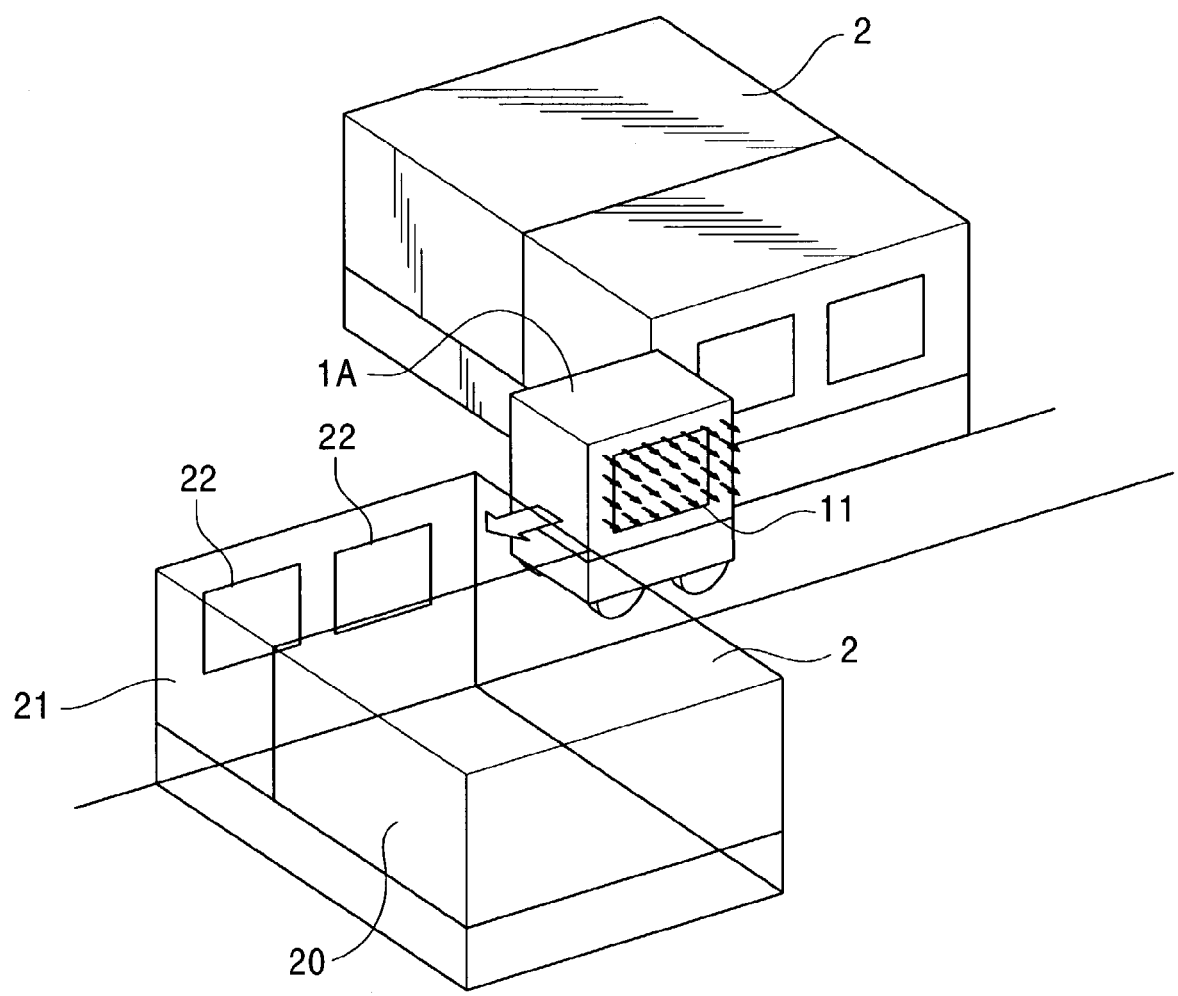
FIG. 4 is a view showing how the carrying vehicle 1A blows out air.

FIG. 4 shows how the automated carrying vehicle 1A blows out air. The automated carrying vehicle 1A blows out air through the entire surface and periphery of the shutter in a direction substantially normal to the side of the housing. This serves to remove foreign matter or the liked attached to the shutter. Air is also blown against the front surface of the semiconductor manufacturing apparatus 2 opposite which the side of the automated carrying vehicle 1A stands. Consequently, foreign matter or the like is removed which is attached to the front surface of the semiconductor manufacturing apparatus 2.

The transfer port 11 of the automated carrying vehicle 1A has the same shape as that of the transfer port 22 of the semiconductor manufacturing apparatus 2 and is arranged at the same height as that of the transfer port 22.

Accordingly, by blowing out air through the entire surface and periphery of the transfer port 11 of the automated carrying vehicle 1A, it is possible to blow air against the entire surface of the transfer port 22 of the semiconductor manufacturing apparatus 2. Consequently, foreign matter or the like can be removed which is attached to the shutter of the transfer port 22 of the semiconductor manufacturing apparatus 2, or the like.

Figure 5:
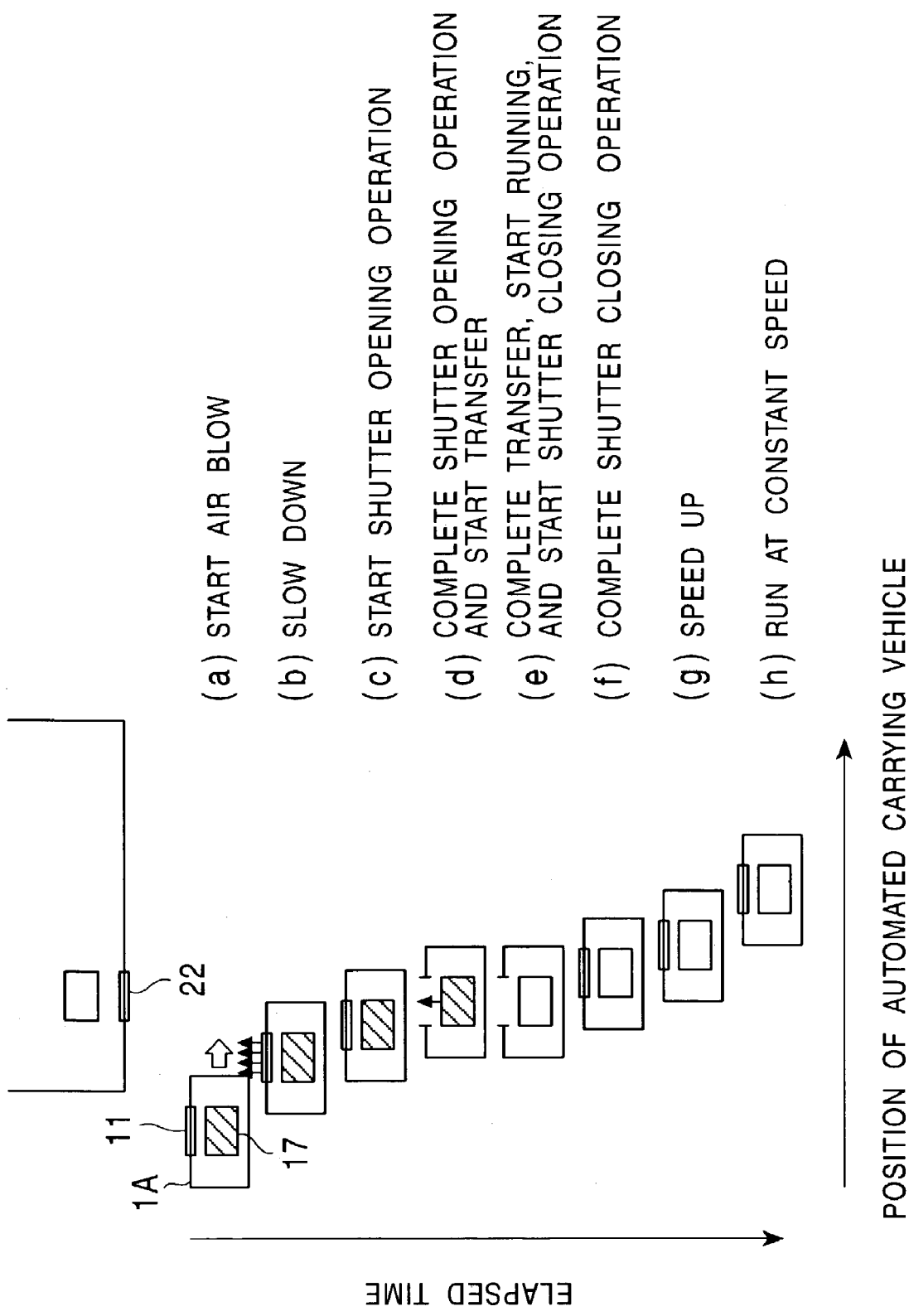
FIG. 5 is a view illustrating a timing for air blow.

FIG. 5 is a diagram illustrating a timing for air blow. The position of the automated carrying vehicle 1A is shown in the transverse direction of the figure. Elapsed time is shown in the vertical direction of the figure. The time elapses in the order of (a) to (h).

First, when the automated carrying vehicle 1A approaches the semiconductor manufacturing apparatus 2 to or from which a cassette is to be transferred, the running unit 14 detects its proximity to the semiconductor manufacturing apparatus 2 to output an approach signal. On the basis of this approach signal, the air injecting section 19A starts to blow out air to form an air blow ((a) in the figure). In this case, the running unit 14 of the automated carrying vehicle 1A generally has information such as its current position, its destination, and a running path used in order to accomplish automated running. Accordingly, the automated carrying vehicle 1A can generate an approach signal on the basis of this information. However, separately from the automated running control, an approach signal may be generated using detection means for detecting the approach of the semiconductor manufacturing apparatus 2.

Then, the running unit 14 slows down the automated carrying vehicle 1A ((b) in the figure) and stops it at the transfer point where the transfer ports 11, 22 of the automated carrying vehicle 1A and semiconductor manufacturing apparatus 2 stand opposite each other. The automated carrying vehicle 1A starts to blow out air before arriving at the transfer point and runs while blowing air against the semiconductor manufacturing apparatus 2. Accordingly, when the automated carrying vehicle 1A arrives at the transfer point, air has been sufficiently blown against the transfer port 22 of the semiconductor manufacturing apparatus 2.

Further, on the basis of the approach signal, before the automated carrying vehicle 1A arrives at the transfer point, the shutters of the automated carrying vehicle 1A and semiconductor manufacturing apparatus 2 start to be opened ((c) in the figure)). This shutter opening operation is completed before the arrival at the transfer point. Therefore, when the automated carrying vehicle 1A stops at the transfer point, the shutters are completely open. Then, the cassette 17 is transferred from the automated carrying vehicle 1A to the semiconductor manufacturing apparatus 2 (or from the semiconductor manufacturing apparatus 2 to the automated carrying vehicle 1A) ((d) in the figure). The cassette 17 is transferred using a transfer fork provided in the automated carrying vehicle 1A.

Once the cassette 17 is completely transferred, the running unit 14 runs the automated carrying vehicle 1A again. At this time, simultaneously with the start of running, the shutters of the automated carrying vehicle 1A and semiconductor manufacturing apparatus 2 start to be closed ((e) in the figure). While the automated carrying vehicle 1A is running, the shutters are completely closed ((f) in the figure). Subsequently, the automated carrying vehicle 1A is accelerated up to a predetermined speed and then runs at this fixed speed to the next transfer point ((g) and (h) in the figure).

Figure 6:
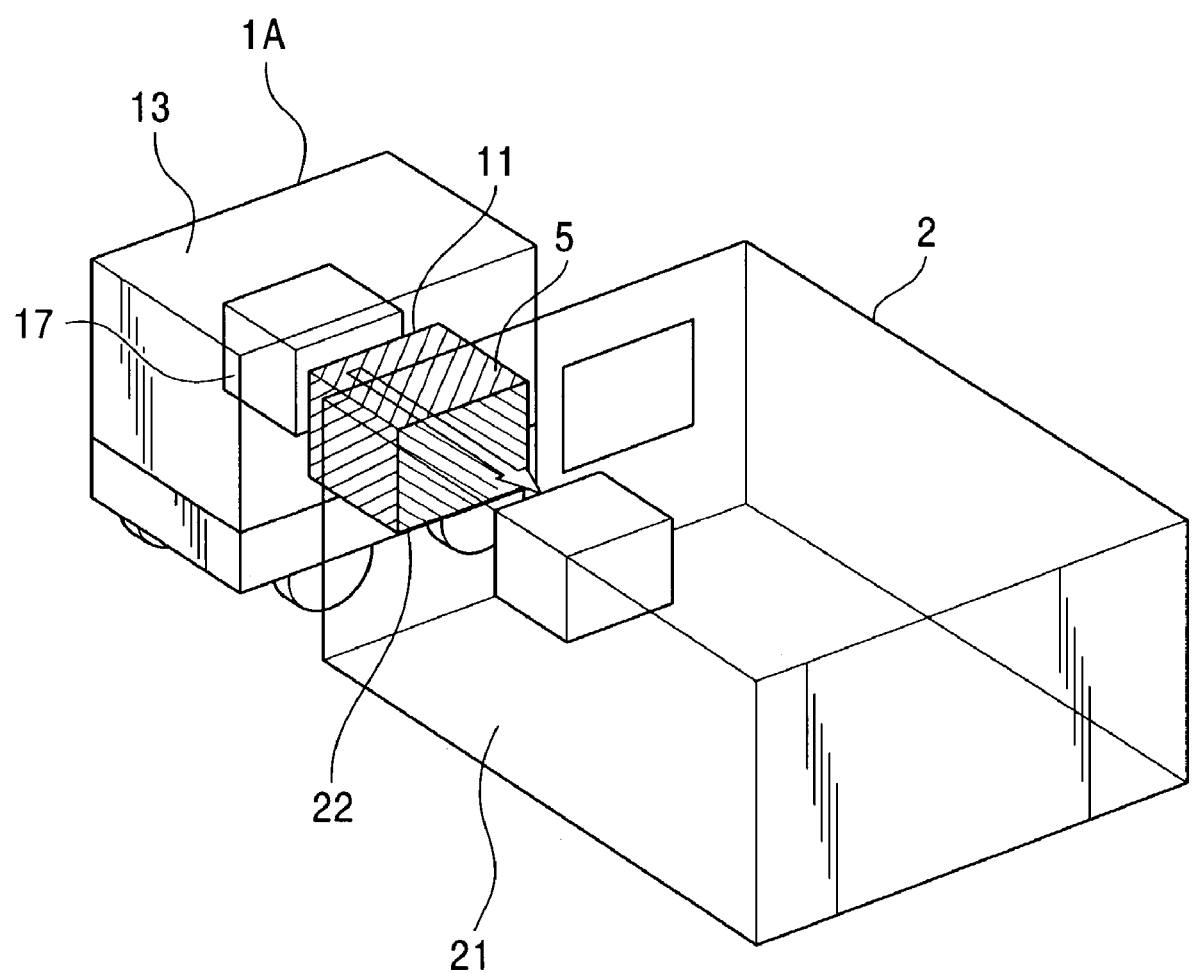
FIG. 6 is a view showing how a cassette is transferred between the carrying vehicle 1A and a semiconductor manufacturing apparatus 2.

FIG. 6 shows how a cassette is transferred between the automated carrying vehicle 1A and the semiconductor manufacturing apparatus 2. In the figure, 5 is a clean tunnel. At a transfer point, if a cassette is transferred between the automated carrying vehicle 1A and the semiconductor manufacturing apparatus 2, the shutters of the opposite transfer ports 11, 22 are both opened. At this time, the interior of the housing section 13 of the automated carrying vehicle 1A and the interior of the loader/unloader 21 are both at a positive pressure with respect to the surrounding environment. Consequently, the clean tunnel 5 is formed in the space sandwiched between the transfer port 11 and the transfer port 22.

The clean tunnel 5 is a cleaner space filled with cleaned air. The cassette 17 is transferred from the automated carrying vehicle 1A to the semiconductor manufacturing apparatus 2 or vice versa through the clean tunnel 5. Thus, the cassette 17 is not transferred via an unclean atmosphere.

According to the present embodiment, an air injecting section is provided in that side of the automated carrying vehicle 1A in which the transfer port 11 is formed, to blow air against the front surface of the semiconductor manufacturing apparatus 2. This air blow removes foreign matter or the like attached to the front surface of the semiconductor manufacturing apparatus 2. Therefore, when the shutter of the transfer port 22 is opened, it is possible to prevent or suppress the stir-up of foreign matter attached to the shutter or its periphery.

Further, a large number of air nozzles 18A are provided on the transfer port 11 of the automated carrying vehicle 1A to blow out air through the entire surface and periphery of the transfer port 11. Thus, air can be blown against the front surface of the semiconductor manufacturing apparatus 2, i.e. the entire surface and periphery of the transfer port 22 of the semiconductor manufacturing apparatus 2, provided opposite the transfer port 11 of the automated carrying vehicle 1A.

Further, when the automated carrying vehicle 1A approaches the semiconductor manufacturing apparatus 2, the air injecting section 19A starts to blow out air. Thus, air blow is carried out while the automated carrying vehicle 1A is running, and is completed before the automated carrying vehicle 1A arrives at the transfer point. This reduces the time required for a transfer.

Furthermore, when the automated carrying vehicle 1A approaches the semiconductor manufacturing apparatus 2, the shutter of the transfer port 11 is opened. This shutter opening operation is completed before the automated carrying vehicle 1A arrives at the transfer point. Thus, once the automated carrying vehicle 1A arrives at the transfer point, a transfer operation can immediately be started. This serves to reduce the time required for a transfer. In this manner, the transfer time can be reduced, so that if the present invention is applied to a production line, productivity can be improved.

Embodiment 2

In Embodiment 1, description has been given of the example in which the air injecting section is provided on the entire surface of the transfer port of the automated carrying vehicle. However, in the present embodiment, a description will be given of a case in which the air injecting section is formed closer to the advancing direction than to the transfer port. Further, a description will be given of a case in which the air injecting section forms an air curtain spreading in a vertical direction.

Figure 7:
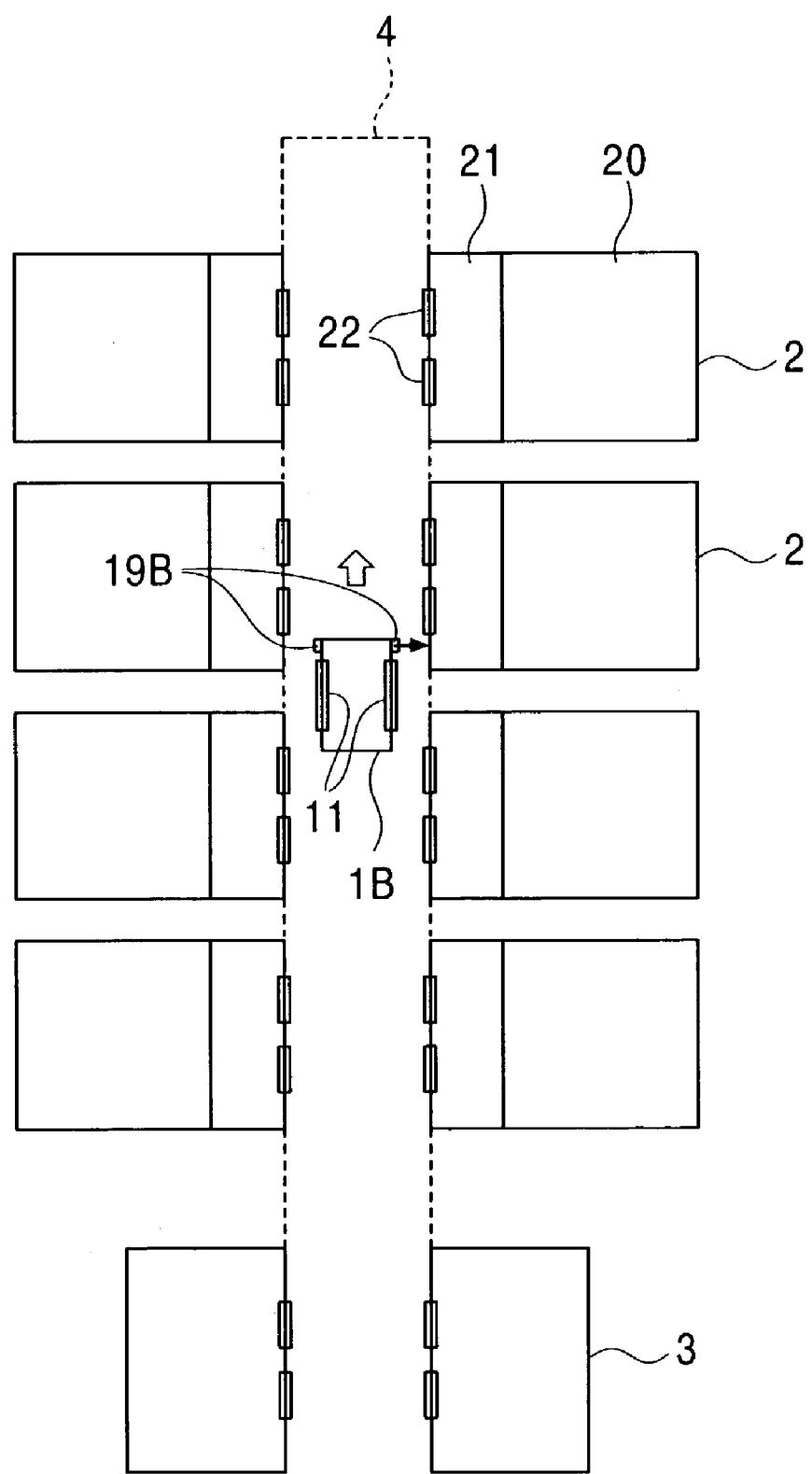
FIG. 7 is a schematic view showing an example of a configuration of an automated carrying system according to Embodiment 2 of the present invention.

FIG. 7 is a schematic view showing an example of a configuration of an automated carrying system according to Embodiment 2 of the present invention. In the figure, 1B is the automated carrying vehicle, 2 is the semiconductor manufacturing apparatus, 3 is the stocker, and 4 is the carrying path. Further, 18B is the air nozzle, 19B is the air injecting section, 20 is the processing section, 21 is the loader/unloader, and 11 and 22 are the transfer ports.

The air injecting section 19B is provided on that side of the automated carrying vehicle 1A with respect to its advancing direction in which the transfer port 11 is formed. Further, the air injecting section 19B is provided on this side and closer to the advancing direction than to the transfer port 11.

The air injecting section 19B blows out air in a direction angled from the advancing direction and away from the side of the automated carrying vehicle 1A. Typically, air is blown in a direction normal to the side of the automated carrying vehicle 1A as shown in FIG. 7.

In FIG. 7, the air injecting section 19B is provided in an area in the periphery of and adjacent to the transfer port 11. However, it may be formed off from the transfer port 11. Further, in FIG. 7, the transfer port 11 and the air injecting section 19B are formed in both sides of the automated carrying vehicle 1B. However, if the transfer port 11 is formed in only one side and a transfer operation is performed only at this side, the air injecting section 19B also needs to be provided on only one side.

Figure 8:
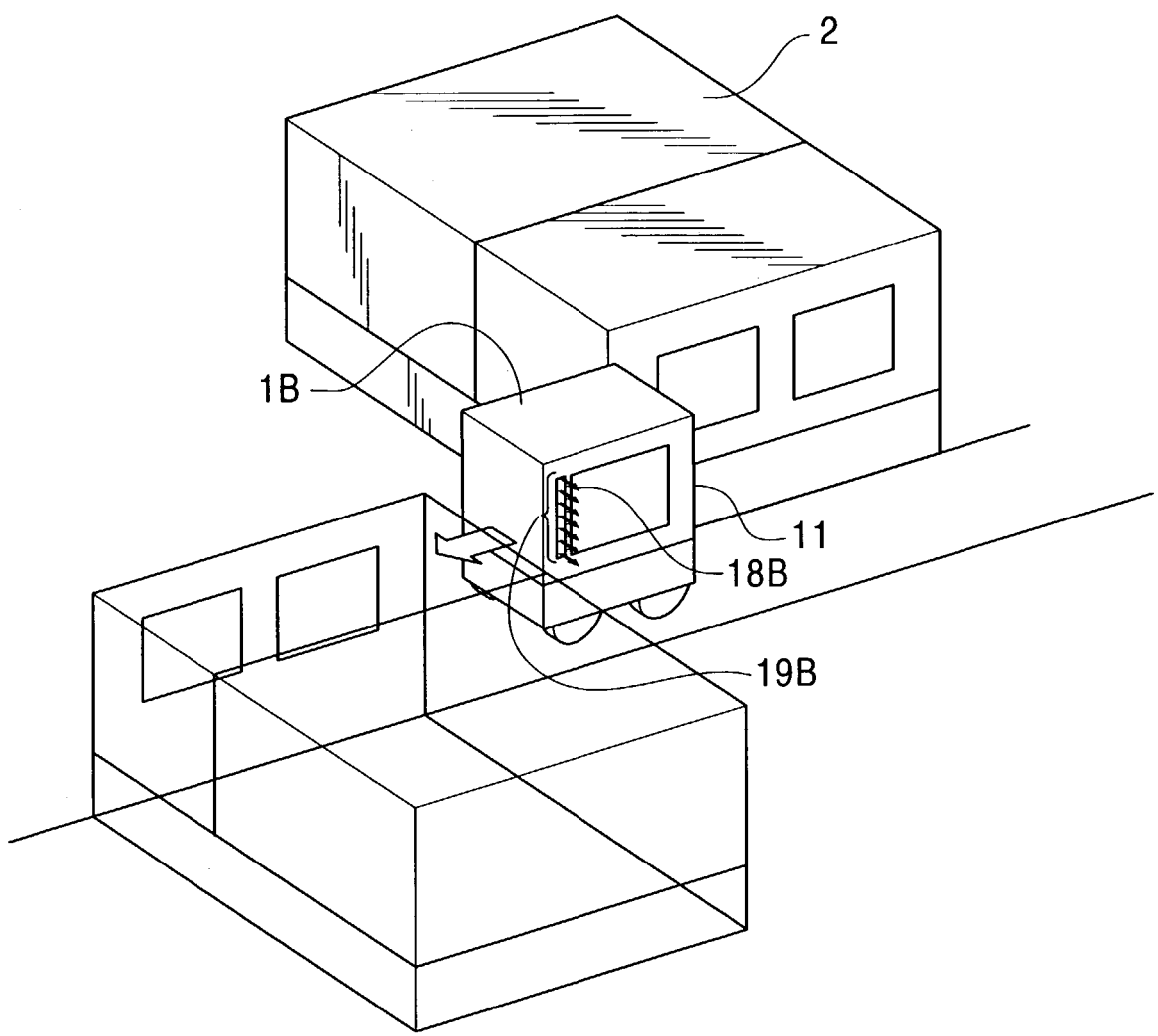
FIG. 8 is a view showing how a carrying vehicle 1B blows out air.

FIG. 8 shows how the automated carrying vehicle 1B in FIG. 7 blow out air. The automated carrying vehicle 1B detects its proximity to the next semiconductor manufacturing apparatus 2 to or from which a cassette is to be transferred. Before arriving at the corresponding transfer point, the automated carrying vehicle 1B forms air blow by blowing out air from the air injecting section 19B, provided on that side of the automated carrying vehicle 1B which is parallel with the advancing direction and in which the transfer port 11 is formed.

The air injecting section 19B is composed o a plurality of air nozzles 18B arranged at different heights. Air blow from the air nozzles 18B forms an air curtain spreading in the vertical direction. Thus, by blowing out air while the automated carrying vehicle 1B is running, the air curtain spreading in the vertical direction can be moved in a horizontal direction. Consequently, air can be efficiently blown against the front surface of the semiconductor manufacturing apparatus 2.

In this case, desirably, the upper-end air nozzles 18B, constituting the air injecting section 19B, are attached to the automated carrying vehicle 1B above the upper edge of the transfer port 11. Also desirably, the lower-end air nozzles 18B are attached to the automated carrying vehicle 1B below the lower edge of the transfer port 11. With the air injecting section configured as described above, an air curtain can cover the transfer port 22 of the semiconductor manufacturing apparatus 2 from its upper edge to lower edge. As a result, air can be blown against the entire surface of the transfer port 22 of the semiconductor manufacturing apparatus 2.

Further, the air injecting section 19B detects its proximity to the next semiconductor manufacturing apparatus 2 to or from which a cassette is to be transferred, and starts to blow out air before arriving at the transfer point. Accordingly, when the automated carrying vehicle 1B arrives at the transfer point, air has been sufficiently blown against the transfer port 22 of the semiconductor manufacturing apparatus 2. In particular, by starting air blow before the air injecting section 19B stands opposite the transfer port 22 of the semiconductor manufacturing apparatus 2 to or from which a cassette is to be transferred, air has been sufficiently blown against the entire surface of the transfer port 22 when the automated carrying vehicle 1B arrives at the transfer point.

If the automated carrying vehicle 1B can run in both directions, i.e. it can move both forward and backward, then the above air blow can be carried out regardless of the running direction of the automated carrying vehicle 1B, by providing the air injecting section 19B on that side of the automated carrying vehicle 1B in which the transfer port 11 is formed so that the air injecting sections 19B lie at the respective sides of the transfer port 11 in the horizontal direction.

Embodiment 3

In Embodiments 1 and 2, a description has been given of the example in which the air injecting section is provided on the side of the automated carrying vehicle. However, in the present embodiment, a description will be given of a case in which the air injecting section is provided in a corner of the automated carrying vehicle. Further, a description will be given of a case in which the air injecting section blows out air from the side of the automated carrying vehicle 1A in a direction closer to the advancing direction than to the direction normal to this side.

Figure 9:
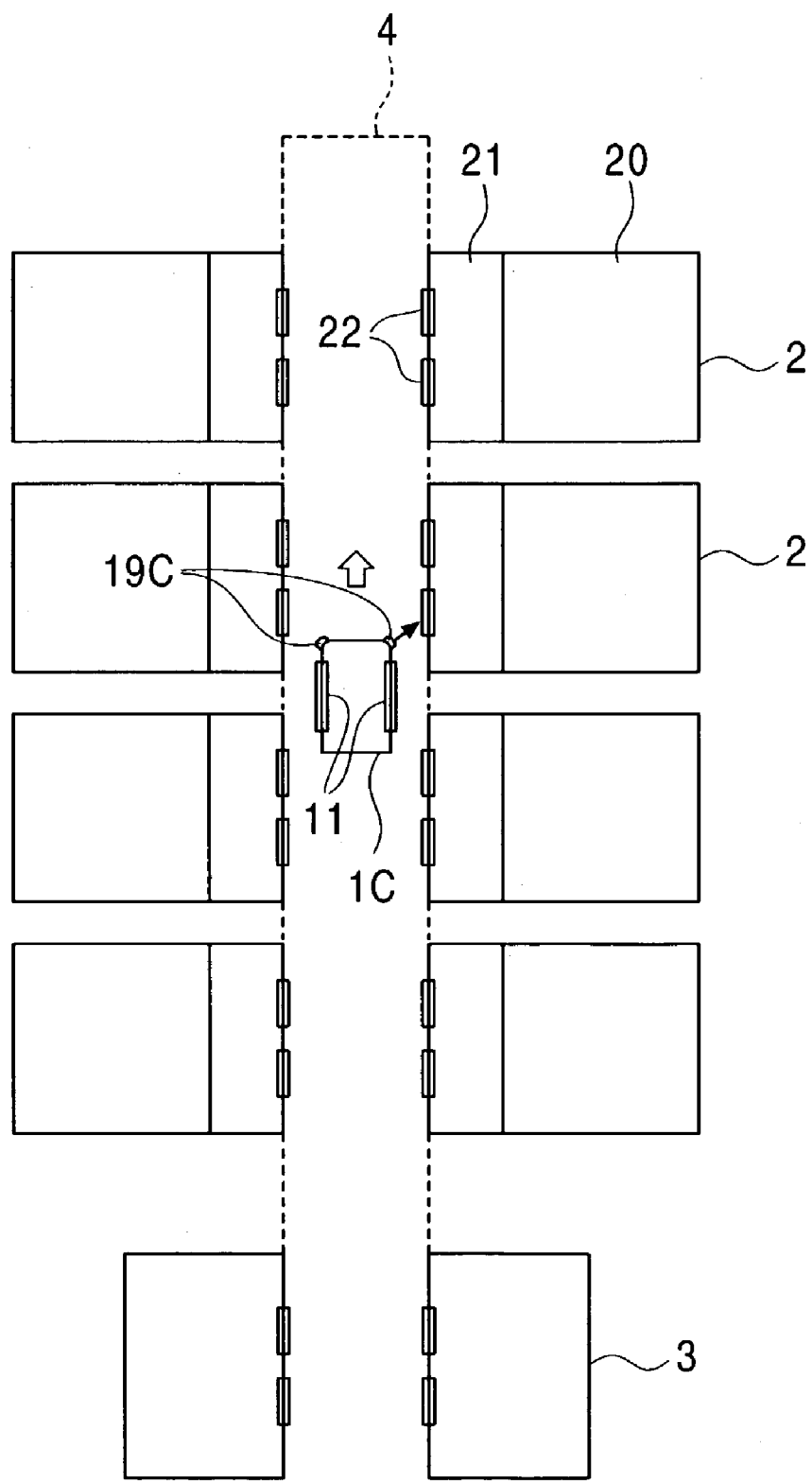
FIG. 9 is a schematic view showing an example of a configuration of an automated carrying system according to Embodiment 3 of the present invention.

FIG. 9 is a schematic view showing an example of a configuration of an automated carrying system according to Embodiment 3 of the present invention. In the figure, 1C is the automated carrying vehicle, 2 is the semiconductor manufacturing apparatus, 3 is the stocker, 4 is the carrying path, and 18C is the air nozzle. Further, 19C is the air injecting section, 20 is the processing section, 21 is the loader/unloader, and 22 is the transfer port.

The air injecting section 19C is provided in a corner of the automated carrying vehicle 1C. The air injecting section 19C is provided in that corner of the automated carrying vehicle 1C which is located in its front and on its side in which the transfer port 11 is formed. The air injecting section 19C can form air blow in a direction similar to that in Embodiment 2. However, in this case, it blows out air from the side of the automated carrying vehicle 1C in a direction closer to the advancing direction than to the direction normal to this side.

In FIG. 9, the transfer port 11 and the air injecting section 19C are formed in both sides of the automated carrying vehicle 1C. However, if the transfer port 11 is formed in only one side and a transfer operation is performed only at this side, the air injecting section 19C also needs to be provided on only one side.

Figure 10:
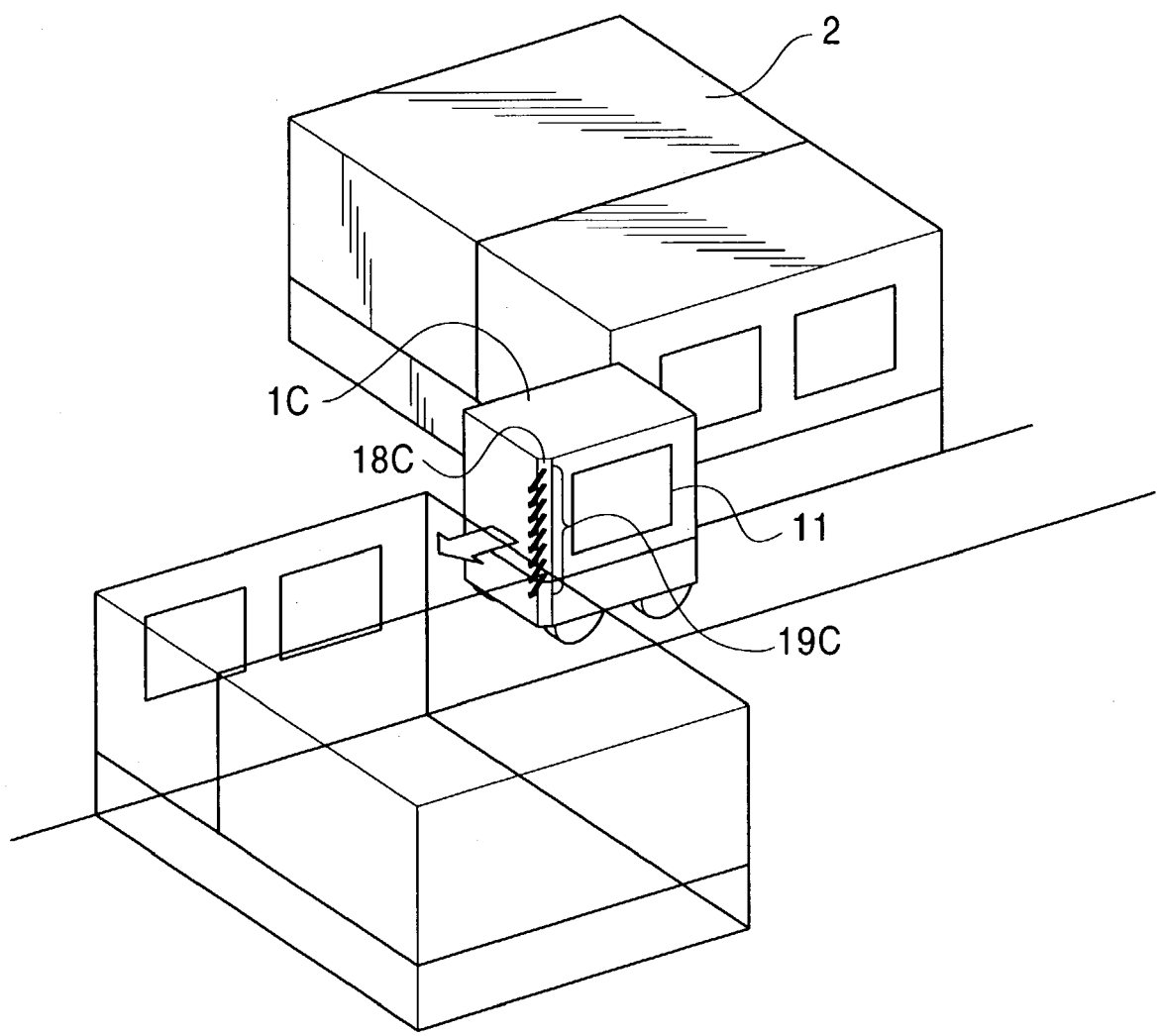
FIG. 10 is a view showing how a carrying vehicle 1C in FIG. 9 blows out air.

FIG. 10 shows how the automated carrying vehicle 1C in FIG. 9 blow out air. Upon detecting its proximity to the semiconductor manufacturing apparatus 2 to or from which a cassette is to be transferred, the automated carrying vehicle 1C forms air blow by blowing out air from the air injecting section 19C, provided on that side of the automated carrying vehicle 1C which is parallel with the advancing direction and in which the transfer port 11 is formed.

As in the case with Embodiment 2, the air injecting section 19C is composed of a plurality of air nozzles 18C arranged at different heights. Air blow from the air nozzles 18B forms an air curtain spreading in the vertical direction.

Air is blown out from the air nozzles 18C in a direction closer to the advancing direction than to the direction normal to the side of the automated carrying vehicle 1C. The air is thus blown against the front surface of the semiconductor manufacturing apparatus 2 in front of the position where the air injecting section is mounted.

If the automated carrying vehicle 1C can run in both directions, i.e. it can move both forward and backward, then the above air blow can be carried out regardless of the running direction of the automated carrying vehicle 1C, by providing the air injecting section 19C in both corners (front and rear corners) of that side of the automated carrying vehicle 1C in which the transfer port 11 is formed.

Embodiment 4

In the above embodiments, a description has been given of the example in which the automated carrying vehicle is provided with the air injecting section to remove foreign matter or the like attached to the transfer port of the semiconductor manufacturing apparatus. However, in the present embodiment, a description will be given of a case in which the air injecting section is provided on the semiconductor manufacturing apparatus 2 to remove foreign matter or the like attached to the transfer port 22 of the semiconductor manufacturing apparatus 2.

Figure 11:
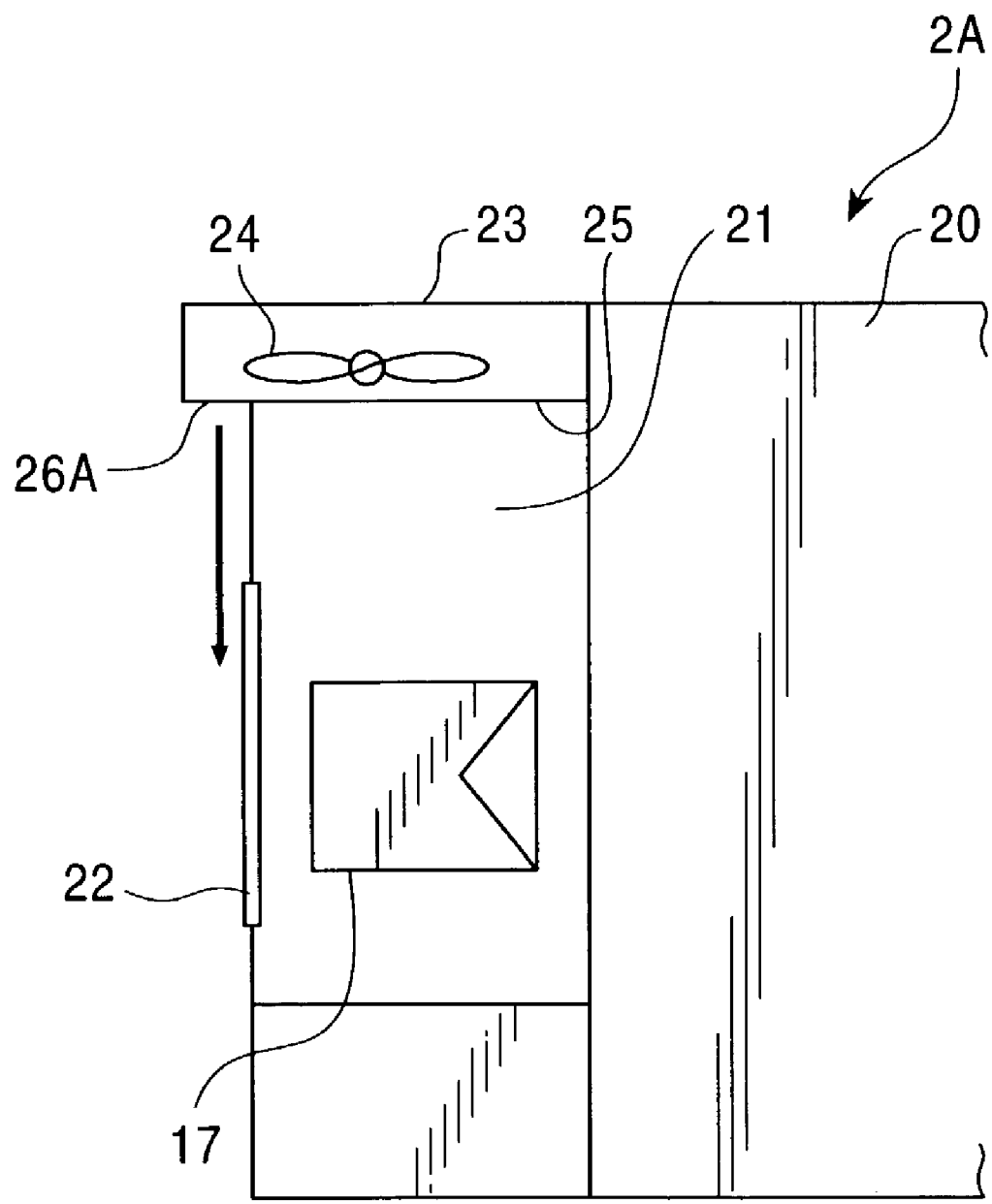
FIG. 11 is a sectional view schematically showing the structure of a semiconductor manufacturing apparatus 2A according to Embodiment 4 of the present invention.

FIG. 11 is a sectional view schematically showing the structure of a semiconductor manufacturing apparatus 2A according to Embodiment 4 of the present invention. In this figure, the semiconductor manufacturing apparatus 2A, applied to an automated carrying system similar to that in FIG. 1, is viewed from its side. In the figure, 17 is the cassette, 20 is the processing section, 21 is the loader/unloader, the 22 is the transfer port 22. Further, 23 is a cleaning unit, 24 is a blowing fan, 25 is a cleaning filter, 26A is an air nozzle, and 27A is an air injecting section.

The cleaning unit 23 is an air cleaning apparatus which supplies cleaned air, and is composed of the blowing fan 24 and the filter 25. The filter 25 may be an HEPA filter, a ULPA filter, or the like. Circulating air circulated from the outside or loader/unloader 21 is blown to the cleaning filter 25 by the blowing fan 24. The cleaning filter 25 cleans this air and blows the cleaned air to the loader/unloader 21 and air nozzles 26A.

The air injecting section 27A is composed of the plurality of air nozzles 26A, provided above the transfer port 22. The air nozzles 26A are provided at different positions in the horizontal direction (the direction parallel with the front surface). The air nozzles 26A serve to form an air curtain the flows downward along the front surface of the semiconductor manufacturing apparatus 2A. Specifically, a down flow can be formed over the outer surface of the transfer port 22 to remove foreign matter or the like attached to the transfer port 22.

The air nozzles 26A may be supplied with cleaned air using a fan (not shown in the drawings) that uses power different from that for the blowing fan 24. Furthermore, the air blown out from the air nozzles 26A is desirably cleaned by the cleaning unit 23. However, it is possible to use air from the surrounding environment which has a lower cleanliness.

Figure 12:
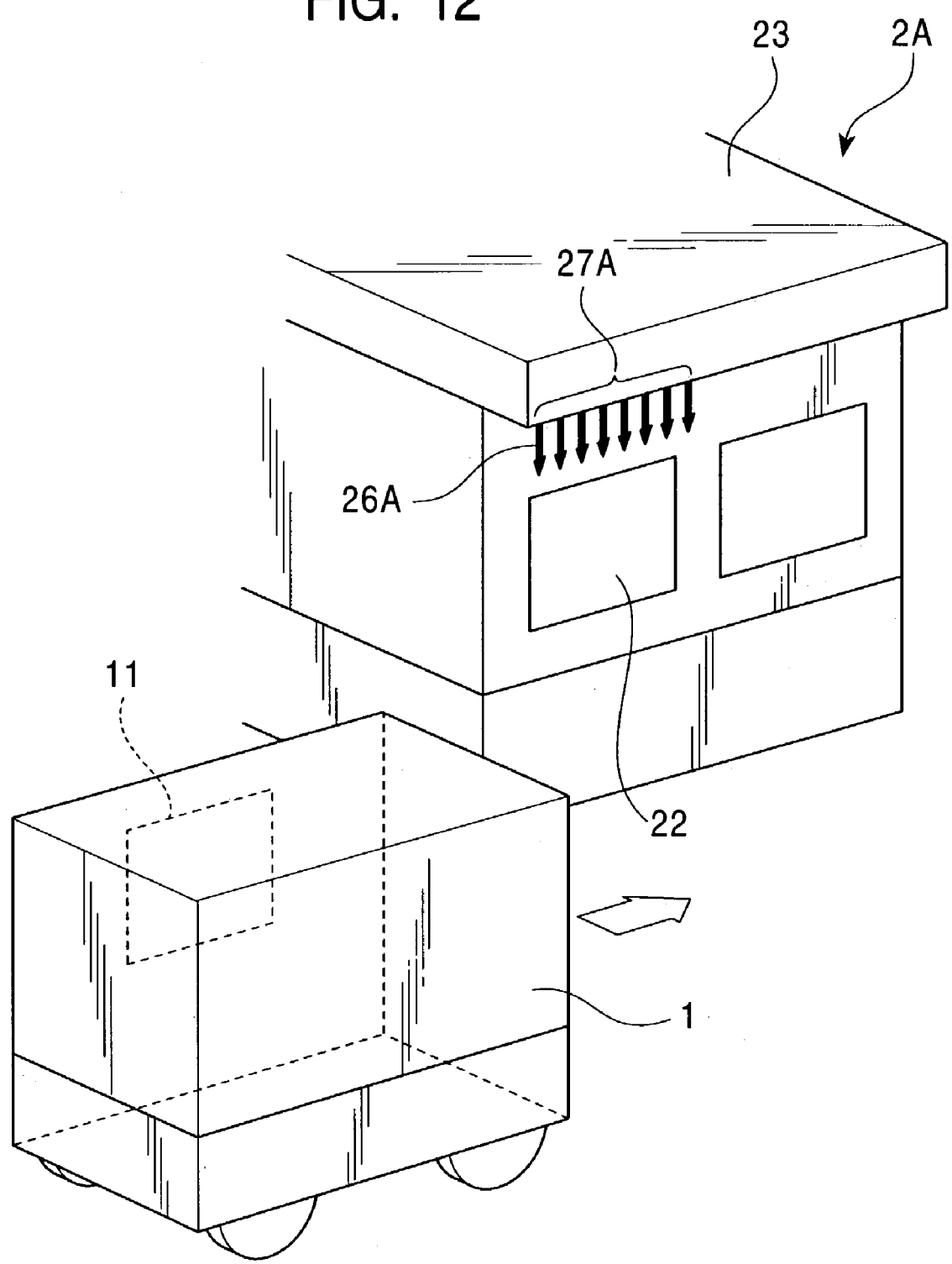
FIG. 12 is a view showing how the semiconductor manufacturing apparatus 2A in FIG. 11 blows out air.

FIG. 12 is a diagram showing how the semiconductor manufacturing apparatus 2A in FIG. 11 blows out air. The semiconductor manufacturing apparatus 2A has a carrying vehicle monitoring section (not shown in the drawings) that monitors the automated carrying vehicle 1 to and from which a cassette is to be transferred, to detect that the automated carrying vehicle 1 is approaching the semiconductor manufacturing apparatus 2A. Upon detecting the approach of the automated carrying vehicle to and from which the cassette is to be transferred, the carrying vehicle monitoring section outputs a detection signal. The semiconductor manufacturing apparatus 2A need not necessarily have the carrying vehicle monitoring section. Instead, an approach signal may be inputted to the semiconductor manufacturing apparatus 2A through a signal line or the like, not shown in the drawings.

On the basis of the detection signal, before the automated carrying vehicle 1 arrives at a transfer point, a down flow is formed over the outer surface of the transfer port 22, through which a cassette is to be transferred, by blowing air out from the air injecting section 27, provided above the transfer port 22. Thus, before the automated carrying vehicle arrives at the transfer point, it is possible to remove foreign matter or the like attached to the shutter of the transfer port 22.

Embodiment 5

In the above embodiments, a description has been given of the example in which air blow is used to removed foreign matter attached to the transfer port of the semiconductor manufacturing apparatus. However, in the present embodiment, a description will be given of a case in which foreign matter is removed which is attached to the transfer port of the semiconductor manufacturing apparatus.

Figure 13:
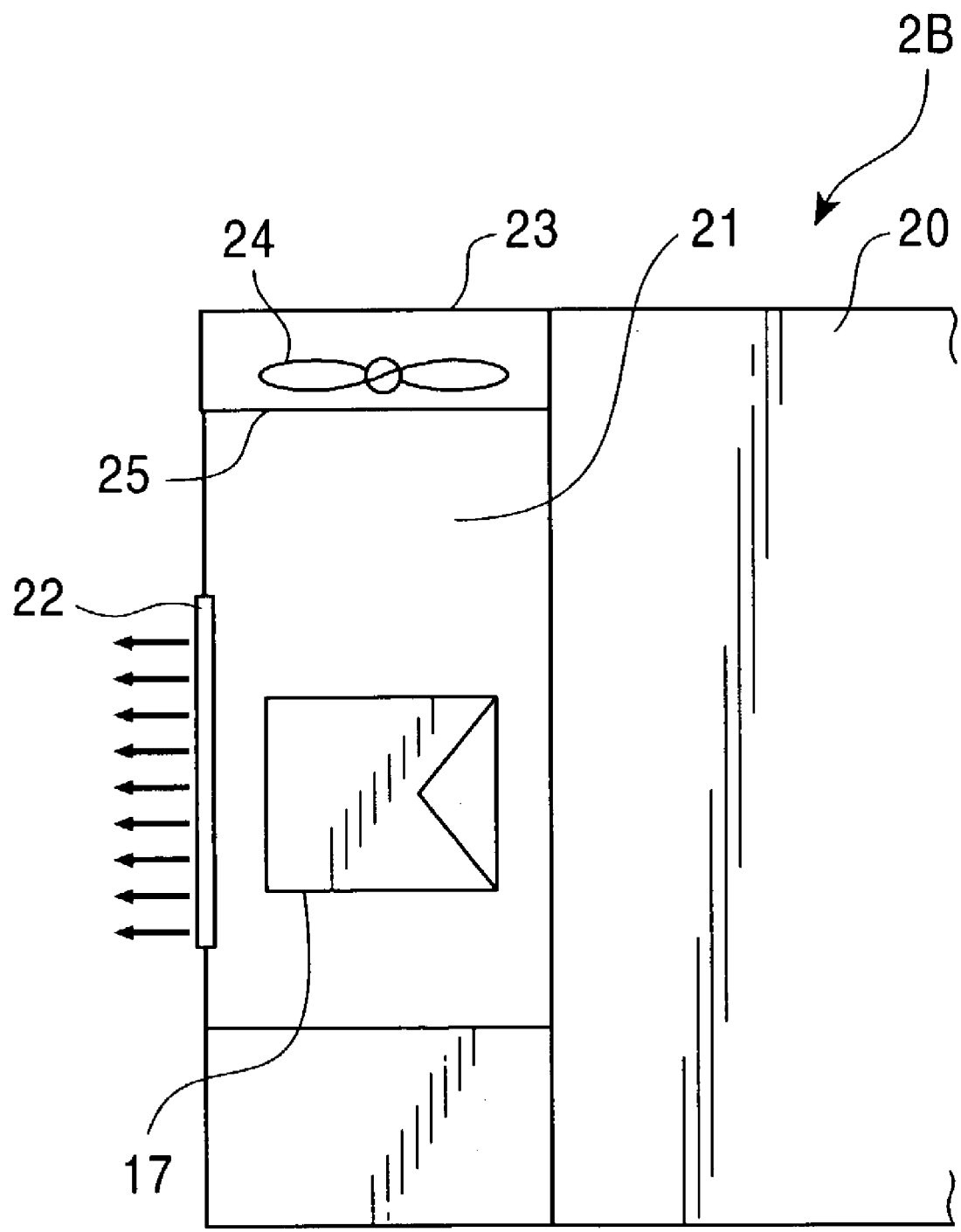
FIG. 13 is a sectional view schematically showing the structure of a semiconductor manufacturing apparatus according to Embodiment 5 of the present invention.
Figure 14:
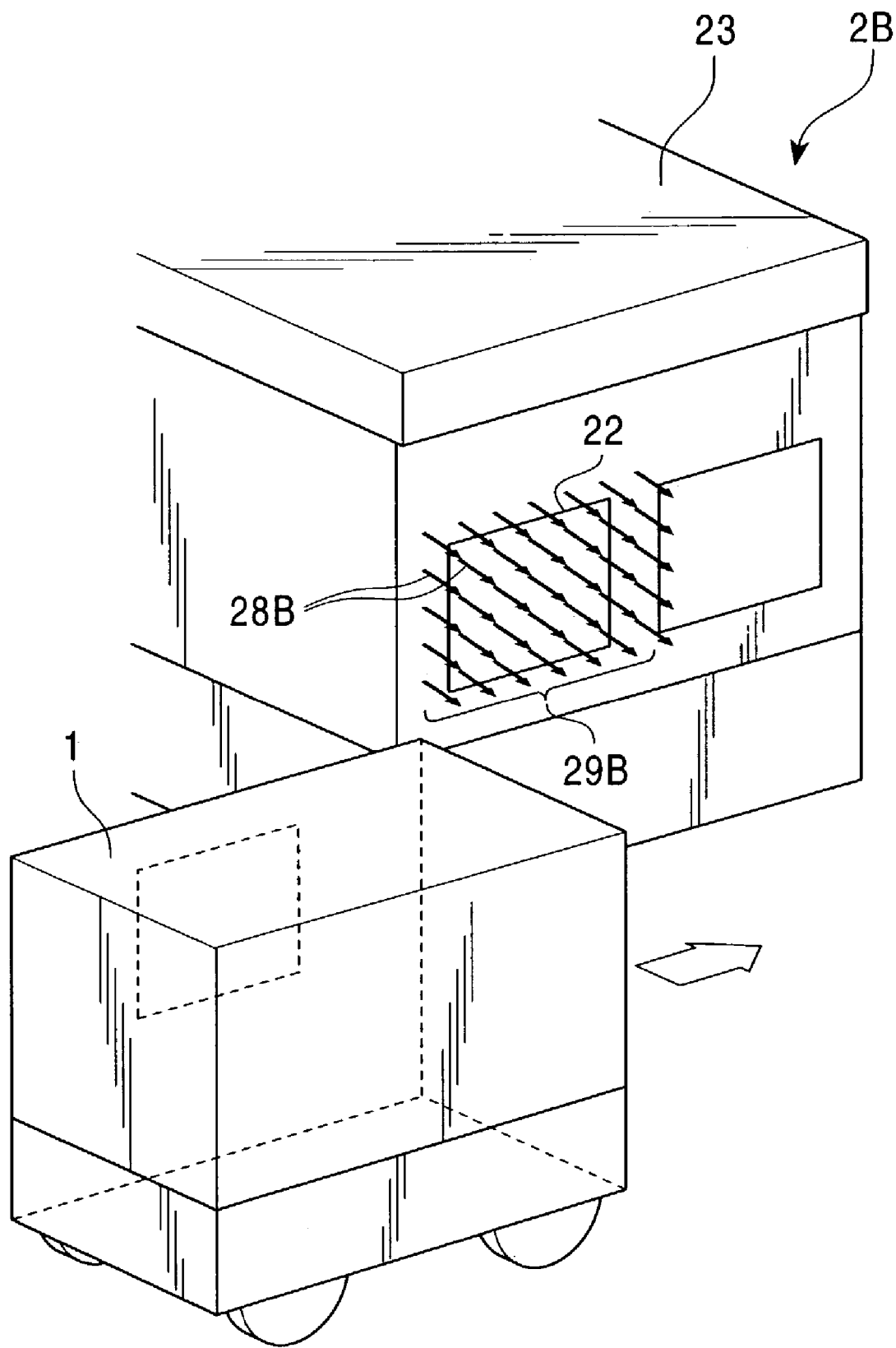
FIG. 14 is a view showing how a semiconductor manufacturing apparatus 2B in FIG. 13 blows out air.

FIG. 13 is a sectional view schematically showing the structure of a semiconductor manufacturing apparatus according to Embodiment 5 of the present invention. In this figure, a semiconductor manufacturing apparatus 2B applied to an automated carrying system similar to that in FIG. 1 is viewed from its side. FIG. 14 is a diagram showing how the semiconductor manufacturing apparatus 2B blows out air. In the figure, 1 is the automated carrying vehicle, 2B is the semiconductor manufacturing apparatus, 20 is the processing section, 21 is the loader/unloader, and 22 is the transfer port. Further, 23 is the cleaning unit, 24 is the blowing fan, 25 is the cleaning filter, 28B is an air nozzle, and 29B is an air injecting section.

The shutter of the transfer port 22 of the semiconductor manufacturing apparatus 2B is provided with an air injecting section similar to that of the automated carrying vehicle 1A according to Embodiment 1. Specifically, a large number of air nozzles 28B constituting the air injecting section 29B are arranged on the shutter of the transfer port 22. Accordingly, air is blown out from the entire surface and periphery of the shutter.

The semiconductor manufacturing apparatus 2B blows out air from the entire surface and periphery of the shutter in a direction substantially normal to the front surface of the housing. This serves to remove foreign matter or the like attached to the transfer port 22 of the semiconductor manufacturing apparatus 2B. Further, air is blown against that side of the automated carrying vehicle 1 opposite which the front surface of the semiconductor manufacturing apparatus 2B stands. This serves to remove foreign matter attached to the side of the automated carrying vehicle 1.

The transfer port 22 of the semiconductor manufacturing apparatus 2B is arranged opposite the transfer port 11 of the automated carrying vehicle 1. Accordingly, by blowing air from the entire surface of the shutter of the transfer port 22 of the semiconductor manufacturing apparatus 2B, air can be blown against the entire surface of the transfer port 11 of the automated carrying vehicle 1. It is thus possible to remove foreign matter or the like attached to the shutter of the transfer port 11 of the automated carrying vehicle 1, or the like.

Upon detecting its proximity to the automated carrying vehicle 1 to or from which a cassette is to be transferred, the semiconductor manufacturing apparatus 2B uses the air injecting section 29B to form air blow before the automated carrying vehicle 1 arrives at the corresponding transfer point, the air injecting section 29B being provided on the transfer port 22 through which a cassette is to be transferred. Air is thus blown against the transfer port 11 of the running automated carrying vehicle 1. Thus, before the automated carrying vehicle 1 arrives at the transfer point, it is possible to remove foreign matter or the like attached to the shutter of the transfer port 11.

In the present embodiment, the example has been shown in which to remove foreign matter attached to the transfer port of the automated carrying vehicle 1, the air injecting section similar to that of the automated carrying vehicle 1A according to Embodiment 1 is provided on the shutter of the transfer port 22 of the semiconductor manufacturing apparatus 2B. However, as in the case with Embodiment 2 the air injecting section may be provided at the respective sides of the transfer port so that air can be blown out from the air injecting section approached by the automated carrying vehicle 1A. Alternatively, as in the case with Embodiment 3, the air injecting section may be provided in the corner of the semiconductor manufacturing apparatus.

Embodiment 6

In Embodiments 4 and 5, a description has been given of the example in which air blow is used to remove foreign matter or the like attached to the semiconductor manufacturing apparatus or the automated carrying vehicle. However, in the present embodiment, a description will be given of an example in which air blow is further used to form a clean tunnel.

Figure 15:
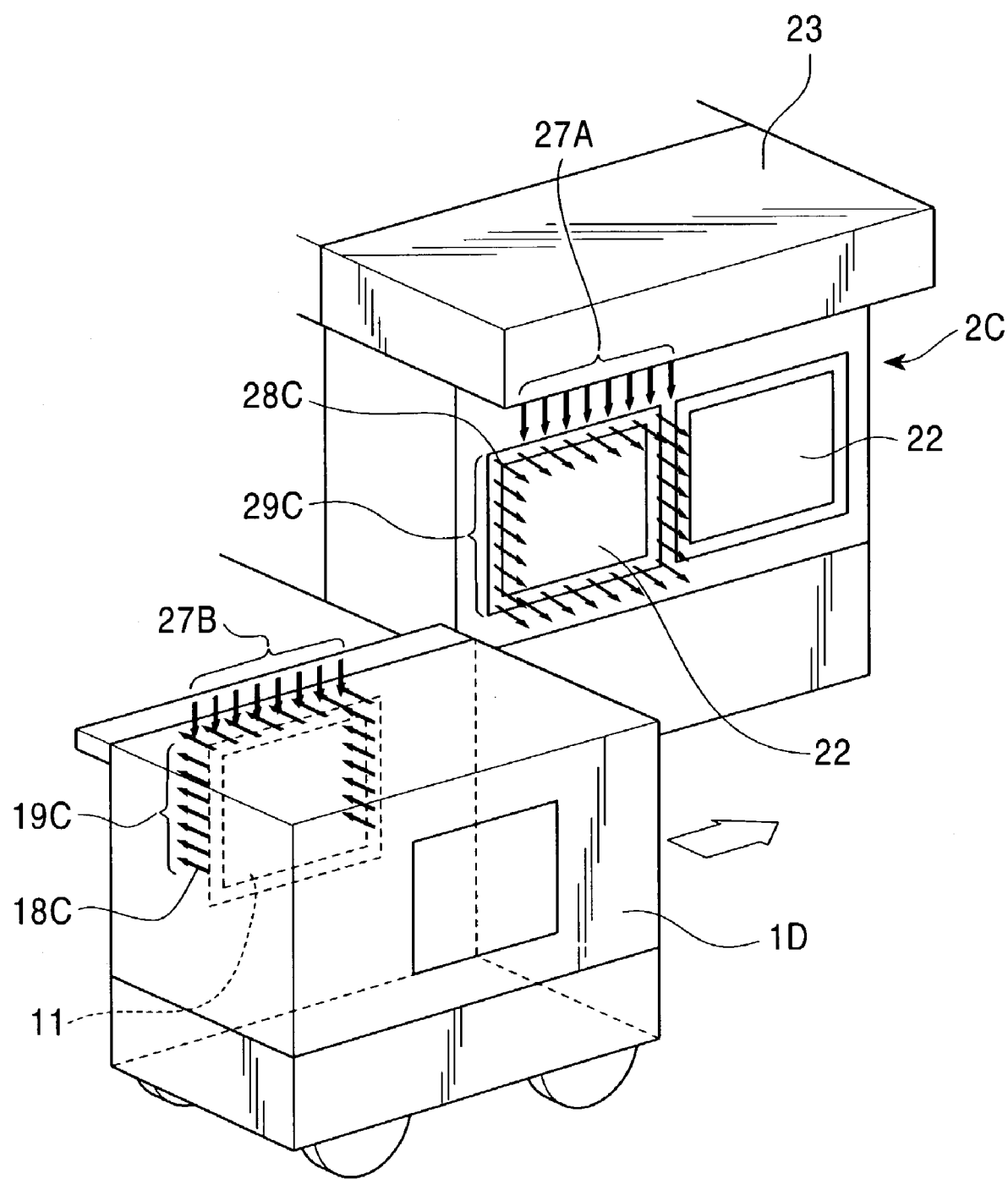
FIG. 15 is a view showing how a carrying vehicle and a semiconductor manufacturing apparatus according to Embodiment 6 of the present invention blow out air.

FIG. 15 shows how air is blown out by a semiconductor manufacturing apparatus according to Embodiment 6 of the present invention blows. This figure shows an automated carrying vehicle 1D and a semiconductor manufacturing apparatus 2C applied to an automated carrying system similar to that in FIG. 1. In the figure, 1D is the automated carrying vehicle, 2C is the semiconductor manufacturing apparatus, 11 and 22 are the transfer ports, and 23 is the cleaning unit. Further, 19C, 27A, 27B and 29C are air injecting sections, and 18C and 28C are air nozzles.

When approaching the semiconductor manufacturing apparatus 2C to or from which a cassette is to be transferred, the automated carrying vehicle 1D starts to blown out air from the air injecting section 27B provided above the transfer port 11 through which the cassette is to be transferred and from the air injecting section 19C provided around the periphery of the transfer port 11, before the automated carrying vehicle 1D arrives at the corresponding transfer point.

Further, upon detecting the approach of the automated carrying vehicle 1D to or from which the cassette is to be transferred, the semiconductor manufacturing apparatus 2C starts to blow out air from the air injecting section 27A provided above the transfer port 22 through which the cassette is to be transferred and from the air injecting section 29C provided around the periphery of the transfer port 22, before the automated carrying vehicle 1D arrives at the corresponding transfer point. In this regard, when air is simultaneously blown out from the air injecting section 27A and the air injecting section 29C, these air blows cancel each other. Thus, desirably, air is blown out first from the air injecting section 27A and then from the air injecting section 29C.

The air injecting section 27B is the same as the air injecting section 27A of the semiconductor manufacturing apparatus 2A, shown in FIGS. 11 and 12 (Embodiment 4), but is provided on the automated carrying vehicle 1D. That is, the air injecting section 27B is composed of a plurality of air nozzles provided above the transfer port 11 to form an air curtain flowing downward along that side of the automated carrying vehicle 1D in which the transfer port 11 is formed. Thus, a down flow can be formed over the outer surface of the transfer port 11 to remove foreign matter or the like attached to the transfer port 11.

The air injecting section 19C is provided around the periphery of the transfer port 11. It is composed of a plurality of air nozzles from which cleaned air is blown out, to form an air curtain around the periphery of the transfer port 11. The air nozzles 18C are arranged outside the transfer port 11 and adjacent to its periphery so as to surround it. Air from the air nozzles is blown out substantially in the normal direction of the front surface of the housing of the automated carrying vehicle 1D to form a cylindrical air curtain surrounding the transfer port 11.

As shown in FIG. 15, the air nozzles 18C may be arranged only above and to the right and the left of the transfer port 11 and may not be arranged below it (at least in a part of the area below the transfer port 11, e.g. a central part of this area). That is, the air nozzles 18C may be arranged around the periphery of the transfer port 11 except for the area below it.

In this case, the air nozzles 18C arranged above the transfer port 11 at different positions serve to form an air curtain above the transfer port 11 which spreads in the horizontal direction. Further, the air nozzles 18C arranged to the right and left of the transfer port 11 at different vertical directions serve to form an air curtain at both sides of the transfer port 11 which spreads in the vertical direction. In this manner, a cylindrical air curtain is formed which surrounds the transfer port 11.

The air injecting section 27A is the same as that shown in FIGS. 11 and 12 (Embodiment 4). The air injecting section 29C is provided around the periphery of and adjacent to the transfer port 22. It is composed of a plurality of air nozzles from which cleaned air is blown out to form an air curtain around the periphery of the transfer port 22. In FIG. 15, the air nozzles 28C are arranged outside the transfer port 22 so as to surround it. Air from the air nozzles 28C is blown out substantially in the normal direction of the front surface of the housing of the semiconductor manufacturing apparatus 2C to form a cylindrical air curtain surrounding the transfer port 22.

Figure 16:
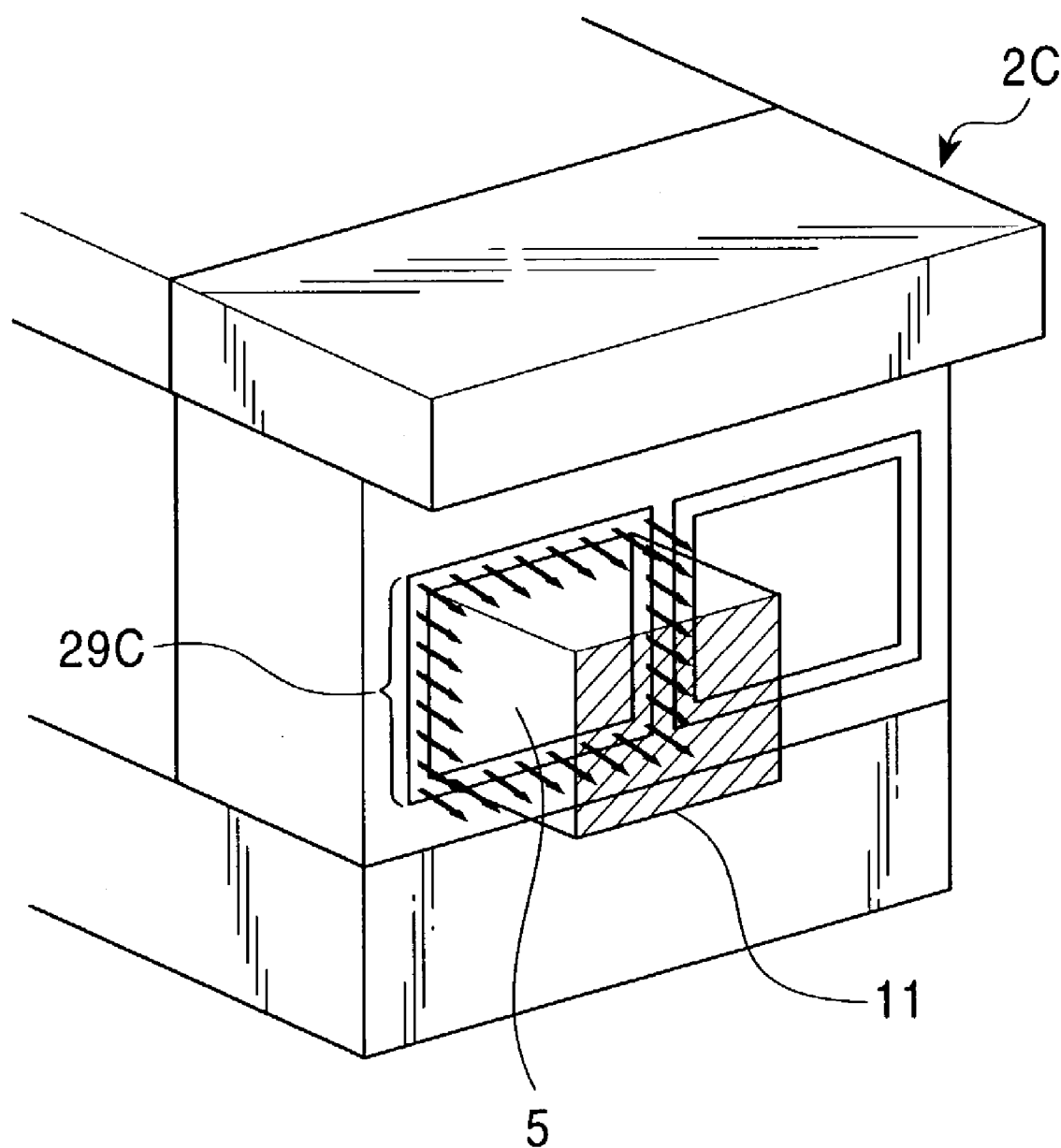
FIG. 16 is a view showing how a cassette is transferred between the semiconductor manufacturing apparatus 2C and carrying vehicle 1 in FIG. 15.
Figure 17:
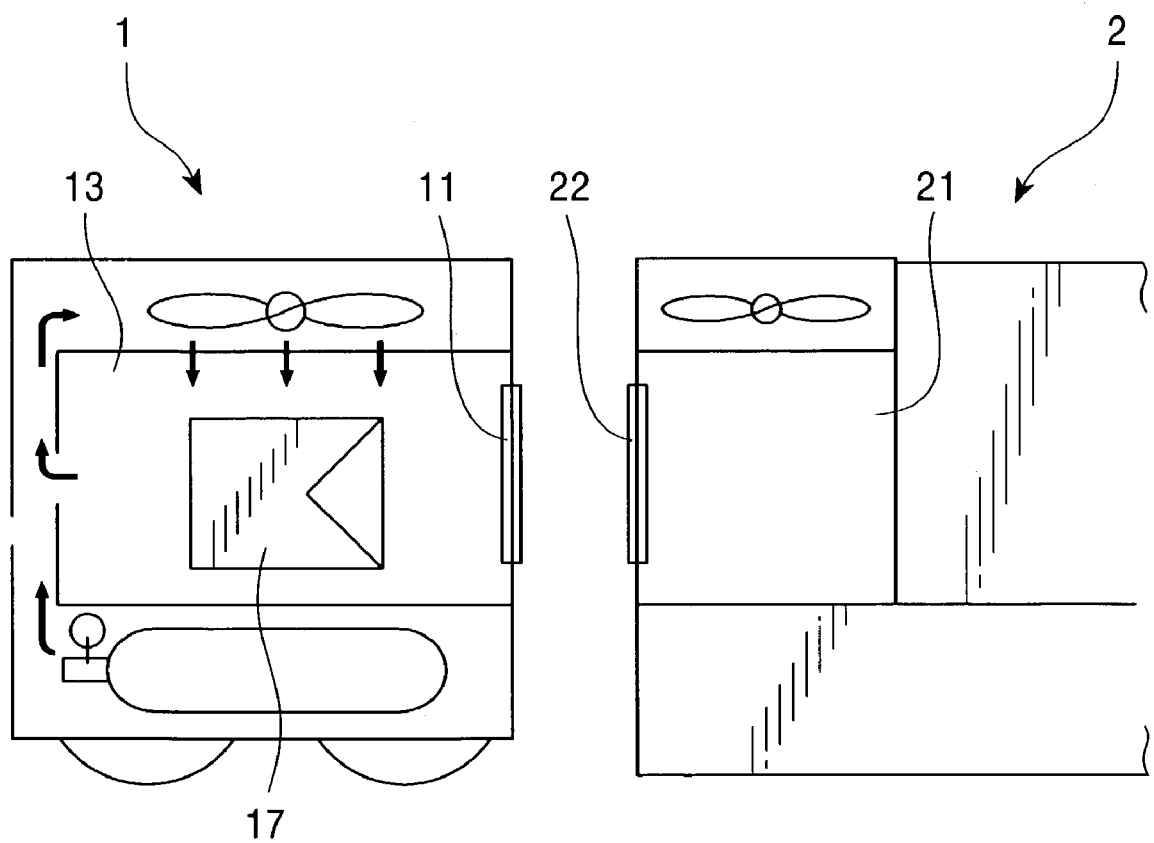
FIG. 17 is a view schematically showing the configuration of the conventional automated carrying system disclosed in the Unexamined Japanese Patent Application Publication (Tokkai-Hei) No. 11-238777.

FIG. 16 shows how a cassette is transferred between the semiconductor manufacturing apparatus 2C and the automated carrying vehicle 1D. In this figure, 5 is a clean tunnel. At a transfer point, if a cassette is transferred between the automated carrying vehicle 1D and the semiconductor manufacturing apparatus 2C, the shutters of the opposite transfer ports 11, 22 are opened.

At this time, the clean tunnel 5 is formed in the space sandwiched by the transfer port 11 and the transfer port 22 owing to the positive pressure in the loader/unloader 21 and automated carrying vehicle 1. Further, at least one of the air injecting section 29C and the air injecting section 19C of the automated carrying vehicle 1D forms the clean tunnel 5. Accordingly, the clearance between the automated carrying vehicle 1D and the semiconductor manufacturing apparatus 2C is kept clean to hinder less clean air present around the transfer ports from flowing into the clean tunnel. The cassette 17 is transferred through the clean tunnel 5 thus formed from the automated carrying vehicle 1A to the semiconductor manufacturing apparatus 2 or from the semiconductor manufacturing apparatus 2 to the automated carrying vehicle 1A.

The air blow from at least one of the automated carrying vehicle and the manufacturing apparatus is started before the automated carrying vehicle 1D reaches the semiconductor manufacturing apparatus 2C. Then, the shutters are opened and the automated carrying vehicle is stopped. Subsequently, a transfer operation is completed and the automated carrying vehicle starts moving again. The air blow continues until the shutters are closed.

Thus, the automated carrying vehicle 1D cleans the transfer port 22 in the semiconductor manufacturing apparatus 2C and is then stopped at a predetermined position. Then, an air curtain is formed between the transfer port 11 and the transfer port 22 to enable dust from being attached to the cassette during a transfer. Further, air blow is continued while the shutters are being closed. Consequently, even if dust is stirred up when the automated carrying vehicle 1D starts to move, less clean air present around the transfer ports is hindered from flowing from the transfer ports 11, 22 into the clean tunnel.

In the above embodiments, examples of automated carrying systems for semiconductor device production lines have been described. However, the application of the present invention is not limited to this aspect. The present invention is applicable to various carrying systems that must maintain manufactured articles in a cleaned atmosphere. The present invention is also applicable to carrying systems that carry various carried articles other than manufactured articles between two or more accommodating apparatuses that accommodate these articles.

Further, the semiconductor devices in the above embodiments include not only semiconductor devices used to input and output electric signals but also display devices such as liquid crystal displays, PDPs, and organic EL displays. Of course, the present invention is applicable to carrying systems used in production lines for these devices.

Furthermore, in the description of the examples in the above embodiments, the carrying system is used in a clean room. However, the automated carrying system according to the present invention is not necessarily limited to the use in a clean room. The present invention is applicable to various automated carrying systems in which the manufactured article housing sections in the automated carrying vehicle 1, semiconductor manufacturing apparatus 2, and stocker 3 are cleaner than the atmosphere in which the carrying system is used.

Moreover, the above embodiments show examples of automated carrying systems. However, the scope of the present invention is not limited to automated carrying systems. The present invention is also applicable to manual lines in which carriages are manually carried.

Further, the above embodiments may be properly combined together.

Further a description will be given of another embodiment of a carrying system.

Figure 18:
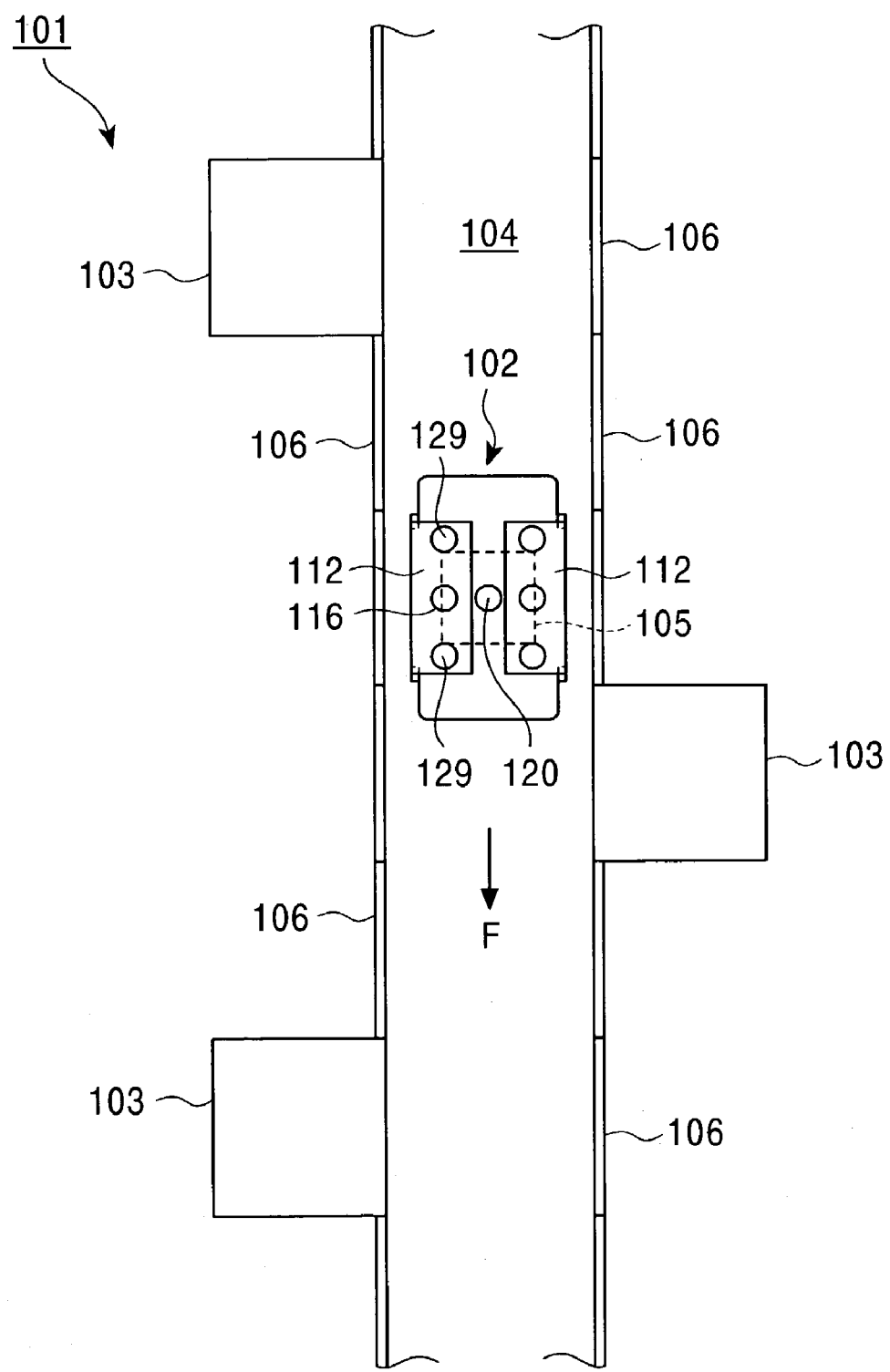
FIG. 18 is a schematic view showing a configuration of an automated guided carrying system 101.
Figure 19:
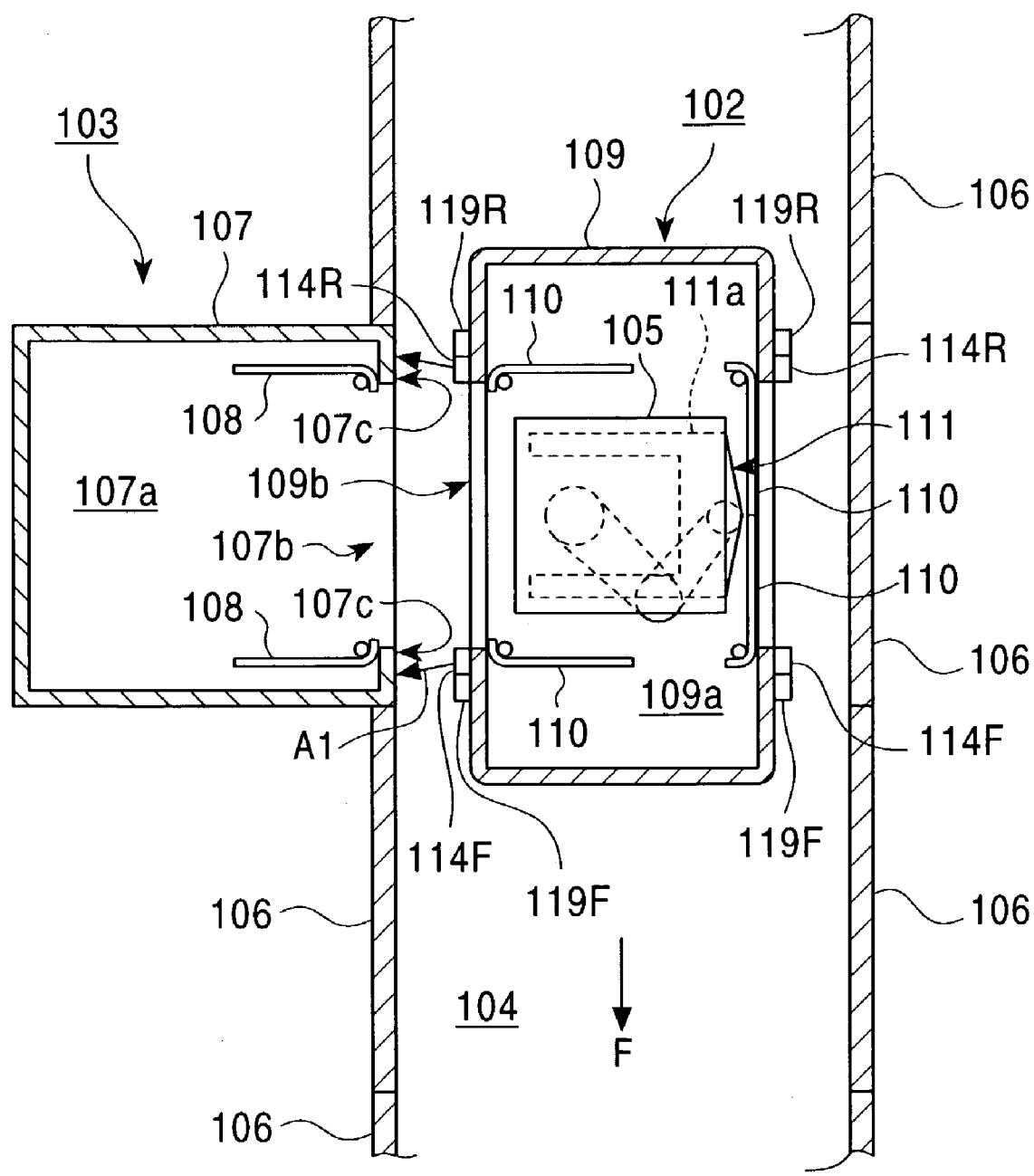
FIG. 19 is a sectional plan view showing a carrying vehicle 102 standing opposite a station 103.
Figure 20:
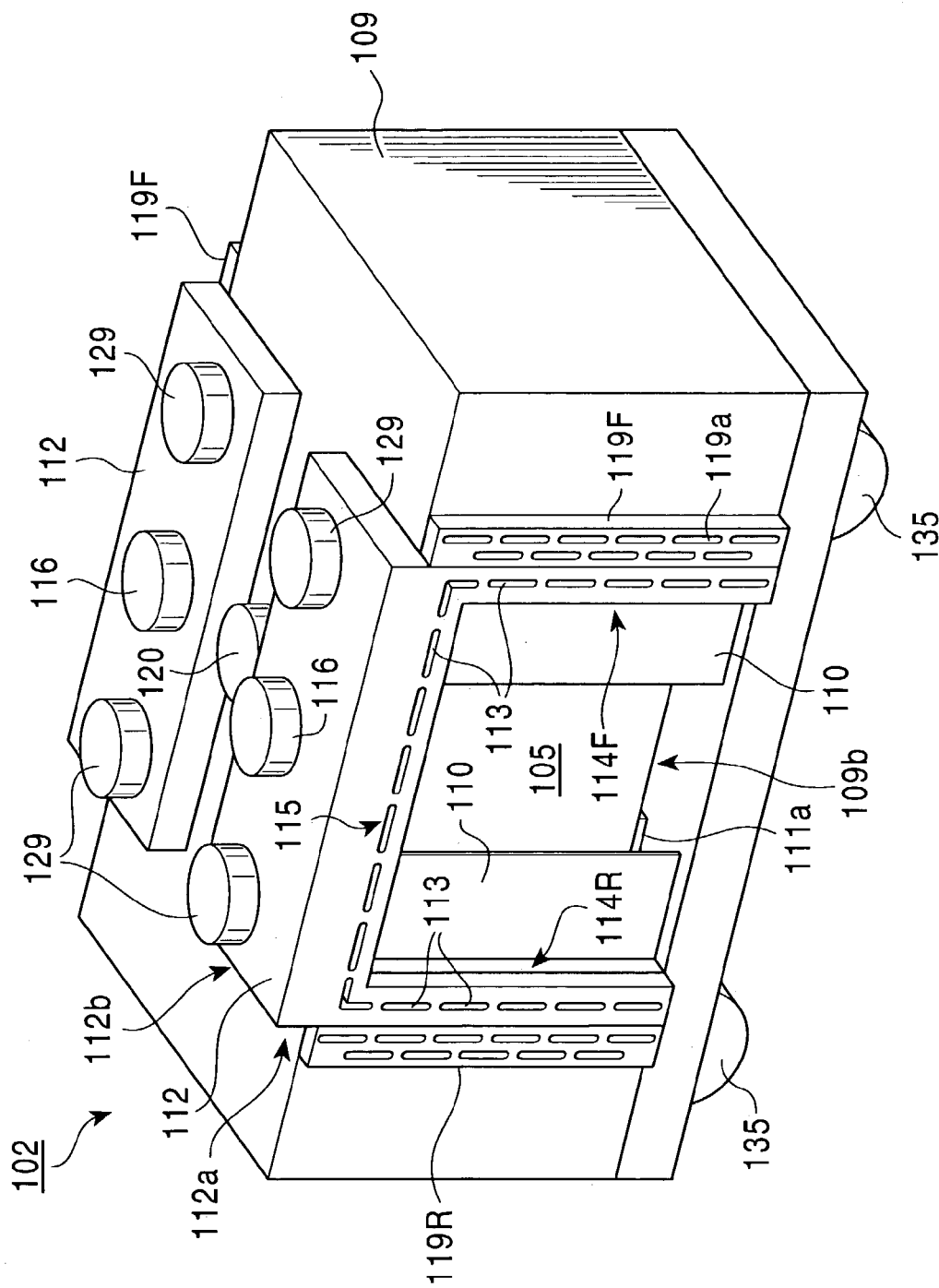
FIG. 20 is a perspective view showing the carrying vehicle 102.
Figure 21:
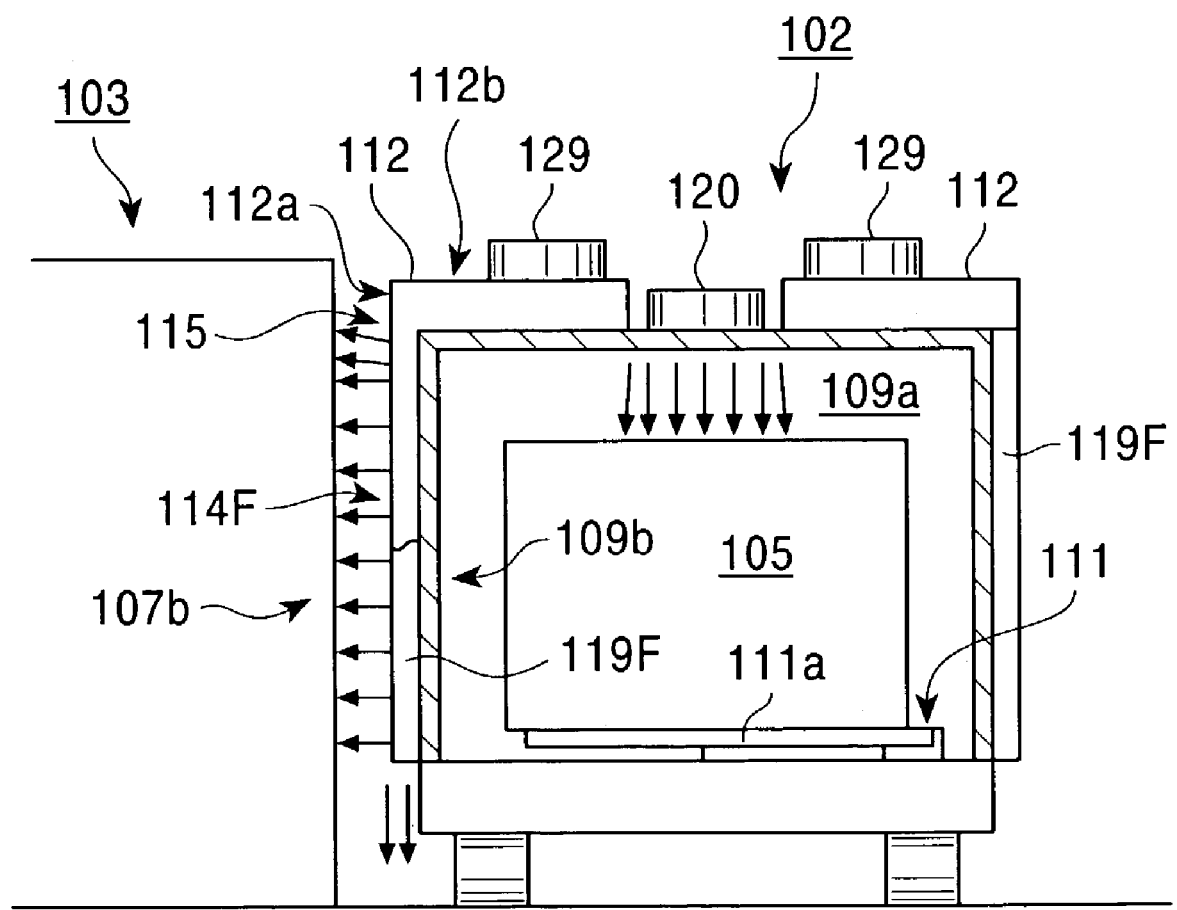
FIG. 21 is a partly sectional front view showing the carrying vehicle 102 and the station 103.
Figure 22:
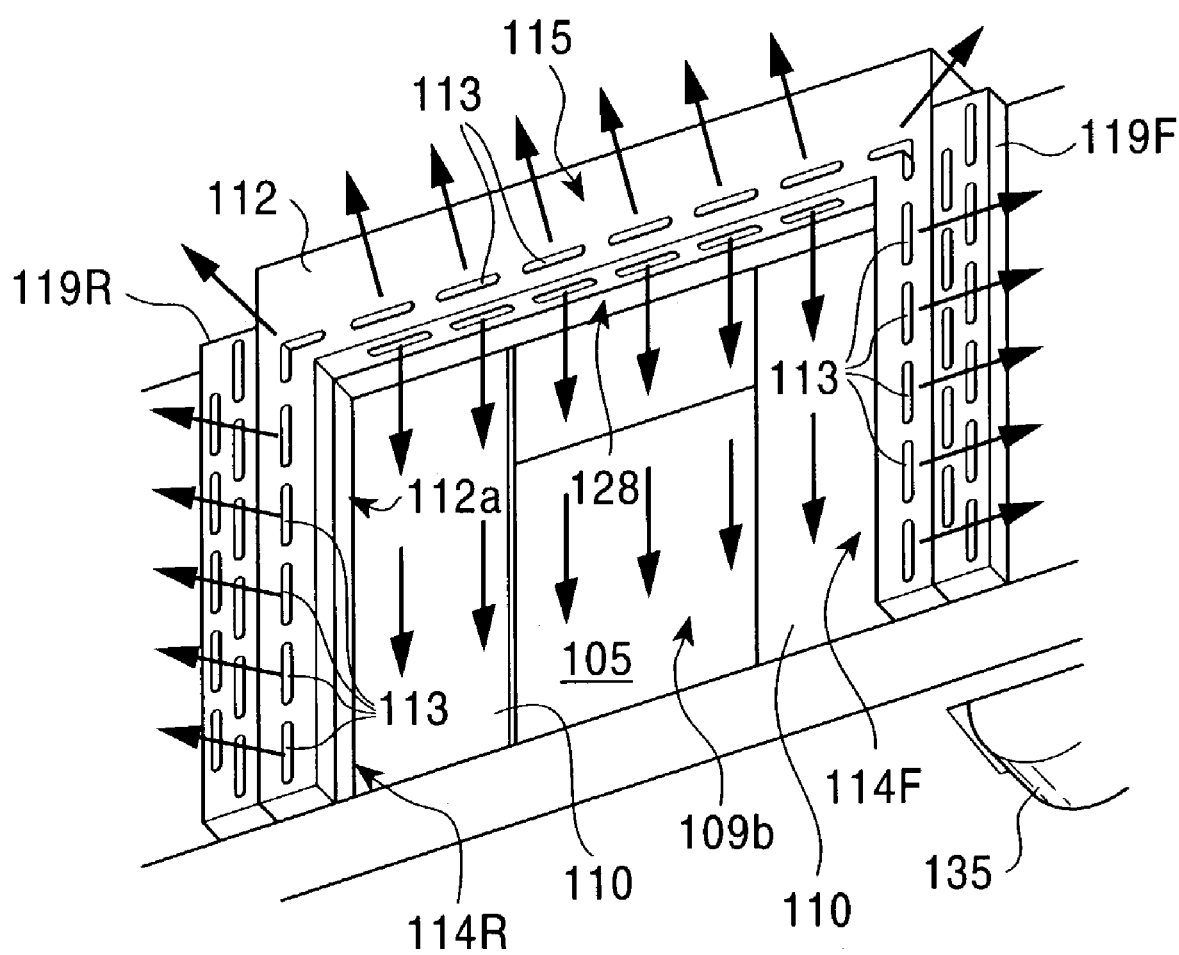
FIG. 22 is a perspective view of a duct 112.
Figure 23:
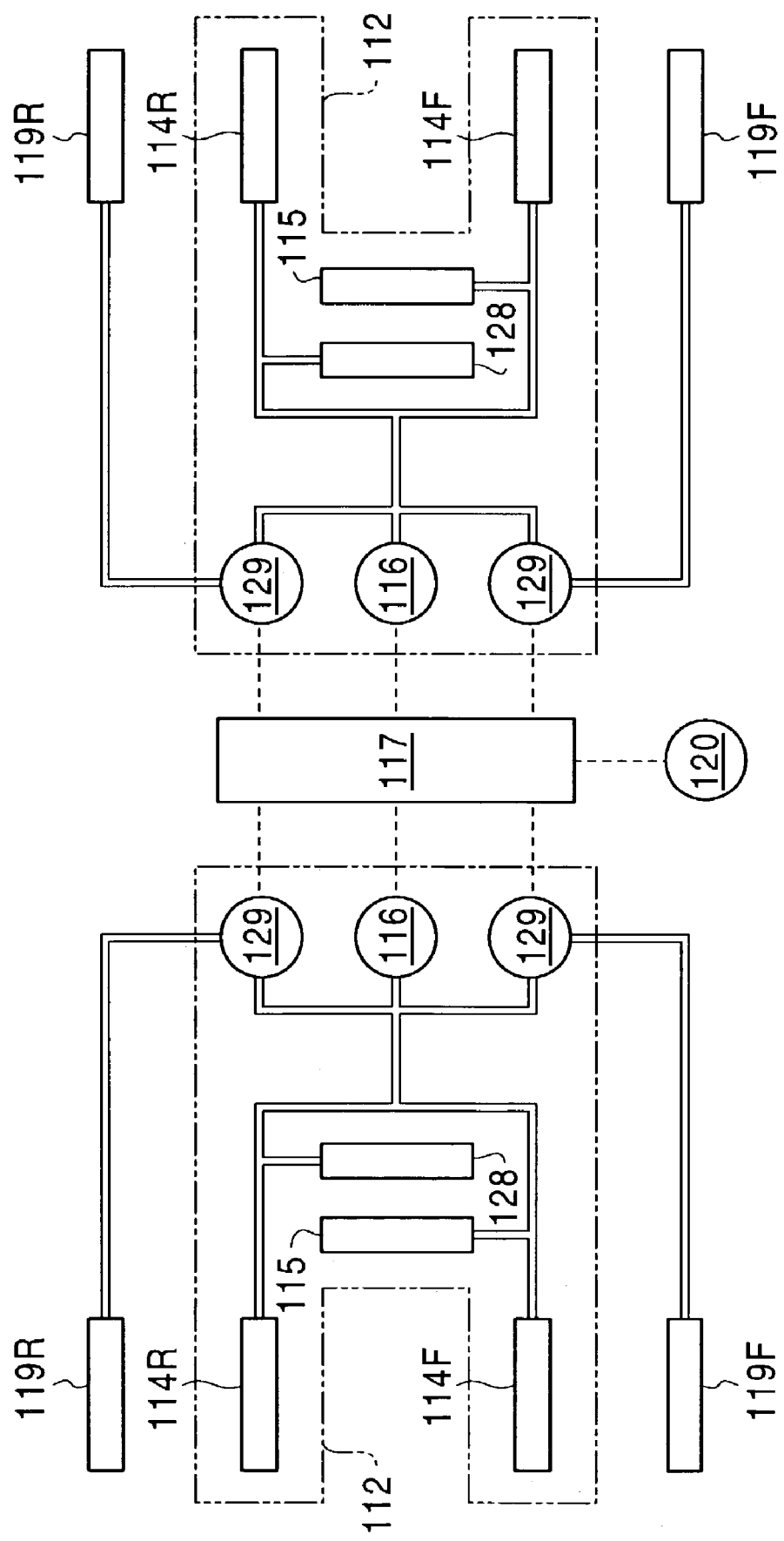
FIG. 23 is a block diagram showing a control arrangement for each air injecting means.
Figure 24:
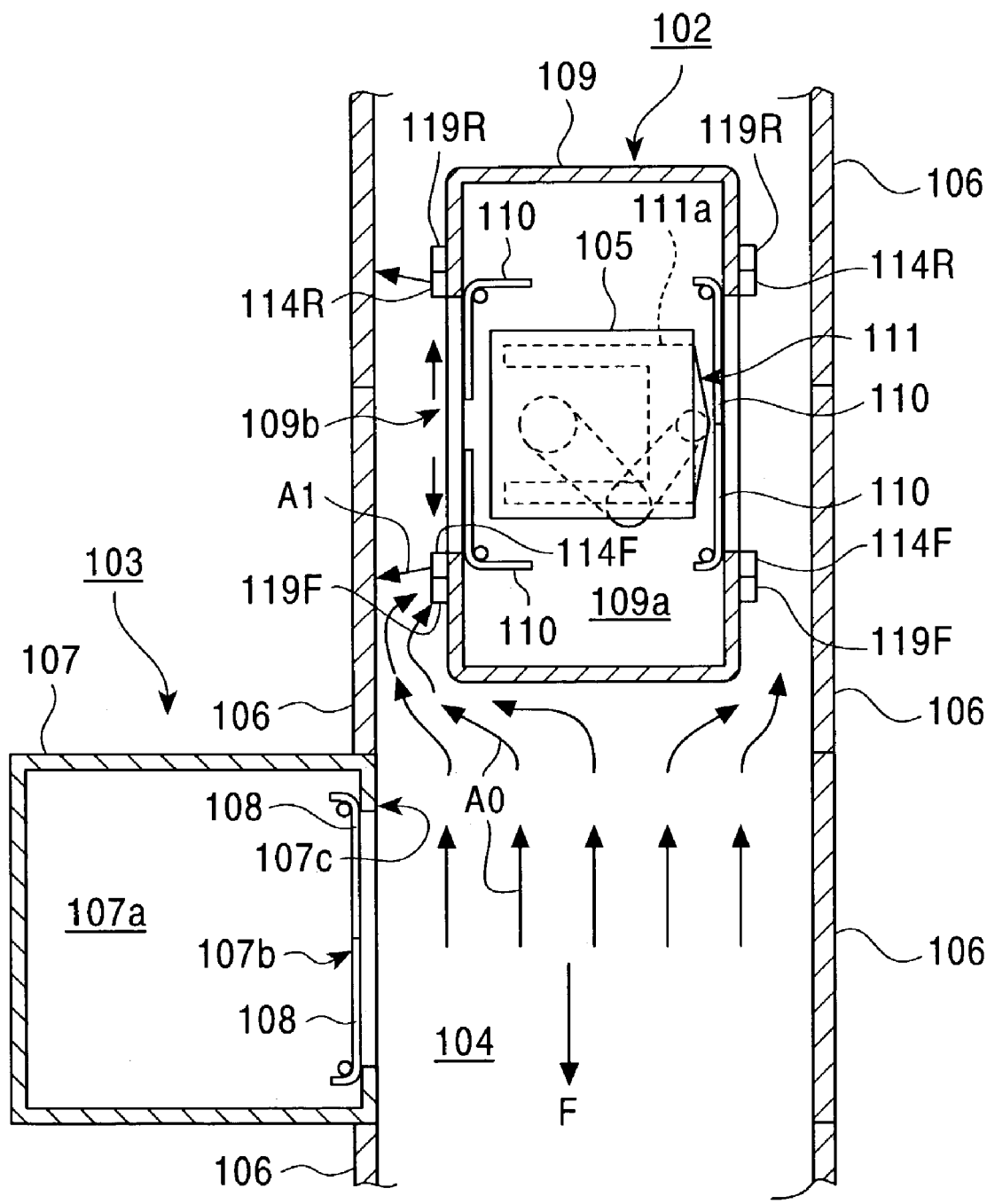
FIG. 24 is a plan view showing air flows occurring during transfer preparations.
Figure 25:
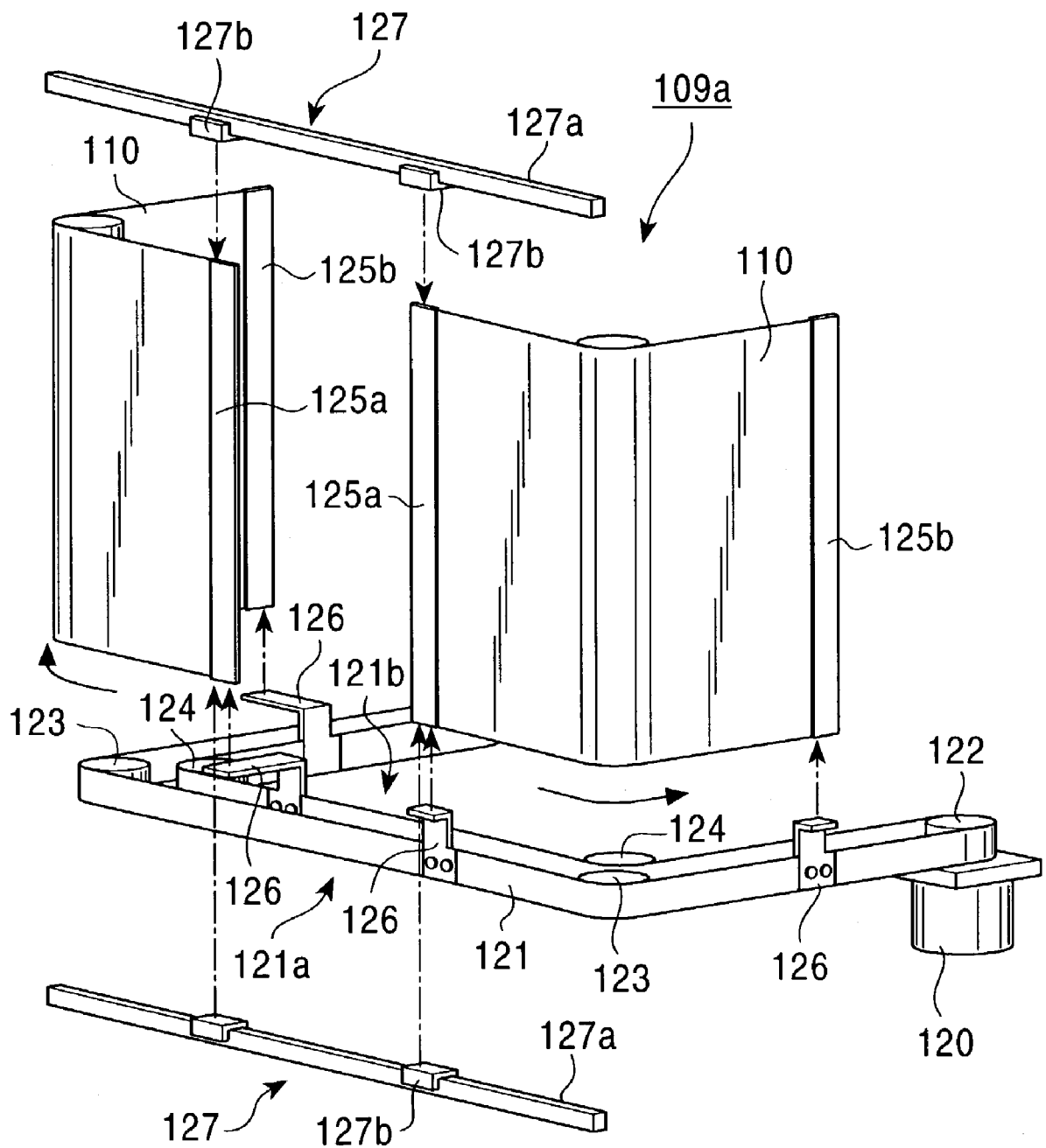
FIG. 25 is a perspective view showing an opening and closing mechanism for shutters 110, 110.
Figure 28:
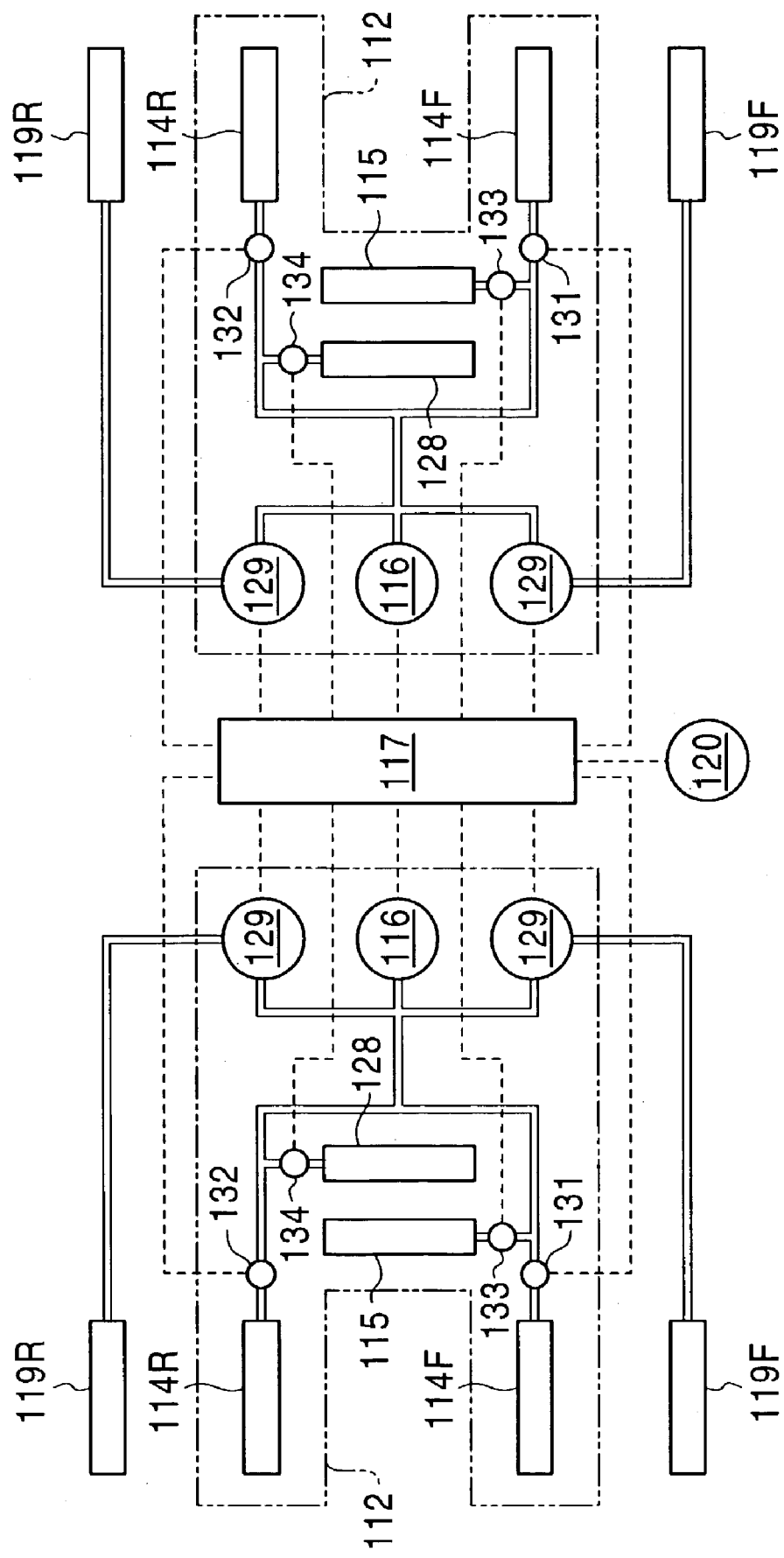
FIG. 28 is a block diagram showing a control arrangement for each air injecting means.
Figure 29:
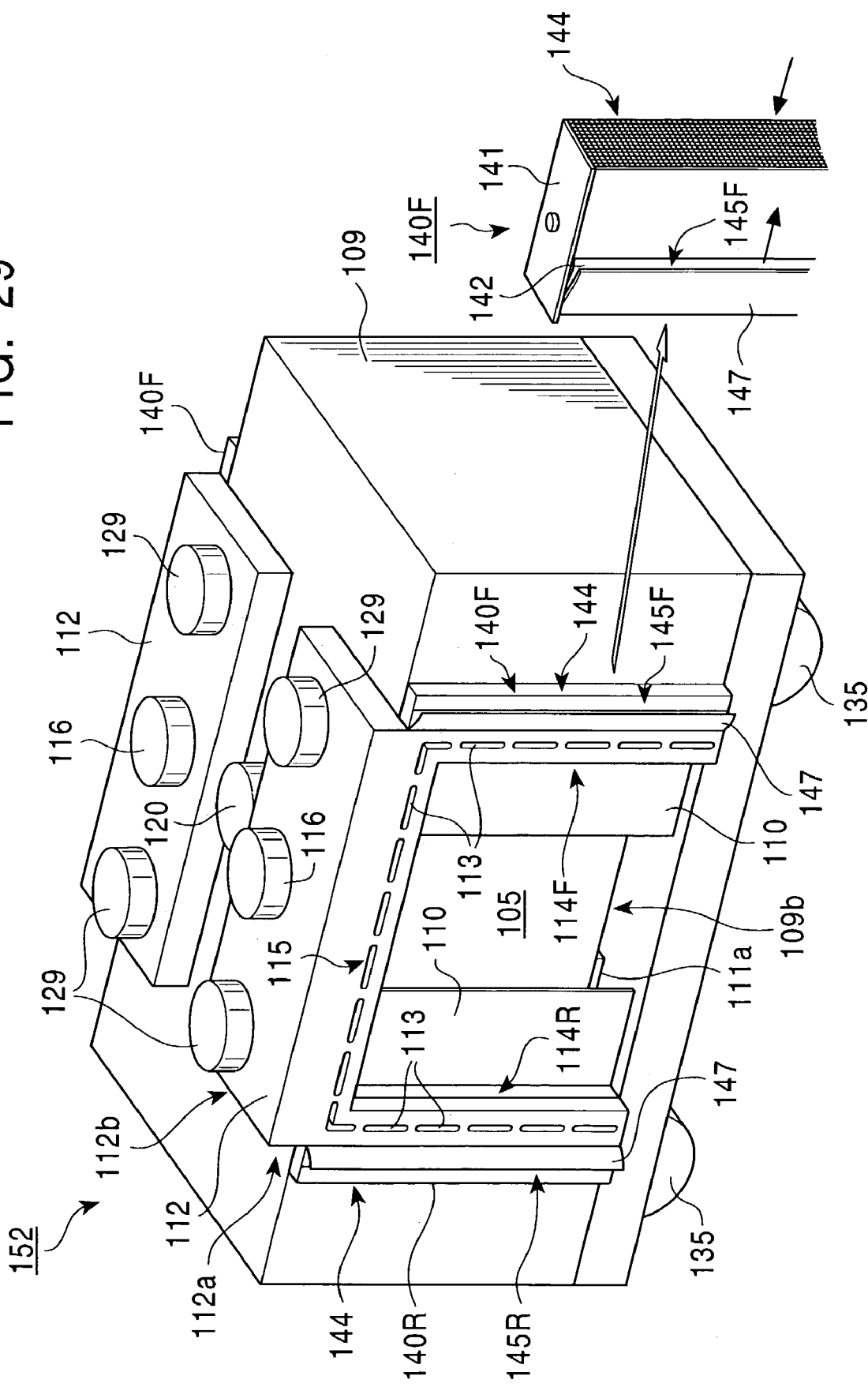
FIG. 29 is a perspective view showing a carrying vehicle 52 according to embodiment 9.
Figure 30:
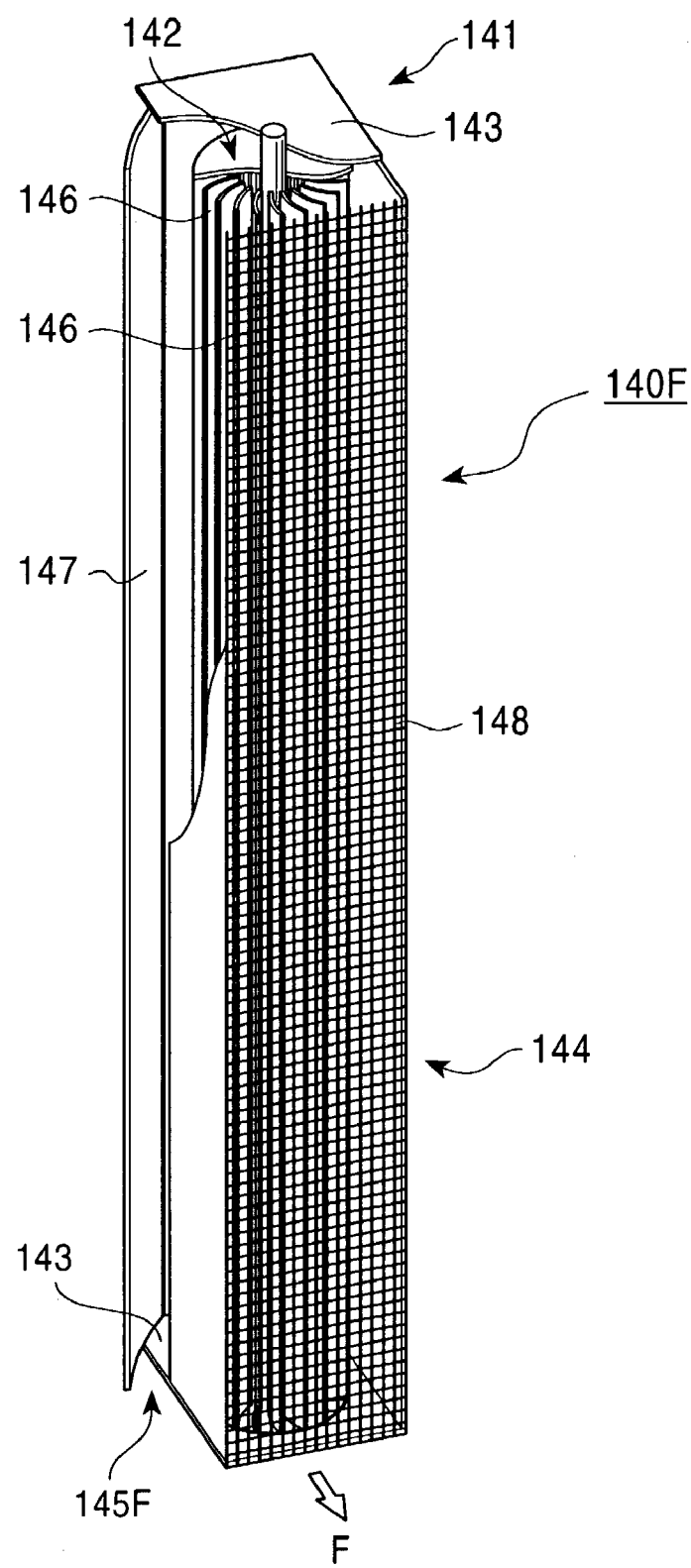
FIG. 30 is a perspective view showing an auxiliary air injecting means.

FIG. 18 is a schematic view showing a configuration of an automated guided carrying system 101. FIG. 19 is a sectional plan view showing an automated carrying vehicle 102 standing opposite a station 103. FIG. 20 is a perspective view showing the automated carrying vehicle 102. FIG. 21 is a partly sectional front view of the automated carrying vehicle 102 and the station 103. FIG. 22 is a perspective view of a duct 112. FIG. 23 is a block diagram showing a control arrangement for each air injecting means. FIG. 24 is a plan view showing the flow of air during transfer preparations. FIG. 25 is a perspective view showing an opening and closing mechanism of a shutter 110. FIG. 26 is a schematic plan view of the automated carrying vehicle 102 and the station 103, showing a process executed after the shutters 110, 110 have been opened and before a transfer operation is started. FIG. 27 is a schematic plan view of the automated carrying vehicle 102 and the station 103, showing a process executed after the transfer operation has been started and before the shutters 110, 110 are closed. FIG. 28 is a block diagram showing a control arrangement for each air injecting means according to Embodiment 8. FIG. 29 is a perspective view showing an automated carrying vehicle 52 according to Embodiment 9. FIG. 30 is a perspective view showing an auxiliary air injecting means.

First, the configuration of the automated guided carrying system 101 will be described.

As shown in FIGS. 18 to 21, the automated guided carrying system 101 is provided with the automated carrying vehicle 102 according to Embodiment 7 and the station 103. A main body frame of the automated carrying vehicle 102 is provided with running wheels 135, 135, . . . .

The station 103 is provided in, for example, a processing apparatus for manufacturing glass or resin substrates for FPDs (Flat Panel Displays). It is provided with a processing apparatus main body (not shown in the drawings) in its rear. The station 103 is not limited to a processing apparatus but may be a stocker in which an article 105 is temporarily housed or a station for an inspecting apparatus.

The article 105 carried by the automated carrying vehicle 102 is placed on the station 103. A plurality of stations 103 are arranged at the respective sides of a running path 104 for the automated carrying vehicle 102 along the running path 104. The stations 103 may be arranged at only one side of the running path 104. Further, the running path 104 is straight in the area shown in FIG. 18. However, the running path 104 may be formed like a loop by connecting smaller curved paths together.

The article 105 is a cassette that houses plate-like objects such as glass substrates for liquid crystal or plasma displays, or resin substrates for organic EL (Electro Luminescence) displays. The article 105 must be stored in a clean environment in order to maintain its quality.

The directions in the description below are defined using as a reference the direction in which the automated carrying vehicle 102 advances along the running path 104. Specifically, the advancing direction of the automated carrying vehicle 102 is defined as a fore-and-aft direction. The direction perpendicular to the advancing direction in a horizontal plane is defined as a lateral direction.

Further, the automated carrying vehicle 102 can run both forward and backward relative to the running path 104. However, for the convenience of description, the direction shown by arrow F in FIGS. 18 and 19 and other figures is defined as the front of the automated carrying vehicle 102 in its advancing direction.

As shown in FIG. 19, the station 103 is formed with an article storage 107a inside its main body frame 107. The main body frame 107 is formed with an article delivery port 107b through which an article is received from or delivered to the article storage 107. An opening-side front wall 107c is a wall surface of the main body frame 107 in which the article delivery port 107b is formed. Further, the main body frame 107 is provided with a pair of shutters 108, 108 used to open and close the article delivery port 107b.

On the other hand, an article storage 109a is formed inside a main body frame 109 of the automated carrying vehicle 102. Article delivery ports 109b, 109b are formed at the laterally opposite sides of the main body frame 109 to transfer the article 105. Further, a pair of shutters 110, 110 are provided at the laterally opposite sides of the automated carrying vehicle 102 to open and close the right and left article delivery ports 109b.

The openings of the article delivery ports 109b, 109b are formed to be of almost the same size and arranged at almost the same height. Further, the shutters 108, 108 and the shutters 110, 110 use the same mechanism.

Further, the automated carrying vehicle 102 is provided with a scalar arm type transfer apparatus as transfer means for the article 105. When the automated carrying vehicle 102 reaches the station 103 and the article delivery ports 107b, 109b are positioned opposite each other, the shutters 108, 108 and the shutters 110, 110 are opened to enable the article 105 to be transferred between the article delivery ports 107b, 109b.

The article delivery ports 107b, 109b are spaced from each other. If no special measures are taken, when the article 105 is transferred through the open shutters 108, 110, air present outside the automated carrying vehicle 102 and station 103 may flow into and contacts with the transferred article 105.

Thus, the automated carrying vehicle 102 is provided with first air injecting means around the periphery of the article delivery port 107b to inject air to the station 103 (the side of the running path 104) in order to prevent the article 105 from being contacted with the air present outside the automated carrying vehicle 102. The first air injecting means is activated to form an air curtain to allow an article transfer path joining the article delivery ports 107b, 109b together to serve as a clean tunnel. This prevents the contact of the article 105 with even less clean air such as external air containing dust.

A description will be given of a configuration of the first air injecting means. As shown in FIGS. 20 and 21, ducts 112, 112 projecting laterally and upward are provided on the right and left sides, respectively, of the automated carrying vehicle 102. Laterally projecting portions 112a of the ducts 112 are each formed like a reverse concave so as to surround the top, front, and rear of the article delivery port 109b.

As shown in FIGS. 20 and 22, a large number of air nozzles 113, 113, . . . are formed in the side end surfaces of the laterally projecting portion 112a so as to surround the article delivery port 109b.

The air nozzles 113, 113, . . . are classified into three air injecting sections depending on the area in which they are arranged. The air nozzles 113, 113, . . . located in the front and rear of the article delivery port 109b constitute air injecting sections 114F, 114R, respectively. The air nozzles 113, 113, . . . located above the article delivery port 109b constitute an air injecting section 115.

As shown in FIG. 20, an upward projecting portion 112b of each duct 112 is provided with a fan filter unit (hereinafter referred to as an "FFU") 116 and FFUs 129, 129. The FFUs 116, 129, 129 are means for supplying air under a positive pressure to the air nozzles 113, 113, . . . via the duct 112. Each of the FFUs 116, 129, 129 is also provided with an air filter to supply clean air to the duct 112. In this case, the FFU 116 sucks supplied air from above the automated carrying vehicle 102. The FFUs 129, 129 suck supplied air from suction ducts 119F, 119R (described later), respectively, formed on the respective sides of the automated carrying vehicle 102.

Specifically, the first air injecting means is formed like a gate along the periphery of the article delivery port 109b. It comprises the air injecting sections 114F, 114R, 115 disposed in the duct 112, the interior of which is in communication with the air injecting sections 114F, 114R, 115. Air supply sources for the first air injecting means are the FFUs 116, 129, 129, arranged at the top of the duct 112. All the air from the FFUs is collected in the duct 112 and then injected to the station 103 from the air nozzles 113 in the air injecting sections 114F, 114R, 115. The duct 112 may be partitioned into the injecting sections 114F, 114R, 115 so as to connect the FFUs 116, 129, 129 together.

As shown in FIG. 23, the automated carrying vehicle 102 is provided with control means 117 for controlling the first air injecting means. The control means 117 is composed of an electronic circuit. It controls apparatuses connected to the control means 117 so as to communicate signals with these apparatuses.

Further, the air injecting means and FFUs 116, 129, 129, constituting the air injecting means, are connected together via air pipes so as to be in communication with one another.

The control means 117 is connected to the FFUs 116, 129, 129 so as to communicate signals with them. The control means 117 can control driving of the FFUs 116, 129, 129 to adjust the amount of air injected by the air injecting sections.

As shown in FIG. 24, to shorten the time required for transfer work, the automated carrying vehicle 102 opens the shutters 110, 110 to prepare for a transfer before reaching the station 103. This shortens the time required for the entire transfer work compared to the case in which the shutters 110, 110 are opened after an arrival at the station 103.

On the other hand, air present in front of the automated carrying vehicle 102 acts on the automated carrying vehicle 102 as a positive pressure as the automated carrying vehicle 102 runs. When the automated carrying vehicle 102 runs with the shutters 110, 110 open, the flow A0 of the air present in front of the automated carrying vehicle 102 moves toward the front surface of the automated carrying vehicle 102. It also moves toward the sides of the automated carrying vehicle 102 to enter the article storage 109a.

The first air injecting means also function to prevent air present outside the automated carrying vehicle 102 from entering the article storage 109a while the automated carrying vehicle 102 is running with the shutters 110, 110 open.

The first air injecting means is driven to generate air flows to the station 103 (to the outside of the running path 104) in front of, behind, and above the article storage 109a, respectively. An air flow generated by the air injecting section 114F is defined as A1.

Furthermore, as shown in FIGS. 20 and 23, the automated carrying vehicle 102 is provided with air sucking means to eliminate the adverse effects of an air flow A0 moving toward the sides of the automated carrying vehicle 102.

The air sucking means is provided in front of the duct in the advancing direction, the duct being disposed so as to surround the article delivery port 109b. However, since the automated carrying vehicle 102 reciprocates, the air sucking means is arranged both in front of and behind the duct 112 in the advancing direction (ducts 119F, 119R).

The suction ducts 119F, 119R are each formed with a large number of air suction holes 119a in two staggered rows in the vertical direction to suck air. The suction ducts 119F, 119R are connected to suction sides of the FFUs 129, 129, respectively so that clean air is injected from the air injecting section of the first air injecting means. The air suction holes 119a may be a single slot that is elongate in the vertical direction.

As shown in FIG. 24, by providing the suction duct 119F of the suction section in front of the article delivery port 109b in the advancing direction, the air flow A0 moving toward the sides of the automated carrying vehicle 102 can be guided to the suction duct 119F, where the air flow A0 disappears.

In particular, by providing the suction duct 119F in front of the air injecting section 114F provided in front of the article delivery port 109b in the advancing direction, the air flow A0 can be weakened before crossing the air flow A1 from the air injecting section 114F. The air flow A1 can be used to reliably form an air curtain.

Further, as shown in FIG. 22, the first air injecting means, which injects air in front of the article delivery port 109b in the advancing direction, has its injected air flow inclined toward the front of the automated carrying vehicle 102 in its advancing direction. That is, the air nozzles 113 constituting the air injecting section 114F can direct injected air to the front of the automated carrying vehicle 102 in its advancing direction.

Thus, air injected by the air injecting section 114F also flows toward the front of the automated carrying vehicle 102 in its advancing direction to cancel the air flow A0 moving toward the rear of the automated carrying vehicle 102. The air flow A0 is therefore weakened.

Since the advancing direction of the automated carrying vehicle 102 can be reversed, the injecting air flow from the air nozzles 113 constituting the air injecting section 114R is inclined toward the rear of the automated carrying vehicle 102 in its advancing direction.

Furthermore, the first air injecting means, which injects air above the article delivery port 109b, is provided to inject air upward.

As shown in FIG. 22, the flows of air injected by the air injecting sections 114F, 114R, 115 of the first air injecting means are not parallel with the path created during a transfer to join the article delivery ports 107b, 109b together but spread outward from the path.

The first air injecting means not only forms an air curtain that protects the path but also generate a positive pressure that propagates to the outside of the path. This prevents air present outside the automated carrying vehicle 102 and the station 103 from entering the path.

As shown in FIGS. 19 and 24, the first air injecting means injects air to the station 103 or the panels 106.

In the automated guided carrying system 101, the panels 106 are arranged along the running path 104 between the stations 103, 103. The gap between the automated carrying vehicle 102 and the station 103 or between the automated carrying vehicle 102 and the panels 106 is minimized. The panels 106 are each composed of a rectangular planar member and are filled into the area between the stations 103, 103.

The station 103 is provided with the article delivery port 107b in the opening-side front wall 107c of the main body frame 107 so as to stand opposite the automated carrying vehicle 102 (to extend along the advancing direction of the automated carrying vehicle 102). The panels 106 are arranged in front of and behind the opening-side front wall 107c, respectively, so that the front or rear end of each panel 160 contacts with the rear or front end, respectively, of the opening-side front wall 107c. Thus, the running path 104 is surrounded by the stations 103 and the panels 106 without any gaps.

Specifically, the opening-side front wall 107c of the main body frame 107 or the panels 106 form a wall member standing opposite the automated carrying vehicle 102, in front of and behind the article delivery port 107b of the station 103.

Then, within the minimized gap, the first air injecting means injects air to the station 103 or the panels 106.

When the panels 106 (or the station 103) are arranged so as to maintain a small gap between the automated carrying vehicle 102 and the panels 106, first, the amount of air flow A0 moving toward the article delivery port 109a is limited. Second, it is possible to reduce the length of an air curtain formed using the air nozzles 113. The pressure of injected air is unlikely to decrease while it flows from the automated carrying vehicle 102 to the panels 106.

It is thus possible to reduce the amount of injected air required to prevent dust from entering the article storage 109a, compared to the absence of the panels 106.

Further, as the first air injecting means injects air to the wall member formed of the opening-side front wall 107c or the panels 106, the automated carrying vehicle 102 runs while removing dust attached to the wall member and the shutters 108, 108. Consequently, no dust is stirred up when the shutters 108, 108 are opened. This prevents dust from being attached to the article 105 transferred between the article delivery ports 107b, 109b.

The above effects are obtained provided that the wall member is formed at least in front of and behind the article delivery port 107b. In the present embodiment, the panels 106 are arranged all along the running path so as to be filled into the area between the stations 103, 103. However, the wall member may be formed of the opening-side front wall 107c and an appropriate number of panels 106 by arranging these panels 106 at least in front of and behind the station 103, while omitting the other panels 106.

During running, especially during a ready condition prior to a transfer when the previously described shutters 110, 110 are open, at least the first air injecting means (air injecting section 114F) injecting air in the front of the automated carrying vehicle 102 may be driven in order to eliminate the adverse effects of the air flow A0 from the front of the automated carrying vehicle 102 in its advancing direction. In this case, the most adverse effects are produced by the air flow A0 occurring in front of the automated carrying vehicle 102 as the automated carrying vehicle 102 runs. The front first air injecting means serves to correct the direction of the air flow A0 or weaken it. It also serves to remove dust from the shutters 108, 108 of the station 103.

Therefore, during running, the control means 117 activates at least the front first air injecting means.

The automated carrying vehicle 102 is provided with storage air injecting means for injecting clean air against the article 105 to maintain the interior of the article storage 109a at a positive pressure.

As shown in FIG. 20, the storage air injecting means is composed of a fan filter unit (hereinafter referred to as an "FFU") 118 provided at the top of the main body frame 109 and air nozzles that are open into the article storage 109a. The FFU 118 comprises an air filter to supply clean air.

Thus, the storage air injecting means is driven to always keep the interior of the article storage 109a clean.

Further, since the interior of the article storage 109a is maintained at the positive pressure, the entry of external air is prevented while the shutters 110, 110 are open, especially during the ready condition prior to a transfer.

Now, the shutters 110, 110 will be described.

The automated carrying vehicle 102 is provided with the pair of shutters 110, 110 in the right and left, respectively, of the main body frame 109 as doors that open and close the article storage 109a, as described previously. Thus, closing the shutters 110, 110 can prevent dust from entering the article storage 109a through the article delivery port 109a.

As the automated carrying vehicle 102 approaches the target station 103, it runs with the shutters 110, 110 open in order to prepare for a transfer. However, during a normal carriage running, the shutters 110, 110 need not be opened. Therefore, by closing the shutters 110, 110 as required, the interior of the article storage 109a can be kept clean without the need to drive the first air injecting means.

The opening and closing mechanism for the shutters 110, 110 will be described with reference to FIG. 25.

The shutters 110, 110 are members obtained by molding a synthetic resin in sheet form so that even when they are bent, no folds are created in them. The shutters 110, 110 open the article delivery port 109a from center to right or left as in the case with sliding doors. When the article delivery port 109a is open, the shutters 110, 110 are each bent at a right angle so as to be housed inside the automated carrying vehicle 102 in its lateral direction.

A driving motor 120 and a driving belt 121 moving along a U-shaped circulating path are provided as means for driving the shutters 110, 110. A driving pulley 122, driven pulleys 123, 123, . . . , and tension rollers 124, 124, . . . all driven by the driving motor 120 are arranged along the circulating path so that the driving belt 121 can be driven by the driving motor 120.

The shutter 110 has guide portions 125a, 125b fixedly provided at its opposite ends in its moving direction. The guide portions 125a, 125b are connected together via the driving belt 121 and connection fixtures 126, 126. The driving belt 121 moves along the circulating path, so that the moving direction of the driving belt 121 in an outside portion 121a with respect to the automated carrying vehicle 102 is opposite to the moving direction of the driving belt 121 in an inside portion 121b. One of the shutters 110 is fixed to the outside portion 121a of the driving belt 121, while the other shutter 110 is fixed to the inside portion 121b of the driving belt 121. Then, both shutters 110, 110 can be simultaneously opened or closed by driving the same driving belt 121.

Further, the guide portions 125a, 125a of the shutters 110, 110 are guided forward or backward by guides 127, 127, respectively, provided at the top and bottom, respectively, of the article delivery port 109a. The guide 127 is composed of a guide rail 127a and guide members 127b that slide along the guide rail 127a. The shutters 110 are each guided by fixedly disposing the guide portion 125a of the shutter 110 in the upper and lower guide members 127b, 127b.

With this arrangement, the pair of shutters 110, 110 moves along the article delivery port 109b so that the shutters 110, 110 approach or separate from each other on the same straight line. The corresponding edges of the shutters 110, 110 can be tightly contacted with each other.

With these arrangements, although the shutters 110, 110 operate like sliding doors, they are bent when housed. This serves to save spaces.

Further, both shutters 110, 110 are simultaneously opened. Accordingly, they can be opened and closed at a high speed compared to the case in which a single shutter is opened and closed. Furthermore, since both shutters 110, 110 are simultaneously opened, the automated carrying vehicle 102 is symmetric in the fore-and-aft direction. Consequently, whether the automated carrying vehicle 102 approaches the station 103 from its front or rear, the shutters 110, 110 can be opened using the same timing. In place of the previously described belt type, the opening and closing mechanism for the shutters 110, 110 may be of a winding type in which the shutters are wound around driving shafts.

With reference to FIGS. 20 and 22, a description will be given of second air injecting means for injecting a down flow of air from the upper edge of the article delivery port 109b.

Air nozzles are provided at the inside upper end of the laterally projecting portion 112a of the duct 112, i.e. the upper edge of the article delivery port 109b. The group of air nozzles constitute an air injecting section 128.

The second air injecting means is composed of the air injecting section 128, located at the upper edge of the article delivery port 109b, and the FFUs 116, 129, 129, which can supply clean air via the duct 112. As shown in FIG. 23, both air injecting means use the same FFUs 116, 129, 129 as a positive pressure source.

By activating the second air injecting means, clean air can be injected against the outer surfaces of the shutters 110, 110 to remove dust attached to the outer surfaces. Accordingly, by driving the second air injecting means before opening the shutters 110, 110, dust attached to the outer surfaces of the shutters 110, 110 can be prevented from entering the article delivery port 109b. Further, by driving the second air injecting means before opening the shutters 110, 110, an air curtain can be formed which closes the article delivery port 109b. This makes it possible to prevent dust from entering the article delivery port 109b even when the article delivery port 109b is open.

Now, with reference to FIGS. 26 and 27, description will be given of an example of a process of transferring a cassette between the automated carrying vehicle 102 and the station 103.

In FIGS. 26 and 27, the automated carrying vehicle 102 in which the article 105 is accommodated runs to the target station 103. Once the automated carrying vehicle 102 arrives at the target station 103, it transfers the article 105 to the station 103. The automated carrying vehicle 102 subsequently runs away from the station 103.

The term "transfer work" as used herein refers to a combination of a "transfer operation", a pre-transfer preliminary operation", and a "post-transfer preliminary operation".

The term "transfer operation" refers to an operation performed by a transfer apparatus 111 to transfer the article 105 after the article delivery port 107b and the article delivery port 109b have stood opposite each other.

Further, the term "pre-transfer preliminary operation" refers to operations performed in association with the opening and closing the shutters 110, 110 and the driving of the air injecting means before the article delivery port 107b and the article delivery port 109b stand opposite each other. Likewise, the term "post-transfer preliminary operation" refers to various operations performed after the "transfer operation" has been completed. The previously described "ready condition prior to a transfer" specifically refers to the condition in which the "pre-transfer preliminary operation" is performed.

Figure 26A:
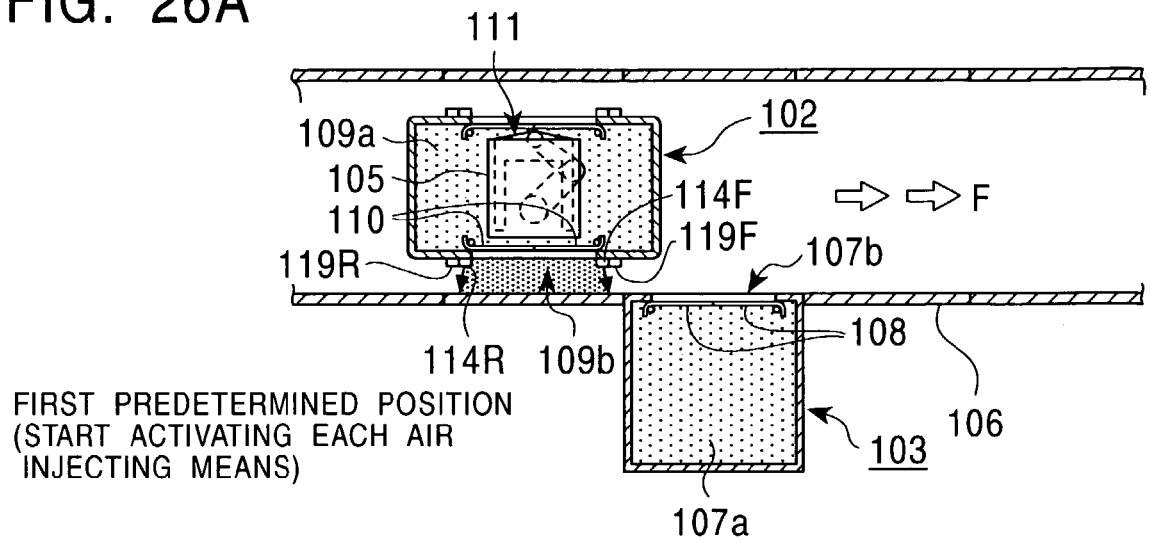
FIG. 26 is a schematic plan view of the carrying vehicle 102 and the station 103, showing a process starting with the opening of the shutters 110, 100 and ending with the start of a transfer operation.

As shown in FIG. 26A, when the automated carrying vehicle 102 arrives at a first predetermined position in front of the target station 103, a "pre-transfer preliminary operation" is started. When the "pre-transfer preliminary operation" is started, "transfer work" is started.

Specifically, the automated carrying vehicle 102 first starts to drive the air injecting means and the sucking means. The suction duct 119F as sucking means is used to suck most of the air flow A0 moving to the article delivery port 109b of the article storage 109a. Then, the first air injecting means produces a reverse U-shaped air curtain flowing to the panels 106, i.e. an air wall. This prevents the air flow A0 weakened by the sucking means from entering the article delivery port 109b and removes dust attached to the opening-side front wall 107c. The storage air injecting means maintains the interior of the article storage 109a at a positive pressure to prevent the entry of dust when the shutters 110, 110 are opened. The second air injecting means remove dust attached to the outer surfaces of the shutters 110, 110.

Figure 26B:
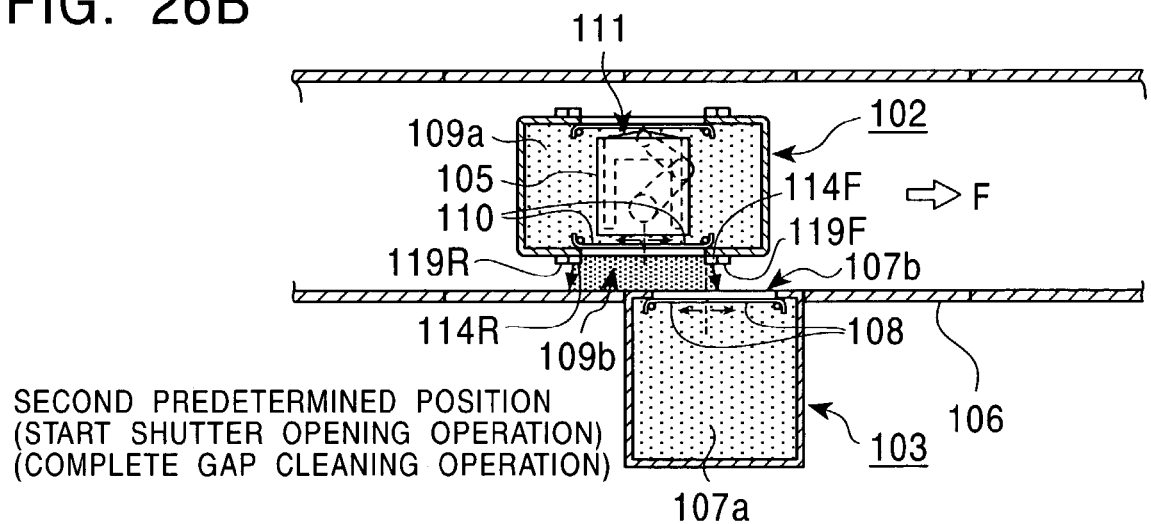

As shown in FIG. 26B, once the automated carrying vehicle 102 arrives at a second predetermined position in front of the station 103 to and from which a cassette is to be transferred, the shutters 110, 110 start to be opened.

In this case, an opening timing for the shutters 110, 110, provided in the automated carrying vehicle 102, is set in association with an opening timing for the shutters 108, 108, provided in the station 103, so that the shutters 110, 110 operate synchronously with the shutters 108, 108. That is, the shutters 110, 110 are completely opened at the same time when the shutters 108, 108 are completely opened.

The shutters 108, 108, provided in the station 103, operate like sliding doors that are opened from center to right or left, or are formed like sliding doors as in the case with the shutters 110, 110.

Figure 26C:
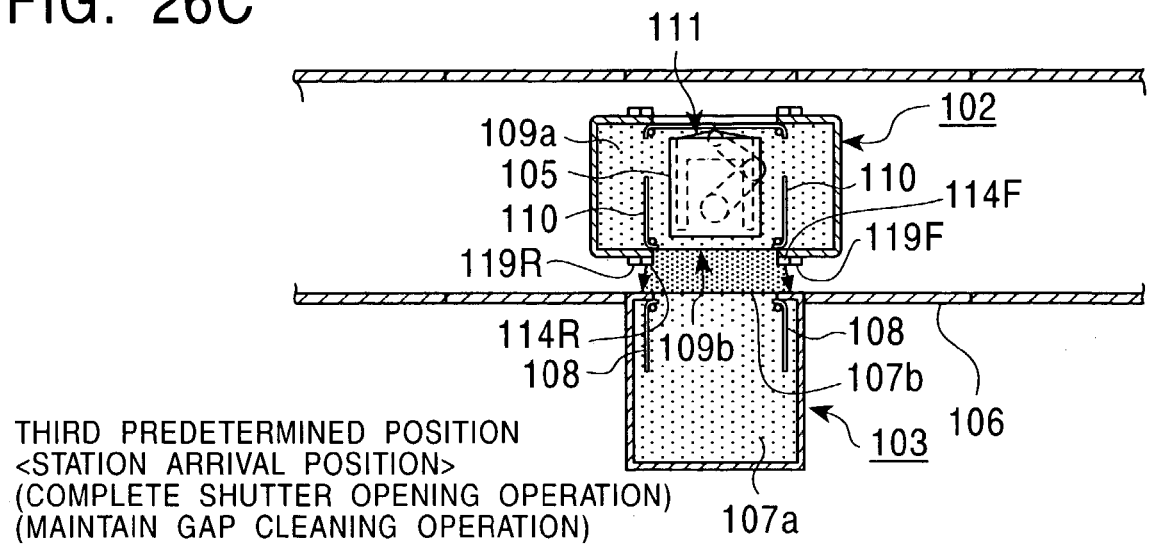

Further, as shown in FIG. 26C, once the shutters 108, 108 and the shutters 110, 110 are completely opened, both article delivery port 107b, 109b coincide with each other. Then, once the automated carrying vehicle 102 arrives at a point immediately adjacent to the station 103, the running speed of the automated carrying vehicle 102 is controlled so as to form a transfer path joining the article delivery port 107b, 109b together. Thus, once the automated carrying vehicle 102 arrives at the station 103, a "transfer operation" can be immediately started.

The article storage 109a has been protected by an air curtain formed by activating the air injecting means since a "post-transfer preliminary operation" was started. Accordingly, the entry of dust is prevented whether the shutters 110, 110 are open or closed.

On the other hand, in the present embodiment, the article storage 107a of the station 103 does not comprise any air injecting means for injecting air to the exterior. However, when the shutters 108, 108 are opened, the first air injecting means, provided in the automated carrying vehicle 102, operates to protect the interior of the article storage 107a.

That is, the shutters 108, 108 start to be opened after the position against which the air injecting section 114F of the first air injecting means injects air passes beyond the center of the article delivery port 107b in the fore-and-aft direction. Then, the automated carrying vehicle 102 runs while the first air injecting means is injecting air which surrounds the areas in front of, behind, and above the opening part of the shutters 108, 108. In this manner, during a "pre-transfer preliminary operation", the air in the article storages 107a, 109a is kept clean regardless of the degree to which the shutters 108, 108 and the shutters 110, 110 are opened or closed.

Further, air injected by the first air injecting means removes dust on the wall member composed of the opening-side front wall 107c and panels 106. Consequently, the dust on the wall member is prevented from entering the article storages 107a, 109a through the openings in the shutters 108, 108 and shutters 110, 110.

In the condition shown in FIG. 26C, the automated carrying vehicle 102 has arrived at the station 103 to or from which a cassette is to be transferred, i.e. the article delivery port 107b, 109b coincide with each other. At this time, the automated carrying vehicle 102 stops at a third predetermined position.

Upon arriving at the third predetermined position, the automated carrying vehicle 102 stops and starts a "transfer operation". At this point in time, the "pre-transfer preliminary operation" is ended, and the shutters 108, 108 and the shutters 110, 110 are completely open as described previously. Specifically, the "transfer operation" comprises driving the previously described scalar arm type transfer apparatus 111 to move the article 105 to the station 103.

During the "transfer operation", to prevent dust from being attached to the article 105, the air curtain must be maintained with the air injecting means continuously operated. However, the sucking means (suction duct 119F), used to effectively prevent an air flow from entering the article storage 109a during running, may be stopped in order to reduce power consumption. If the sucking means is stopped, it must be reactivated when the procedure proceeds to a "post-transfer preliminary operation" to start running.

As shown in FIG. 27D, a transfer hand (article supporting section) 111a of the transfer apparatus 111 passes through the article delivery ports 107b, 109b and is then inserted into the station 103. The transfer hand 111a then transfers the article 105 from the article storage 109a to the article storage 107a.

As shown in FIG. 27E, once the article 105 has been completely transferred to the station 103, the transfer hand 111a is housed in the article storage 109a to complete the "transfer operation".

Once the "transfer operation" is completed, the shutters 108, 108 and the shutters 110, 110 start to be closed. At the same time, the automated carrying vehicle 102 starts to run. At this point in time, the "transfer operation" is completed, while a "post-transfer preliminary operation" is started.

During the "transfer operation", the air injecting means keep operating with an air curtain maintained outside the path between the article delivery port 107a, 109b. This prevents external air containing dust from entering the path and the article storage 107a, 109a.

The automated carrying vehicle 102, which has completed the "transfer operation" starts to move. Then, once the automated carrying vehicle 102 arrives at a fourth predetermined position corresponding to a front part of the station 103 in the advancing direction, the closure of the shutters 108, 108 and the shutters 110, 110 is completed. Once the closure is completed, the driving of the air injecting means and sucking means is stopped. At this point in time, the "post-transfer preliminary operation" is ended.

The closure of the shutters 108, 108 is completed before the position against which the first air injecting section 114R of the first air injecting means passes beyond the center of the article delivery port 107b in the fore-and-aft direction. In this manner, the opening of the shutters 108, 108 is always covered with an air curtain from the first air injecting means. This prevents dust from entering the article storage 107a.

Once the "post-transfer preliminary operation" is ended, the automated carrying vehicle 102 runs to the next station 103 to or from which a cassette is to be transferred, with the air injecting means remaining stopped. When the "post-transfer preliminary operation" is ended, the "transfer work" is ended.

In this respect, to keep the article storage 109a cleaner, the storage air injecting means may always operate. Further, the shutters 108, 108 of the article storage 107a of the station 103 can be opened or closed using an arbitrary timing provided that their opening is within the air curtain.

As described above, the control means 117 controls the air injecting means to continuously operate from start to end of "transfer work" consisting of a "pre-transfer preliminary operation", a "transfer operation", and a "post-transfer operation". Thus, dust is prevented from entering the article storage 107a, 109a or adhering to the article 105.

Further, the shutters 110, 110, provided in the automated carrying vehicle 102, are configured to be automatically closed when an abnormal condition occurs in the automated carrying vehicle 102. The abnormal condition means a failure in the air injecting means or electric system provided in the automated carrying vehicle 102, the interruption of a power supply to the automated carrying vehicle 102 because of a failure occurring outside the automated carrying vehicle 102, or the like.

The driving motor 120 and control means for the shutters 110, 110 are connected to a small-sized standby power source, not shown in the drawings. If the abnormal condition occurs, the shutters 110, 110 are closed using power from the small-sized standby power source such as a constantly charged secondary batteries or a capacitor. Alternatively, rather than using a standby power source, the shutters 110, 110 may be provided with urging means (not shown in the drawings) to urge the shutters 110, 110 in the direction in which they are closed.

Thus, upon a failure in the air injecting means or electric system provided in the automated carrying vehicle 102, the interruption of a power supply to the automated carrying vehicle 102 because of a failure occurring outside the automated carrying vehicle 102, or the like, the article storage 109a can be sealed by the shutters 110, 110 as doors to keep its interior clean even through the operation of the air injecting means is stopped.

Further, on the basis of the arrangement in which the shutters 110, 110 are closed when the abnormal condition occurs, the automated carrying vehicle 102 may be configured so that the shutters 110, 110 normally remain open and are closed only when the abnormal condition occurs. In this case, to prevent dust from entering the article storage 109a, the air injecting means must be always operated. Thus, an air curtain is preferably maintained around the periphery of the article delivery port 109b. Accordingly, the first air injecting means is preferably always operated. To more reliably prevent dust from entering the article storage 109a, it is preferable to also always operate the storage air injecting means. Furthermore, to form a strong air curtain, the second air injecting means is preferably operated. During running, to prevent the air flow A1 from the front of the automated carrying vehicle 102 in its advancing direction, it is preferable to operate the air sucking means in addition to the first air injecting means.

Now, with reference to FIG. 28, a description will be given of a control arrangement for an automated carrying vehicle according to Embodiment 8 which individually controls the first air injecting means and the second air injecting means.

The automated carrying vehicle according to the Embodiment 8 is the same as the automated carrying vehicle 102 according to the first embodiment except for the control arrangement for the first air injecting means and the second air injecting means. Accordingly, in the following, the same members are denoted by the same reference numerals and their description is omitted. A description will be given only of the control arrangement differing from that of the embodiment 7.

As shown in FIG. 28, the air injecting sections and FFUs 116, 129, 129, constituting the first air injecting means, are connected together via air pipes so as to be in communication with one another. Solenoid valves are provided on the respective air pipes so as to adjust the amount of air supplied to each air injecting section. A valve 131 is provided on the air pipe from the FFUs 116, 129, 129 to the air injecting section 114F. A valve 132 is provided on the air pipe to the air injecting section 115.

The air injecting section 128 of the second air injecting means is in communication with the FFUs 116, 129, 129 via respective air pipes. Solenoid valves are also provided on these respective air pipe so as to adjust the amount of air supplied to each air injecting section. A valve 134 is provided on the air pipe from the FFUs 116, 129, 129 to the air injecting section 128.

The automated carrying vehicle 102 is provided with control means 137 for controlling the first air injecting means. The control means 137 is composed of an electronic circuit. It controls apparatuses connected to the control means 137 so as to communicate signals with these apparatuses.

The control means 137 connects to the FFUs 116, 129, 129 and the valves 131, 132, 133, 134 so as to communicate signals with these apparatus. The control means 137 controls the driving of the FFUs 116, 129, 129 and the amount of opening and closing of the valves 131, 132, 133, 134 to enable the adjustment of the amount of air injected by each air injecting means.

As described previously, to reduce the time required for transfer work, the automated carrying vehicle 102 opens the shutters 110, 110 to prepare for a transfer before arriving at the station 103 to or from which a cassette is to be transferred. When the automated carrying vehicle 102 runs with the shutter 110, 110 open, air present in front of the automated carrying vehicle 102 acts on it as a positive pressure and attempts to enter the article storage 109a. In the ready condition prior to a transfer, by increasing the amount of air injected by the air injecting section 114F above the amount of air injected by the other air injecting sections, it is possible to make the best of the driving performance of the FFUs 116, 129, 129.

The control of the driving of the FFUs 116, 129, 129 and of the amount of opening and closing of the valves 131, 132, 133, 134 includes the stoppage of the FFUs 116, 129, 129 and the full opening of the valves 131, 132, 133, 134.

In the present embodiment, the first air injecting means forms a gate-shaped air curtain over the station 103 the bottom of which is open. Clean air from the storage air injecting means and second air injecting means is thus utilized to prevent the entry of dust from below, which cannot be covered by the first air injecting means according to the above embodiments. However, the air nozzles 113 may be arranged so as to surround the periphery of the article delivery port 109b in rectangular form. By thus arranging the air nozzles 113 in rectangular form, dust is more reliably prevented from being attached to the article 105 during a transfer. Further, the air nozzles 113 in the first air injecting means are arranged so that air is injected in the direction in which it is spread. However, air may be injected straightly in a direction normal to the advancing direction. Air amount adjusting means (shown in FIGS. 29 and 30 described later) may be provided for each of the air injecting sections 114F, 114R, 115 of the first air injecting means and each of the air injecting sections 145F, 145R of the auxiliary air injecting means to uniformly inject air. Alternatively, the amount of air may be controlled so as to inject a larger amount of air from air nozzles located in corners or the like.

Further, in one embodiment, instead of the first air injecting means, the air sucking means is operated to prevent the air flow A1 occurring in front of the automated carrying vehicle 102 in its advancing direction as it runs. However, in place of this sucking means, auxiliary air injecting means may be provided which injects air toward the front of the automated carrying vehicle 102 in its advancing direction.

Specifically, the air injecting section arranged at the same position (in front of the air injecting section 114F (114R) of the first air injecting means) as that of the suction duct 119F (119R) injects air toward the front of the automated carrying vehicle 102 in its advancing direction. This auxiliary air injecting means thickens an air wall in front of the automated carrying vehicle 102 in its advancing direction to enable the air flow A1 to be prevented more reliably.

This auxiliary air injecting means has the ejecting section arranged in front of the air injecting section 114F (114R) of the first air injecting section. However, this air injecting section has only to be shaped so as to extend in the vertical direction and to inject air toward the front of the automated carrying vehicle 102 in its advancing direction. The air injecting section and the fan may be constructed integrally or separately. Further, it is contemplated that clean air may be supplied to the air injecting section as in the case with the first air injecting means. However, stronger air can be supplied using a fan unit having no filters. This is more preferable in terms of the prevention of the entry of the air flow A1, which is the primary object of the auxiliary air injecting means.

With reference to FIG. 29, a description will be given of an automated carrying vehicle 152 according to the embodiment 9 which comprises the auxiliary air injecting means.

The auxiliary air injecting means provided in the automated carrying vehicle 152 is composed of cross flow fans each including an air injecting section and a fan integrated together. The cross flow fan 140F (140R) is provided in front of and behind the air injecting section 114F (114R) respectively, of the first air injecting means in the running direction. The automated carrying vehicle 152 runs forward and backward and has the air injecting sections 114F, 114R provided in its front and rear, respectively.

As shown in FIG. 30, the cross flow fan 140F comprises a main body 141 and an impeller 142 that rotates in the horizontal direction. The main body 141 comprises a pair of supporting portions 143, 143 that support the impeller 142, a suction duct 144 that sucks air using the impeller 142, and an air injecting section 145F that injects the sucked air. The impeller 144 is formed with a rotating shaft extending in the vertical direction and has a large number of blades 146 each extending substantially all along the rotating shaft and projecting radially from it. The suction duct 144 is an opening extending substantially all along the length of the main body 141. A mesh 148 is disposed to cover this opening. The air injecting section 145F is formed in a surface adjacent to the suction duct 144 to discharge the sucked air in a direction orthogonal to the sucking direction. A wind direction plate 147 is provided in the main body 141 to change this injecting direction.

As shown in FIG. 29, the suction duct 144 of the cross flow fan 140F (140R) is arranged in the front of the automated carrying vehicle 152 in its advancing direction so as to direct the air injecting section 145F (145R) toward the station 103. Furthermore, the wind direction plate 147 is adjusted to discharge air from the air injecting section 145F (145R) in diagonally frontward in the advancing direction. In this manner, strong air is injected by the air injecting section 145F (145R) of the cross flow fan 140F (140R) as auxiliary air injecting means. Consequently, a stronger air wall is formed in front of the automated carrying vehicle 152 in its advancing direction and outside the air curtain. It is also possible to more surely remove dust attached to the article storage 107a. In this respect, the auxiliary air injecting means is formed outside the air curtain of clean air. Accordingly, the inside of the air curtain is not contaminated, so that the auxiliary air injecting means need not be provided with a filter.

According to the present invention, in a carrying system in which an automated carrying vehicle the interior of which is kept cleaner than a surrounding environment carries manufactured articles between manufacturing apparatuses the interior of which is kept cleaner than the surrounding environment, it is possible to prevent the manufactured articles to be transferred from being contaminated with foreign matter or the like attached to a transfer port in the carrying vehicle or manufacturing apparatus.

Further, the time required for a transfer can be shortened to reduce the time required for carriage. Consequently, if the present invention is applied to a production line, costs required for this manufacturing system can be reduced. Further, productivity can be improved.

The invention claimed is:

1. A carrying vehicle comprising a running unit that runs along a predetermined carrying path, a cleaning unit that supplies cleaned air, a housing section to which cleaned air is supplied and in which manufactured articles are housed, a transfer port which is formed in a side of a housing and through which a manufactured article is loaded into or unloaded from the housing section, a shutter that opens and closes said transfer port, a first air injecting section that blows out air creating a curtain of air on an external side of said transfer port, and a second air injecting section that blows out air from above the transfer port to form a down flow on an outer surface of the shutter of the transfer port.

2. A carrying vehicle according to claim 1, wherein said first air injecting section is provided closer to an advancing direction than the transfer port.

3. A carrying vehicle according to claim 1, wherein said first air section is arranged around a periphery of the transfer port and composed of a plurality of air nozzles that form an air curtain.

4. A carrying vehicle according to claim 1, wherein said first air injecting section is composed of a plurality of air nozzles which are arranged at different heights and which form an air curtain.

5. A carrying vehicle according to claim 1, wherein said first air injecting section is composed of a plurality of air nozzles which are arranged above the transfer port at different horizontal positions and which form an air curtain.

6. A carrying vehicle according to claim 1, wherein said running unit outputs an approach signal by detecting that the carrying vehicle is approaching a transfer point where a manufactured article is to be loaded or unloaded, and
on the basis of this approach signal, said first air injecting section starts to blow out air before the carrying vehicle arrives at the transfer point.

7. A carrying vehicle according to claim 1, wherein said running unit outputs an approach signal by detecting that carrying vehicle is approaching a transfer point where a manufactured article is to be loaded or unloaded, and
on the basis of this approach signal, said second air injecting section starts to blow out air before the carrying vehicle arrives at the transfer point.

8. A carrying vehicle comprising a cleaning unit that supplies cleaned air, a housing section to which cleaned air is supplied and in which manufactured articles are housed, a transfer port which is formed in a side of a housing and through which a manufactured article is loaded into or unloaded from the housing section, a shutter that opens and closes said transfer port, and a second air injecting section that blows out air from above the transfer port to form a down flow on an outer surface of the shutter of the transfer port.

9. A carrying vehicle according to claim 8, wherein said running unit outputs an approach signal by detecting that the carrying vehicle is approaching a transfer point where a manufactured article is to be loaded or unloaded, and
on the basis of this approach signal, said second air injecting section starts to blow out air before the carrying vehicle arrives at the transfer point.

10. A manufacturing apparatus comprising a cleaning unit that supplies cleaned air, a standby chamber to which the cleaned air is supplied and in which manufactured articles are housed, a transfer port through which a manufactured article is loaded into or unloaded between the standby chamber and an exterior, a shutter that opens and closes said transfer port, a first air injecting section that blows out air, creating a curtain of air on an external side of said transfer port, and a second air injecting section that blows out air from above the transfer port to form a down flow on an outer surface of the shutter of the transfer port.

11. A manufacturing apparatus according to claim 10, wherein said first air section is arranged around a periphery of the transfer port and composed of a plurality of air nozzles that form an air curtain.

12. A manufacturing apparatus according to claim 10, further comprising a carrying vehicle monitoring section that outputs an approach signal by detecting that a carrying vehicle is approaching the manufacturing apparatus, and
on the basis of this approach signal, said first air injecting section starts to blow out air before the carrying vehicle arrives.

13. A manufacturing apparatus according to claim 10, further comprising a carrying vehicle monitoring section that outputs an approach signal by detecting that a carrying vehicle is approaching the manufacturing apparatus, and
on the basis of this approach signal, said second air injecting section starts to blow out air before the carrying vehicle arrives.

14. A manufacturing apparatus comprising a cleaning unit that supplies cleaned air, a standby chamber to which the cleaned air is supplied and in which manufactured articles are temporarily housed, a transfer port through which a manufactured article is loaded into or unloaded between the standby chamber and an exterior, a shutter that opens and closes said transfer port, and a second air injecting section that blows out air from above the transfer port to form a down flow on an outer surface of the shutter of the transfer port.

15. A manufacturing apparatus according to claim 14, further comprising a carrying vehicle monitoring section that outputs an approach signal by detecting that a carrying vehicle is approaching the manufacturing apparatus, and
on the basis of this approach signal, said second air injecting section starts to blow out air before the carrying vehicle arrives.

16. A carrying system comprising a carrying vehicle that carries a manufactured article and a plurality of manufacturing apparatuses installed in position, wherein:
the carrying vehicle comprises a running unit that runs between the manufacturing apparatuses, a cleaning unit that supplies cleaned air, a housing section to which the cleaned air is supplied and which manufactured articles are housed, a transfer port having a shutter through which a manufactured article is transferred to or received from the manufacturing apparatus, and a first air injecting section that blows out air, creating a curtain of air on an external side of said transfer port,
each of the manufacturing apparatuses comprises a cleaning unit that supplies cleaned air, a housing section to which the cleaned air is supplied and which manufactured articles are housed, a transfer port having a shutter through which a manufactured article is transferred to or received from the carrying vehicle, and a second air injecting section that blows out air, and
said first air injecting section blows out air against the shutter of the transfer port of the manufacturing apparatus, and a second air injecting section blows out air against the shutter of the transfer port of the carrying vehicle.

17. A carrying system according to claim 16, wherein said first air injecting section starts to blow out air before the carrying vehicle arrives at a transfer point.

18. A carrying system according to claim 16, wherein said second air injecting section starts to blow out air before the carrying vehicle arrives at the transfer point.

19. A carrying system comprising a carrying vehicle that carries a manufactured article and a plurality of manufacturing apparatuses installed in position wherein:
the carrying vehicle comprises a running unit that runs between the manufacturing apparatuses, a cleaning unit that supplies cleaned air, a housing section to which the cleaned air is supplied and in which manufactured articles are housed, and a transfer port having opening and closing means through which a manufactured article is loaded into or unloaded from the manufacturing apparatus,
each of the manufacturing apparatuses comprises a cleaning unit that supplies cleaned air, a housing section to which the cleaned air is supplied and which manufactured articles are housed, and a transfer port having opening and closing means through which a manufactured article is loaded into or unloaded from the carrying vehicle, and
at least one of said carrying vehicle and said manufacturing apparatus comprises an air injecting section that forms an air tunnel between the carrying vehicle and the transfer port of the manufacturing apparatus.

20. A carrying vehicle comprising an article storage having an article delivery port through which an article is delivered to or received from stations arranged along a running path, the carrying vehicle further comprising:

first air injecting means arranged around a periphery of the article delivery port to inject air toward any of the stations, and sucking means arranged in front of said first air injecting means in an advancing direction.

21. A carrying vehicle comprising an article storage having an article delivery port through which an article is delivered to or received from stations arranged along a running path, the carrying vehicle further comprising:

first air injecting means arranged around a periphery of the article delivery port to inject air toward any of the stations, and auxiliary air injecting means arranged in front of said first air injecting means in an advancing direction.

22. A carrying system comprising a carrying vehicle including an article storage having an article delivery port through which an article is delivered or received and stations arranged along a running path for the carrying vehicle and each provided with an article storage having an article delivery port which is opened and closed using first doors to deliver or receive an article to or from the carrying vehicle, and in that:

each of the stations has wall members formed in front of and behind the article delivery port of the station in a direction in which the carrying vehicle advances, and the carrying vehicle has air injecting means arranged around a periphery of the article delivery port of the carrying vehicle to inject air to the station so as to form an air curtain.

23. A carrying system according to claim 22, wherein second doors that can be opened and closed are arranged in the article delivery port of said carrying vehicle, and said first and second doors are controlled so that the doors start to be opened before the carrying vehicle arrives at a stopped position at the station and are completely closed after the carrying vehicle has left the stopped position, with an opening of the first doors being located within said air curtain after the first doors have started to be opened and before the first doors are completely closed.

* * * * *